US012532614B2

(12) United States Patent
Cho et al.

(10) Patent No.: US 12,532,614 B2
(45) Date of Patent: Jan. 20, 2026

(54) ORGANIC LIGHT EMITTING DISPLAY DEVICE

(71) Applicant: Samsung Display Co., LTD., Yongin-si (KR)

(72) Inventors: Seung-Hwan Cho, Yongin-si (KR); Jong-Hyun Choi, Seoul (KR); Gyung-Soon Park, Seoul (KR); Ju-Chan Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1014 days.

(21) Appl. No.: 17/276,117

(22) PCT Filed: Aug. 20, 2019

(86) PCT No.: PCT/KR2019/010603
§ 371 (c)(1),
(2) Date: Mar. 12, 2021

(87) PCT Pub. No.: WO2020/054994
PCT Pub. Date: Mar. 19, 2020

(65) Prior Publication Data
US 2022/0037447 A1 Feb. 3, 2022

(30) Foreign Application Priority Data

Sep. 13, 2018 (KR) .......................... 10-2018-0109548

(51) Int. Cl.
*H10K 59/131* (2023.01)
*H10K 59/88* (2023.01)
(52) U.S. Cl.
CPC ........... *H10K 59/131* (2023.02); *H10K 59/88* (2023.02)

(58) Field of Classification Search
CPC .... H10K 59/131; H10K 59/88; G09G 3/3233; G09G 2300/0413; G09G 2300/0426
See application file for complete search history.

(56) References Cited

U.S. PATENT DOCUMENTS 9,025,099 B2 5/2015 Kwon et al.
9,691,791 B2 6/2017 Jeon et al.
(Continued)

FOREIGN PATENT DOCUMENTS

CN 103149757 A 6/2013
CN 106098727 A 11/2016
(Continued)

OTHER PUBLICATIONS

International Search Report of corresponding Application No. PCT/KR2019/010603 dated Nov. 28, 2019, 4 pp.

*Primary Examiner* — Nicholas J Tobergte
*Assistant Examiner* — Adin Hrnjic
(74) *Attorney, Agent, or Firm* — Womble Bond Dickinson (US) LLP

(57) ABSTRACT

An organic light emitting display device includes: a substrate including: a display area having a first sub-display area and a second sub-display area at a first side part of the first sub-display area; and a pad area at a second side part different from the first side part of the first sub-display area; a plurality of right signal wirings in the second sub-display area on the substrate; a plurality of right fan-out wirings in the pad area, the first sub-display area, and the second sub-display area on the right signal wirings, the right fan-out wirings each including a bent part; a plurality of dummy patterns in the first and second sub-display areas on the right signal wirings, the dummy patterns being spaced apart from (Continued)

the right fan-out wirings, the dummy patterns having a lattice shape; and a plurality of sub-pixel structures on the dummy patterns.

50 Claims, 24 Drawing Sheets

(56) References Cited

U.S. PATENT DOCUMENTS

| | | | |
|---|---|---|---|
| 10,115,337 B2 | 10/2018 | Kim et al. | |
| 2010/0020059 A1* | 1/2010 | Suh | G09G 3/3233 345/212 |
| 2010/0149143 A1 | 6/2010 | Yamamoto et al. | |
| 2012/0169578 A1* | 7/2012 | Kim | G09G 3/3648 345/93 |
| 2012/0206684 A1 | 8/2012 | Lee et al. | |
| 2014/0117320 A1 | 5/2014 | Jung | |
| 2015/0255487 A1 | 9/2015 | Yoshida et al. | |
| 2016/0197127 A1 | 7/2016 | Park et al. | |
| 2017/0123506 A1 | 5/2017 | Song et al. | |
| 2017/0207288 A1* | 7/2017 | Kang | H10K 59/131 |
| 2017/0287936 A1 | 10/2017 | Kim et al. | |
| 2018/0039146 A1 | 2/2018 | Tanaka et al. | |
| 2018/0204895 A1 | 7/2018 | Lin et al. | |
| 2019/0278145 A1* | 9/2019 | Tanaka | G02F 1/136286 |
| 2022/0130319 A1 | 4/2022 | Kim et al. | |

FOREIGN PATENT DOCUMENTS

| | | |
|---|---|---|
| CN | 107422554 A | 12/2017 |
| JP | 2010-145444 A | 7/2010 |
| KR | 10-2012-0092994 | 8/2012 |
| KR | 10-2013-0063886 | 6/2013 |
| KR | 10-2014-0053626 | 5/2014 |
| KR | 10-2015-0031952 | 3/2015 |
| KR | 10-2016-0129174 | 11/2016 |
| KR | 10-2018-0125061 | 11/2018 |
| KR | 10-2019-0032711 | 3/2019 |
| WO | WO 2014/073483 A1 | 5/2014 |
| WO | 2016/140281 A1 | 9/2016 |
| WO | 2017/074103 A1 | 5/2017 |
| WO | 2018-062023 A1 | 4/2018 |

* cited by examiner

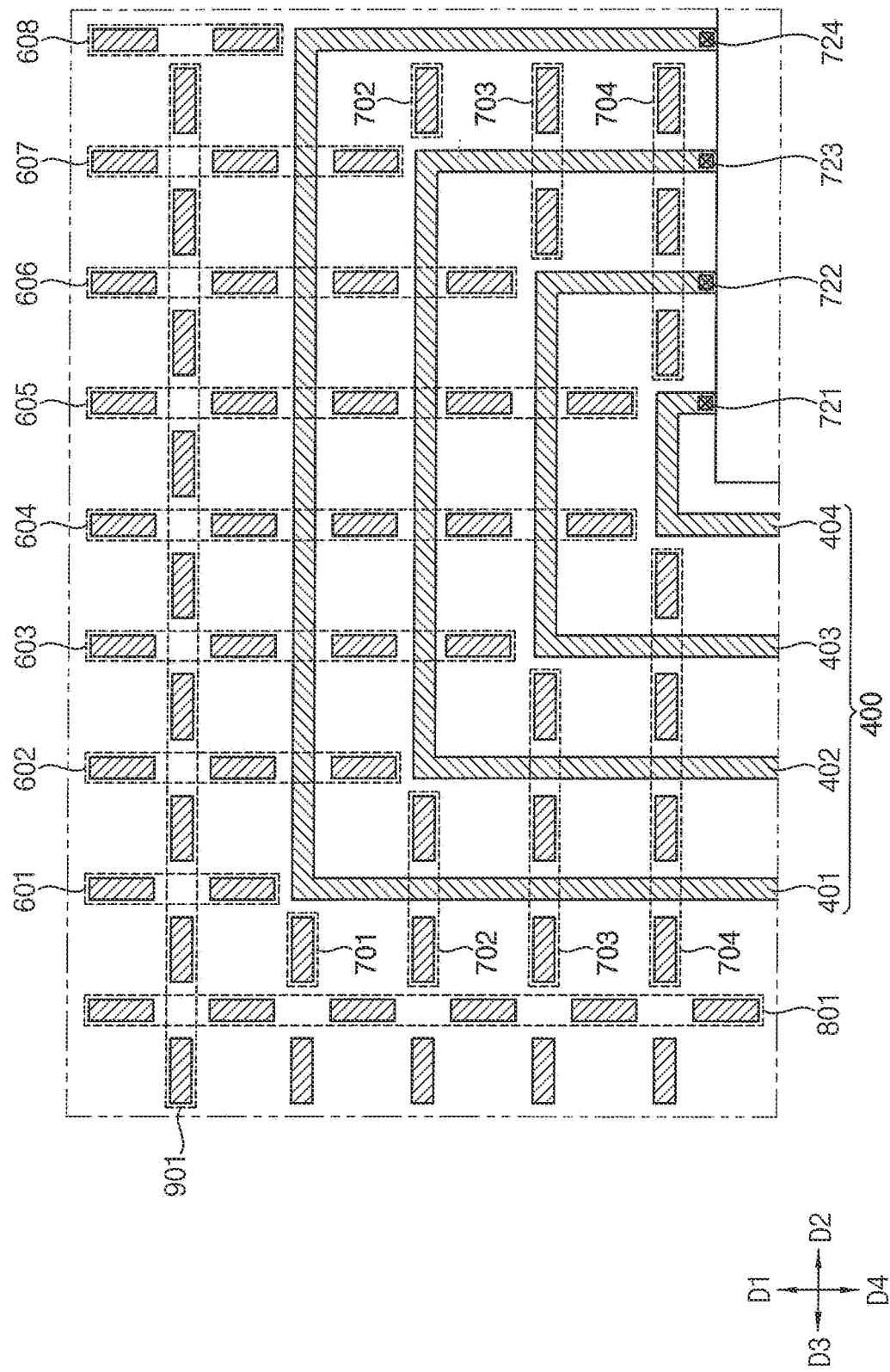

ORGANIC LIGHT EMITTING DISPLAY DEVICE

CROSS-REFERENCE TO RELATED APPLICATIONS

This application is a U.S. National Phase Patent Application of International Application Number PCT/KR2019/010603, filed on Aug. 20, 2019, which claims priority to Korean Patent Application Number 10-2018-0109548, filed on Sep. 13, 2018, the entire content of all which is incorporated herein by reference.

BACKGROUND

1. Field

Exemplary embodiments relate generally to an organic light emitting display device. More particularly, exemplary embodiments of the present inventive concept relate to an organic light emitting display device including fan-out wiring.

2. Description of Related Art

Flat panel display devices are used as display devices for replacing a cathode ray tube display device due to light-weight and thin characteristics thereof. As representative examples of such flat panel display devices, there are a liquid crystal display device and an organic light emitting display device. The organic light emitting display device has an advantage in that the luminance properties and the viewing angle properties are excellent, and an ultrathin type can be implemented because backlight unit is not required, compared to the liquid crystal display device. The above organic light emitting display device forms an exciton after an electron and an electron hole injected through a positive electrode and a negative electrode are recombine in an organic thin film, and uses a phenomenon in which light having a specific wavelength is generated by energy from the formed exciton.

The organic light emitting display device may include a display area and a pad area. Pad electrodes receiving a plurality of signals for displaying an image from an external device may be disposed in the pad area, and a plurality of signal wirings transmitting the signals may be disposed in the display area. Recently, an organic light emitting display device having a pad area having a width in a horizontal direction smaller than a width in the horizontal direction of the display area has been developed. In this case, the signals may be transmitted to signal wirings disposed on both sides of the display area through fan-out wirings. However, a spot is generated in the display area of the organic light emitting display device due to the fan-out wirings.

Some exemplary embodiments provide an organic light emitting display device including fan-out wiring.

However, the object of the present inventive concept is not limited thereto. Thus, the object of the present inventive concept may be extended without departing from the spirit and the scope of the present inventive concept.

SUMMARY

According to some exemplary embodiments, an organic light emitting display device includes a substrate, a plurality of right signal wirings, a plurality of right fan-out wirings, a plurality of dummy patterns, and a plurality of sub-pixel structures. The substrate includes i) a display area having a first sub-display area and a second sub-display area positioned on a first side part of the first sub-display area and ii) a pad area positioned on a second side part different from the first side part of the first sub-display area. The right signal wirings are disposed in the second sub-display area on the substrate. The right fan-out wirings are disposed in the pad area, the first sub-display area, and the second sub-display area on the right signal wirings, and the right fan-out wirings each include a bent part. The dummy patterns are disposed in the first and second sub-display areas on the right signal wirings, and are spaced apart from the right fan-out wirings. The dummy patterns have a lattice shape. The sub-pixel structures are disposed on the dummy patterns.

In exemplary embodiments, each of the right fan-out wirings may include a vertical extension part disposed in the pad area and the first sub-display area and extending in a first direction and a horizontal extension part extending in a second direction orthogonal to the first direction from a first end of the vertical extension part positioned in the first sub-display area.

In exemplary embodiments, a second end of the vertical extension part may be positioned in the pad area, and the first end opposite to the second end of the vertical extension part may be connected to a first end of the horizontal extension part.

In exemplary embodiments, a second end opposite to the first end of the horizontal extension part may be connected to one of the right signal wirings through a contact hole.

In exemplary embodiments, the bent part may be defined by the first end of the vertical extension part and the first end of the horizontal extension part.

In exemplary embodiments, the vertical extension part and the horizontal extension part may be integrally formed with each other.

In exemplary embodiments, each of the right fan-out wirings may further include a sub-vertical extension part that extends in the fourth direction opposite to the first direction from the second end of the horizontal extension part.

In exemplary embodiments, a first end of the horizontal extension part may be connected to the first end of the vertical extension part, and the second end opposite to the first end of the horizontal extension part may be connected to the first end of the sub-vertical extension part.

In exemplary embodiments, a second end opposite to the first end of the sub-vertical extension part may be connected to one of the right signal wirings through a contact hole.

In exemplary embodiments, wherein the bent part may be defined by i) the first end of the vertical extension part and the first end of the horizontal extension part and ii) the second end of the horizontal extension part and a first end of the sub-vertical extension part.

In exemplary embodiments, the vertical extension part, the horizontal extension part, and the sub-vertical extension part may be integrally formed with each other.

In exemplary embodiments, the vertical extension part may be parallel to the sub-vertical extension part, and a length of the vertical extension part in the first direction may be longer than a length of the sub-vertical extension part in the first direction.

In exemplary embodiments, the dummy patterns may include a plurality of vertical dummy patterns and a plurality of horizontal dummy patterns. The vertical dummy patterns may be spaced apart from the vertical extension part in the first direction, and may be arranged to be spaced apart from each other in the first direction. The horizontal dummy patterns may be spaced apart from the horizontal extension part in a third direction opposite to the second direction, and may be arranged to be spaced apart from each other in the third direction.

In exemplary embodiments, the dummy patterns may further include a plurality of sub-vertical dummy patterns and a plurality of sub-horizontal dummy patterns. The sub-vertical dummy patterns may be spaced apart from the vertical extension part in the third direction, and may be arranged to be spaced apart from each other in the first direction. The sub-horizontal dummy patterns may be spaced apart from the horizontal extension part in the first direction, and may be arranged to be spaced apart from each other in the third direction.

In exemplary embodiments, the display area may include a plurality of sub-pixel circuit areas, and at least one of the vertical dummy pattern, the horizontal dummy pattern, the sub-vertical dummy pattern, and the sub-horizontal dummy pattern may be disposed in each of the sub-pixel circuit areas.

In exemplary embodiments, the dummy patterns may have a lattice shape in the display area by the vertical dummy pattern, the horizontal dummy pattern, the sub-vertical dummy pattern, and the sub-horizontal dummy pattern disposed in each of the sub-pixel circuit areas.

In exemplary embodiments, the organic light emitting display device may further include a plurality of power voltage wirings disposed in the display area on the substrate, and at least some of the dummy patterns may be electrically connected to at least some of the power voltage wirings.

In exemplary embodiments, the right fan-out wirings may include first to $M^{th}$ right fan-out wirings (where M is an integer of 1 or more), in which the first to $M^{th}$ right fan-out wirings are sequentially arranged while being spaced apart from each other.

In exemplary embodiments, lengths of the first to $M^{th}$ right fan-out wirings may be gradually decreased.

In exemplary embodiments, a $K^{th}$ right fan-out wiring (where K is an integer between 1 and M) among the first to $M^{th}$ right fan-out wirings may include a vertical extension part disposed in the pad area and the first sub-display area and extending in a first direction and a horizontal extension part extending in a second direction orthogonal to the first direction from a first end of the vertical extension part positioned in the first sub-display area.

In exemplary embodiments, a second end of the vertical extension part of the $K^{th}$ right fan-out wiring may be positioned in the pad area, and the first end opposite to the second end of the vertical extension part of the $K^{th}$ right fan-out wiring may be connected to the first end of the horizontal extension part.

In exemplary embodiments, the right signal wirings may include first to $N^{th}$ right signal wirings (where N is an integer of 1 or more), in which the first to $N^{th}$ right signal wirings are arranged in a reverse sequence and spaced apart from each other.

In exemplary embodiments, the $M^{th}$ right fan-out wiring and the $N^{th}$ right signal wiring are disposed adjacent to a boundary between the first sub-display area and the second sub-display area.

In exemplary embodiments, the horizontal extension part of the $K^{th}$ right fan-out wiring among the first to $M^{th}$ right fan-out wirings may be connected to an $L^{th}$ right signal wiring (where L is an integer between 1 and N) among the first to $N^{th}$ right signal wirings through a contact hole.

In exemplary embodiments, the bent part may be defined by the first end of the vertical extension part of the $K^{th}$ right fan-out wiring and the first end of the horizontal extension part of the $K^{th}$ right fan-out wiring.

In exemplary embodiments, the vertical and horizontal extension parts of the $K^{th}$ right fan-out wiring may be integrally formed.

In exemplary embodiments, the $K^{th}$ right fan-out wiring may further include a sub-vertical extension part that extends in the fourth direction opposite to the first direction from the second end of the horizontal extension part.

In exemplary embodiments, a first end of the horizontal extension part may be connected to the vertical extension part, and the second end opposite to the first end of the horizontal extension part may be connected to the first end of the sub-vertical extension part.

In exemplary embodiments, the right signal wirings may include first to $N^{th}$ right signal wirings (where N is an integer of 1 or more), in which the first to $N^{th}$ right signal wirings are arranged in a reverse sequence and spaced apart from each other.

In exemplary embodiments, the sub-vertical extension part of the $K^{th}$ right fan-out wiring among the first to $M^{th}$ right fan-out wirings may be connected to an $L^{th}$ right signal wiring among the first to $N^{th}$ right signal wirings (where L is an integer between 1 and N) through a contact hole.

In exemplary embodiments, the bent part may be defined by i) a first end of the vertical extension part of the $K^{th}$ right fan-out wiring and a first end of the horizontal extension part of the $K^{th}$ right fan-out wiring and ii) a second end of the horizontal extension part of the $K^{th}$ right fan-out wiring and a first end of the sub-vertical extension part of the $K^{th}$ right fan-out wiring.

In exemplary embodiments, the vertical extension part of the $K^{th}$ right fan-out wiring, the horizontal extension part of the $K^{th}$ right fan-out wiring, and the sub-vertical extension part of the $K^{th}$ right fan-out wiring may be integrally formed.

In exemplary embodiments, the vertical extension part of the $K^{th}$ right fan-out wiring may be parallel to the sub-vertical extension part of the $K^{th}$ right fan-out wiring, and a length of the vertical extension part in the first direction may be longer than a length of the sub-vertical extension part in the first direction.

In exemplary embodiments, an empty space may be formed inside the vertical extension part of the $K^{th}$ right fan-out wiring, the horizontal extension part of the $K^{th}$ right fan-out wiring, and the sub-vertical extension part of the $K^{th}$ right fan-out wiring, and may have a shape recessed in the first direction. A $(K+1)^{th}$ right fan-out wiring among the first to $M^{th}$ right fan-out wirings may be disposed in the empty space.

In exemplary embodiments, the dummy patterns may include first to $P^{th}$ dummy patterns (where P is an integer of 1 or more). A $J^{th}$ dummy pattern (where J is an integer between 1 and N) among the first to $P^{th}$ dummy patterns may include a plurality of vertical dummy patterns and a plurality of horizontal dummy patterns. The vertical dummy patterns may be spaced apart from the vertical extension part of the $K^{th}$ right fan-out wiring in the first direction, and may be arranged to be spaced apart from each other in the first direction. The horizontal dummy patterns may be spaced apart from the horizontal extension part of the $K^{th}$ right fan-out wiring in a third direction opposite to the second direction, and may be arranged to be spaced apart from each other in the third direction.

In exemplary embodiments, the $J^{th}$ dummy pattern may further include a plurality of sub-vertical dummy patterns and a plurality of sub-horizontal dummy patterns. The sub-vertical dummy patterns may be spaced apart from the vertical extension part of the $K^{th}$ right fan-out wiring in the third direction, and may be arranged to be spaced apart from each other in the first direction. The sub-horizontal dummy patterns may be spaced apart from the horizontal extension part of the $K^{th}$ right fan-out wiring in the first direction, and may be arranged to be spaced apart from each other in the third direction.

In exemplary embodiments, the display area may include a plurality of sub-pixel circuit areas, in which at least one of the vertical dummy pattern, the horizontal dummy pattern, the sub-vertical dummy pattern, and the sub-horizontal dummy pattern may be disposed in each of the sub-pixel circuit areas.

In exemplary embodiments, the dummy patterns may have a lattice shape in the display area by the vertical dummy pattern, the horizontal dummy pattern, the sub-vertical dummy pattern, and the sub-horizontal dummy pattern disposed in each of the sub-pixel circuit areas.

In exemplary embodiments, the substrate further may include a third sub-display area positioned on a third side part directed to face the first side part of the first sub-display area, the pad area and the first sub-display area are arranged in a first direction, and the third sub-display area, the first sub-display area, and the second sub-display area may be arranged in a second direction orthogonal to the first direction.

In exemplary embodiments, a width of the display area in the second direction may be greater than a width of the pad area in the second direction.

In exemplary embodiments, the organic light emitting display device may further include a plurality of pad electrodes arranged in the second direction in the pad area.

In exemplary embodiments, the organic light emitting display device may further include a plurality of left signal wirings and a plurality of left fan-out wirings. The left signal wirings may be disposed in the third sub-display area on the substrate. The left fan-out wirings may be disposed in the pad area, the first sub-display area, and the third sub-display area on the left signal wirings, and left fan-out wirings each may include a bent part.

In exemplary embodiments, the dummy patterns may be disposed in the third sub-display area on the left signal wirings, and may be spaced apart from the left fan-out wirings. The dummy pattern may have a lattice shape.

In exemplary embodiments, the left fan-out wiring and the right fan-out wiring may be symmetrical to each other.

In exemplary embodiments, wherein the left signal wirings may be disposed only in the third sub-display area, and a data signal may be applied through the left fan-out wirings.

In exemplary embodiments, the right signal wirings may be disposed only in the second sub-display area, and a data signal may be applied through the right fan-out wirings.

In exemplary embodiments, each of the sub-pixel structures may include a lower electrode disposed on the dummy patterns, a light emitting layer disposed on the lower electrode, and an upper electrode disposed on the light emitting layer.

In exemplary embodiments, the organic light emitting display device may further include a plurality of center signal wirings disposed in the first sub-display area on the substrate.

In exemplary embodiments, a length of each of the center signal wirings in a first direction may be longer than a length of each of the right signal wirings in the first direction.

In exemplary embodiments, the center signal wirings may be disposed only in the first sub-display area, and a data signal may be applied through the center signal wirings.

The organic light emitting display device according to exemplary embodiments of the present invention includes the dummy patterns, so that the dummy patterns may have a lattice pattern shape in the display area together with the right fan-out wirings and the left fan-out wirings. Accordingly, a pattern and/or a spot, which is caused by the bent parts of the right fan-out wirings and the left fan-out wirings, may not be visually recognized in the organic light emitting display device. In addition, when the dummy patterns are electrically connected to the high power voltage wiring through the contact hole, a wiring resistance of the high power voltage wiring may be lowered. Further, a constant voltage is applied to the dummy patterns, so that wirings having a varying voltage levels may be shielded.

In the organic light emitting display device according to exemplary embodiments of the present invention, the contact holes of the right fan-out wirings are positioned at the lower end of the second sub-display area, and the contact holes of the left fan-out wirings are position at the lower end of the third sub-display area, so that the visibility of the organic light emitting display device may be relatively increased.

However, the effects of the present invention are not limited thereto. Thus, the effects of the present invention may be extended without departing from the spirit and the scope of the present invention.

BRIEF DESCRIPTION OF THE DRAWINGS

FIG. 24 is an enlarged plan view illustrating an area "F" of the organic light emitting display device of FIG. 23.

DETAILED DESCRIPTION

Figure 1:
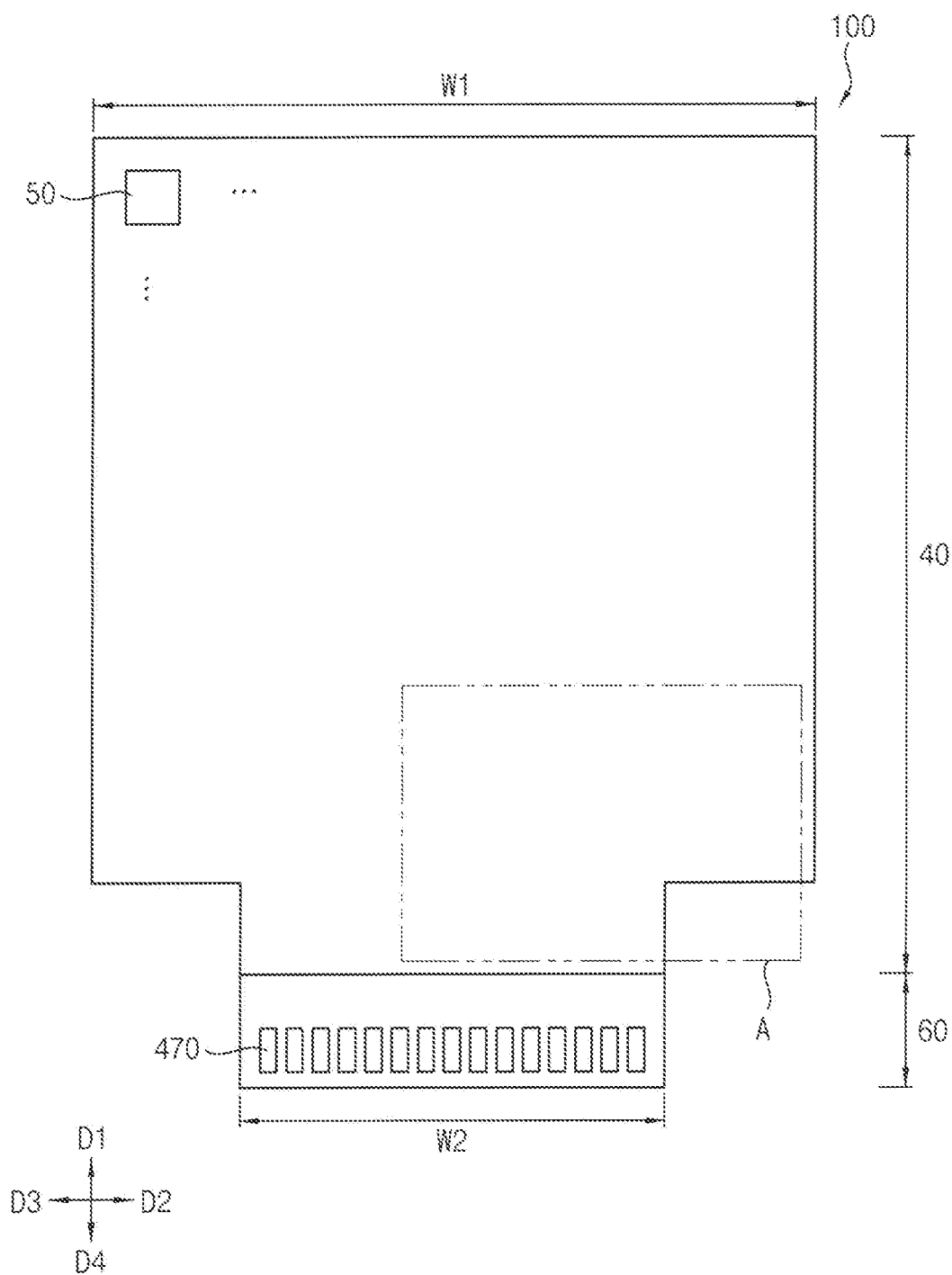
FIG. 1 is a plan view illustrating an organic light emitting display device according to an exemplary embodiment of the present invention.

Hereinafter, an organic light-emitting display device according to exemplary embodiments of the present invention will be explained in detail with reference to the accompanying drawings. In the accompanying drawings, the same or similar reference numerals are used for the same or similar components.

Figure 2:
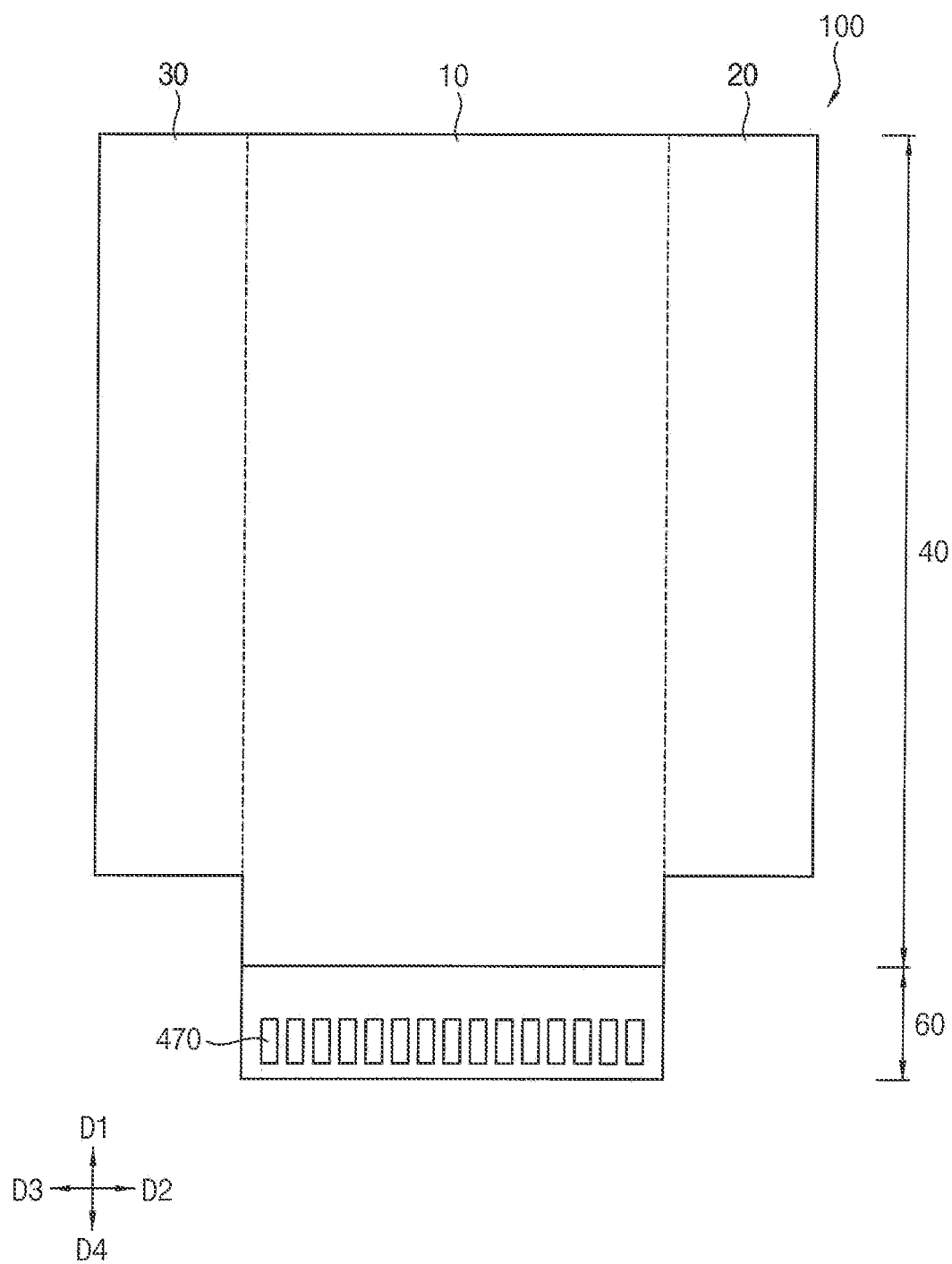
FIG. 2 is a plan view illustrating a first sub-display area, a second sub-display area, and a third sub-display area of the organic light emitting display device of FIG. 1.
Figure 3:
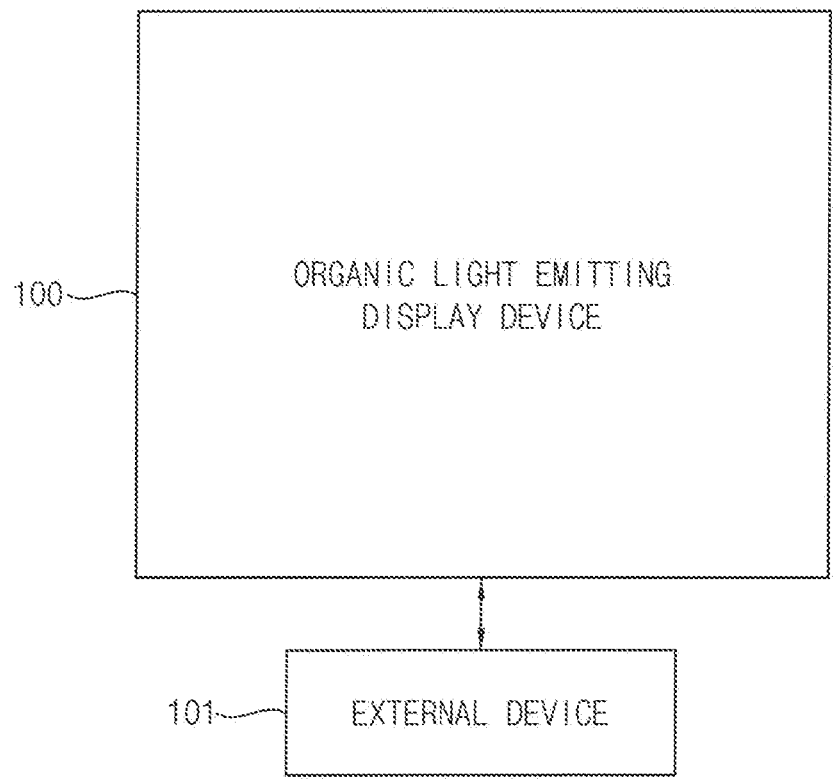
FIG. 3 is a block diagram illustrating an external device electrically connected to the organic light emitting display device of FIG. 1.
Figure 4:
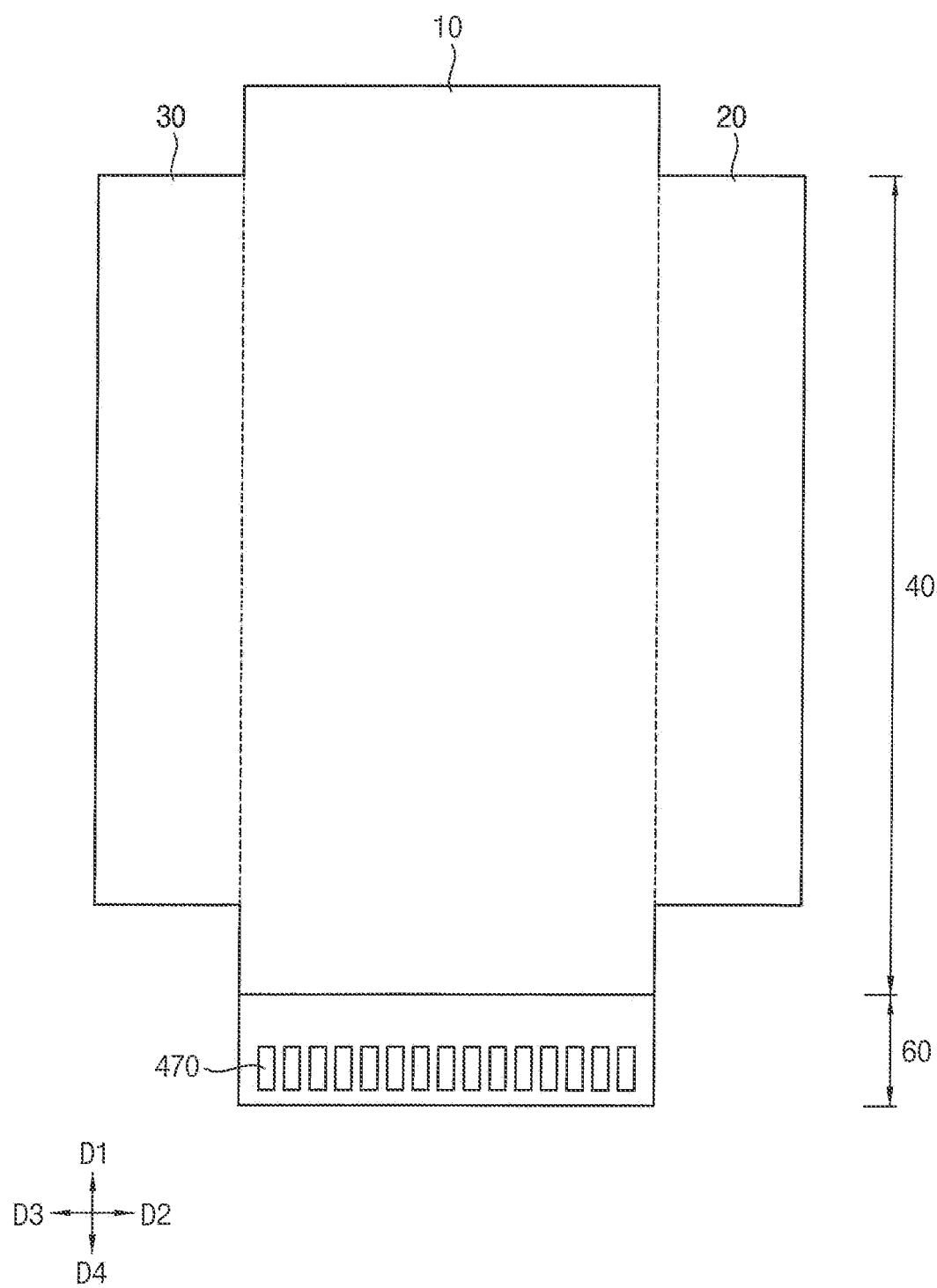
FIG. 4 is a plan view illustrating an example of the organic light emitting display device of FIG. 1.

FIG. 1 is a plan view illustrating an organic light emitting display device according to an exemplary embodiment of the present invention. FIG. 2 is a plan view illustrating a first sub-display area, a second sub-display area, and a third sub-display area of the organic light emitting display device of FIG. 1. FIG. 3 is a block diagram illustrating an external device electrically connected to the organic light emitting display device of FIG. 1. FIG. 4 is a plan view illustrating an example of the organic light emitting display device of FIG. 1.

Referring to FIGS. 1, 2 and 3, the organic light emitting display device 100 may include a display area 40 capable of displaying an image and a pad area 60 capable of receiving a plurality of signals. The display area 40 may include a first sub-display area 10, a second sub-display area 20, and a third sub-display area 30. For example, the second sub-display area 20 may be positioned on a first side part of the first sub-display area 10, the pad area 60 may be disposed on a second side part different from the first side part of the first sub-display area 10, and the third sub-display area 30 may be positioned on a third side part facing the first side part of the first sub-display area 10. The pad area 60 and the first sub-display area 10 may be arranged in a first direction D1 substantially parallel to the upper surface of the organic light emitting display device 100, and the third sub-display area 30, the first sub-display area 10, and the second sub-display area 20 may be arranged in a second direction D2 substantially orthogonal to the first direction D1.

For example, the first sub-display area 10 may be positioned on a front surface of the organic light emitting display device 100, the second and third sub-display areas 20 and 30 may be bent about an axis in a vertical direction (e.g., bent about an axis in the first direction D1 and a fourth direction D4 opposite to the first direction D1), so as to be positioned on both side surfaces of the organic light emitting display device 100. Alternatively, a portion of the first sub-display area 10 adjacent to the pad area 60 may be bent about an axis in the horizontal direction (e.g., bent about an axis in the second direction D2 and a third direction D3 opposite to the second direction D2), so as to be positioned on a lower side surface of the organic light emitting display device 100 (e.g., a surface positioned between the both side surfaces of the organic light emitting display device 100). In addition, in other exemplary embodiments, as shown in FIG. 4, the second and third sub-display areas 20 and 30 may be bent about the axis in the vertical direction so as to be positioned on the both side surfaces of the organic light emitting display device 100, a first portion of the first sub-display area 10 adjacent to the pad area 60 may be bent about the axis in the horizontal direction so as to be positioned on the lower side surface of the organic light emitting display device 100, and a second portion of the first sub-display area 10 opposite to the first portion may be bent about an axis in the horizontal direction so as to be positioned on an upper side surface. In this case, the organic light emitting display device 100 may display an image not only on the front surface but also on the four side surfaces. However, for the above structures, the organic light emitting display device 100 is required to include a flexible substrate (such as a polyimide substrate) as a lower substrate and a thin film encapsulation structure as an upper substrate.

In exemplary embodiments, when viewed from the top view of the organic light emitting display device 100, a width W1 of the display area 40 in the second direction D2 may be greater than a width W2 of the pad area 60 in the second direction D2. In addition, a width of the first sub-display area 10 in the first direction D1 (or the fourth direction D4 opposite to the first direction D1) may be greater than a width of each of the second and third sub-display areas 20 and 30 in the first directions D1. Alternatively, the width of the first sub-display area 10 in the first direction D1 may be smaller than or equal to the width of each of the second and third sub-display areas 20 and 30 in the first direction D1.

A plurality of sub-pixel circuit areas 50 may be arranged over the whole of the display area 40, and pad electrodes 470 electrically connected to the external device 101 may be arranged in the pad area 60 in the second direction D2 (or the third direction D3 opposite to the second direction D2).

A sub-pixel circuit (e.g., the sub-pixel circuit of FIG. 5) may be disposed in each of the sub-pixel circuit areas 50 of the display area 40, and an organic light emitting diode (e.g., the organic light emitting diode of FIG. 5) may be disposed on the sub-pixel circuit. An image may be displayed on the display area 40 through the sub-pixel circuit and the organic light emitting diode.

First, second, and third sub-pixel circuits may be disposed in the sub-pixel circuit areas 50. For example, the first sub-pixel circuit may be connected to a first organic light emitting diode capable of emitting red light, the second sub-pixel circuit may be connected to a second organic light emitting diode capable of emitting green light, and the third sub-pixel circuit may be connected to a third organic light emitting diode capable of emitting blue light.

In exemplary embodiments, the first organic light emitting diode may be disposed to overlap the first sub-pixel circuit, the second organic light emitting diode may be disposed to overlap the second sub-pixel circuit, and the third organic light emitting diode may be disposed to overlap the third sub-pixel circuit. Alternatively, the first organic light emitting diode may be disposed to overlap a portion of the first sub-pixel circuit and a portion of a sub-pixel circuit different from the first sub-pixel circuit, the second organic light emitting diode may be disposed to overlap a portion of the second sub-pixel circuit and a portion of a sub-pixel circuit different from the second sub-pixel circuit, and the third organic light emitting diode may be disposed to overlap a portion of the third sub-pixel circuit and a portion of a sub-pixel circuit different from the third sub-pixel circuit.

For example, the first to third organic light emitting diodes may be arrayed using a scheme such as an RGB stripe type in which rectangles having the same size are sequentially arranged, an S-stripe type including a blue organic light emitting diode having a relatively large area, a WRGB type further including a white organic light emitting diode, and a PenTile arranged to have an RG-GB repetition pattern.

In addition, at least one driving transistor, at least one switching transistor, at least one capacitor or the like may be disposed in each of the sub-pixel circuit areas 50. In exemplary embodiments, one driving transistor, eight switching transistors, one storage capacitor, and the like may be disposed in each of the sub-pixel circuit areas 50.

Although the sub-pixel circuit area 50 of the present invention has been described as having a rectangular shape when viewed in a plan view, the shape is not limited thereto. For example, the sub-pixel circuit area 50 may have a triangular shape, a rhombus shape, a polygonal shape, a circular shape, a track shape, or an elliptical shape when viewed in a plan view.

The external device 101 may be electrically connected to the organic light emitting display device 100 through a flexible printed circuit board. For example, one side of the flexible printed circuit board may come into direct contact with the pad electrodes 470, and the other side of the flexible printed circuit board may come into direct contact with the external device 101. The external device 101 may provide a data signal, a scan signal, an emission control signal, a data initialization signal, an initialization voltage, a power voltage, and the like to the organic light emitting display device 100. In addition, a drive integrated circuit may be mounted on the flexible printed circuit board. In other exemplary embodiments, the drive integrated circuit may be mounted on the organic light emitting display device 100 so as to be adjacent to the pad electrodes 470. Alternatively, when the organic light emitting display device 100 includes the bending area, the pad electrodes 470 may be electrically connected to the external device 101 through the printed circuit board. In this case, the bending area may be positioned between the display area 40 and the pad area 60 (e.g., may be adjacent to the pad area 60). When the organic light emitting display device 100 includes the bending area, the bending area may be bent about an axis in the horizontal direction, and the pad area 60 may be positioned on a rear surface of the organic light emitting display device 100.

Figure 5:
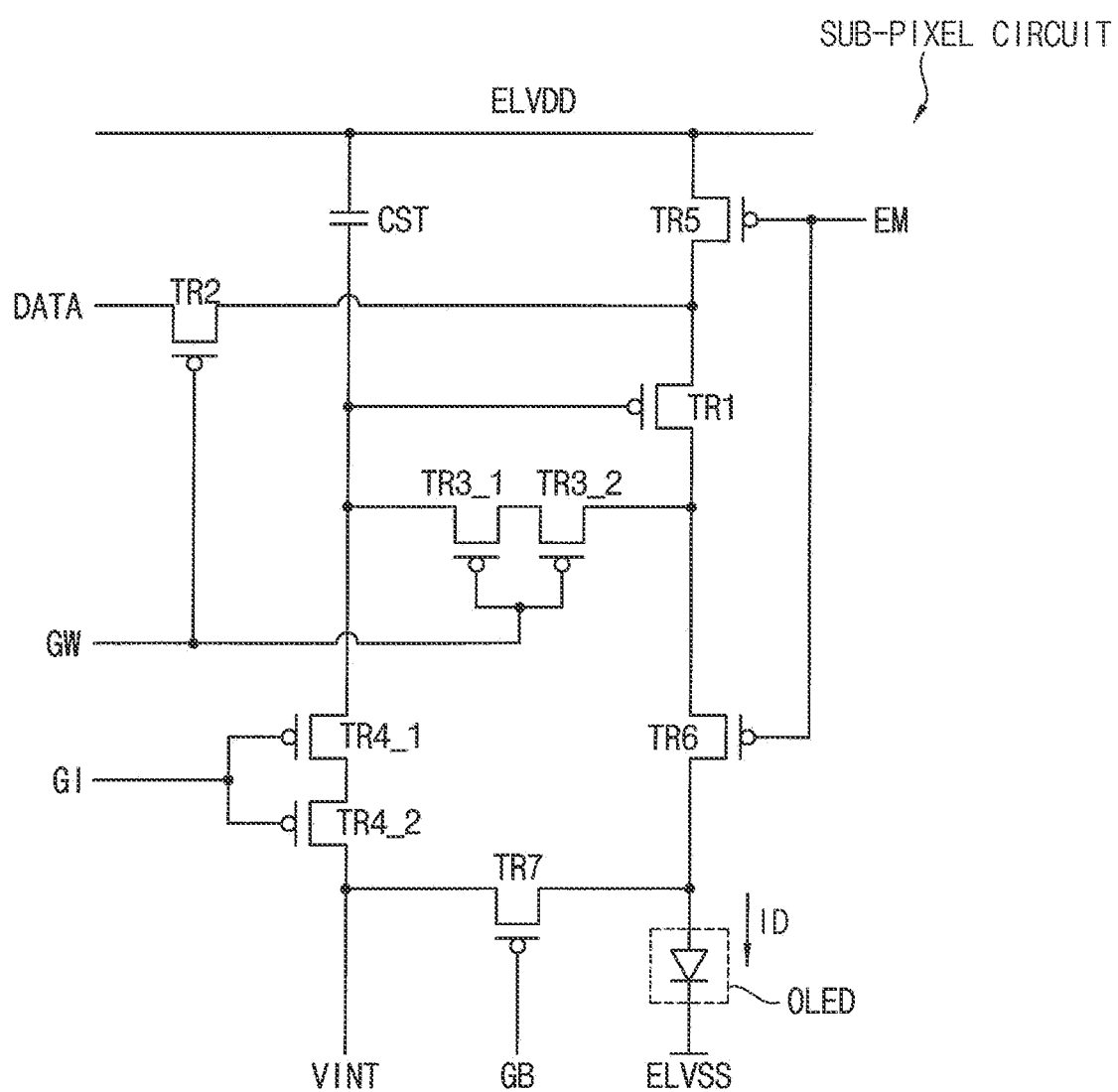
FIG. 5 is a circuit diagram illustrating a sub-pixel circuit disposed in the sub-pixel circuit area of FIG. 1 and an organic light emitting diode disposed on the sub-pixel circuit.

FIG. 5 is a circuit diagram illustrating a sub-pixel circuit disposed in the sub-pixel circuit area of FIG. 1 and an organic light emitting diode disposed on the sub-pixel circuit.

Referring to FIG. 5, the sub-pixel circuit SUB-PIXEL CIRCUIT and the organic light emitting diode OLED may be disposed in each of the sub-pixel circuit areas 50 of the organic light emitting display device 100. The sub-pixel circuit SUB-PIXEL CIRCUIT may include first to seventh transistors TR1, TR2, TR3_1, TR3_2, TR4_1, TR4_2, TR5, TR6, and TR7, storage capacitor CST, a high power supply voltage ELVDD wiring, a low power supply voltage ELVSS wiring, an initialization voltage VINT wiring, a data signal DATA wiring, a scan signal GW wiring, a data initialization signal GI wiring, an emission control signal EM wiring, a diode initialization signal GB wiring, and the like.

The organic light emitting diodes OLED may output light based on a driving current ID. The organic light emitting diodes OLED may include a first terminal and a second terminal. In exemplary embodiments, the second terminal of the organic light emitting diode OLED may be supplied with the low power supply voltage ELVSS. For example, the first terminal of the organic light emitting diode OLED may be an anode terminal, and the second terminal of the organic light emitting diode OLED may be a cathode terminal. Alternatively, the first terminal of the organic light emitting diode OLED may be a cathode terminal, and the second terminal of the organic light emitting diode OLED may be an anode terminal.

The first transistor TR1 may include a gate terminal, a first terminal, and a second terminal. In exemplary embodiments, the first terminal of the first transistor TR1 may be a source terminal, and the second terminal of the first transistor TR1 may be a drain terminal. Alternatively, the first terminal of the first transistor TR1 may be a drain terminal, and the second terminal of the first transistor TR1 may be a source terminal.

The first transistor TR1 may generate a driving current ID. In exemplary embodiments, the first transistor TR1 may operate in a saturation area. In this case, the first transistor TR1 may generate the driving current ID based on a voltage difference between the gate terminal and the source terminal. In addition, a gray scale may be expressed based on a size of the driving current ID supplied to the organic light emitting diode OLED. Alternatively, the first transistor TR1 may operate in a linear area. In this case, a gray scale may be expressed based on the sum of times for supplying the driving current ID to the organic light emitting diode OLED within one frame.

The second transistor TR2 may include a gate terminal, a first terminal, and a second terminal. The gate terminal of the second transistor TR2 may be supplied with the scan signal GW. The first terminal of the second transistor TR2 may be supplied with the data signal DATA. The second terminal of the second transistor TR2 may be connected to the first terminal of the first transistor TR1. In exemplary embodiments, the first terminal of the second transistor TR2 may be a source terminal, and the second terminal of the second transistor TR2 may be a drain terminal. Alternatively, the first terminal of the second transistor TR2 may be a drain terminal, and the second terminal of the second transistor TR2 may be a source terminal.

The second transistor TR2 may supply the data signal DATA to the first terminal of the first transistor TR1 during an activation period of the scan signal GW. In this case, the second transistor TR2 may operate in a linear area.

Each of the third transistors TR3_1 and TR3_2 may include a gate terminal, a first terminal, and a second terminal. The third transistor TR3_1 and the third transistor TR3_2 may be connected in series and may be operated as a dual transistor. For example, when the dual transistor is turned off, a leakage current may be reduced. The gate terminal of each of the third transistors TR3_1 and TR3_2 may be supplied with the scan signal GW. The first terminal of each of the third transistors TR3_1 and TR3_2 may be connected to the gate terminal of the first transistor TR1. The second terminal of each of the third transistors TR3_1 and TR3_2 may be connected to the second terminal of the first transistor TR1. In exemplary embodiments, the first terminal of each of the third transistors TR3_1 and TR3_2 may be a source terminal, and the second terminal of each of the third transistors TR3_1 and TR3_2 may be a drain terminal. Alternatively, the first terminal of each of the third transistors TR3_1 and TR3_2 may be a drain terminal, and the second terminal of each of the third transistors TR3_1 and TR3_2 may be a source terminal.

Each of the third transistors TR3_1 and TR3_2 may connect the gate terminal of the first transistor TR1 to the second terminal of the first transistor TR1 during an activation period of the scan signal GW. In this case, each of the third transistors TR3_1 and TR3_2 may operate in a linear area. In other words, each of the third transistors TR3_1 and TR3_2 may diode-connect the first transistor TR1 during an activation period of the scan signal GW. Because the first transistor TR1 is diode-connected, a voltage difference equal to a threshold voltage of the first transistor TR1 may occur between the first terminal of the first transistor TR1 and the gate terminal of the first transistor TR1. As a result, a voltage obtained by adding the voltage difference (that is, the threshold voltage) to a voltage of the data signal DATA supplied to the first terminal of the first transistor TR1 may be supplied to the gate terminal of the first transistor TR1 during the activation period of the scan signal GW. In other words, the data signal DATA may be compensated as much as the threshold voltage of the first transistor TR1, and the compensated data signal DATA may be supplied to the gate terminal of the first transistor TR1. As the threshold voltage compensation is performed, a problem of a non-uniform driving current caused by a threshold voltage deviation of the first transistor TR1 may be solved.

An input terminal of the initialization voltage VINT may be connected to a first terminal of each of the fourth transistors TR4_1 and TR4_2 and a first terminal of the seventh transistor TR7, and an output terminal of the initialization voltage VINT may be connected to a second terminal of each of the fourth transistors TR4_1 and TR4_2 and a first terminal of the storage capacitor CST.

Each of the fourth transistors TR4_1 and TR4_2 may include a gate terminal, a first terminal, and a second terminal. The fourth transistor TR4_1 and the fourth transistor TR4_2 may be connected in series and may be operated as a dual transistor. For example, when the dual transistor is turned off, a leakage current may be reduced. The gate terminal of each of the fourth transistors TR4_1 and TR4_2 may receive the data initialization signal GI. The first terminal of each of the fourth transistors TR4_1 and TR4_2 may be supplied with the initialization voltage VINT. The second terminal of each of the fourth transistors TR4_1 and TR4_2 may be connected to the gate terminal of the first transistor TR1. In exemplary embodiments, the first terminal of each of the fourth transistors TR4_1 and TR4_2 may be a source terminal, and the second terminal of each of the fourth transistors TR4_1 and TR4_2 may be a drain terminal. Alternatively, the first terminal of each of the fourth transistors TR4_1 and TR4_2 may be a drain terminal, and the second terminal of each of the fourth transistors TR4_1 and TR4_2 may be a source terminal.

Each of the fourth transistors TR4_1 and TR4_2 may supply the initialization voltage VINT to the gate terminal of the first transistor TR1 during the activation period of the data initialization signal GI. In this case, each of the fourth transistors TR4_1 and TR4_2 may operate in a linear area. In other words, each of the fourth transistors TR4_1 and TR4_2 may initialize the gate terminal of the first transistor TR1 into the initialization voltage VINT during the activation period of the data initialization signal GI. In exemplary embodiments, the initialization voltage VINT may have a voltage level sufficiently lower than a voltage level of the data signal DATA maintained by the storage capacitor CST in a previous frame, and the initialization voltage VINT may be supplied to a gate terminal of a first transistor TR1 which is a p-channel metal oxide semiconductor (PMOS) transistor. In other exemplary embodiments, the initialization voltage may have a voltage level sufficiently higher than the voltage level of the data signal maintained by the storage capacitor in the previous frame, and the initialization voltage may be supplied to a gate terminal of a first transistor which is an n-channel metal oxide semiconductor (NMOS) transistor.

In exemplary embodiments, the data initialization signal GI may be substantially the same signal as the scan signal GW before one horizontal time. For example, the data initialization signal GI supplied to a sub-pixel of the $n^{th}$ row (where n is an integer of 2 or more) among a plurality of sub-pixels (e.g., a sub-pixel circuit SUB-PIXEL CIRCUIT) and organic light emitting diodes OLED included in the organic light emitting display device 100 may be substantially the same signal as the scan signal GW supplied to a sub-pixel of the $(n-1)^{th}$ row among the sub-pixels. In other words, an activated scan signal GW is supplied to the sub-pixel of the $(n-1)^{th}$ row among the sub-pixels, so that an activated data initialization signal GI may be supplied to the sub-pixel of the $n^{th}$ row among the sub-pixels. As a result, the data signal DATA may be supplied to the sub-pixel of the $(n-1)^{th}$ row among the sub-pixels, and the gate terminal of the first transistor TR1 included in the sub-pixel of the $n^{th}$ row among the sub-pixels may be initialized to the initialization voltage VINT.

The fifth transistor TR5 may include a gate terminal, a first terminal, and a second terminal. The gate terminal may be supplied with the emission control signal EM. The first terminal may be connected to the high power voltage ELVDD wiring. The second terminal may be connected to the first terminal of the first transistor TR1. In exemplary embodiments, the first terminal of the fifth transistor TR5 may be a source terminal, and the second terminal of the fifth transistor TR5 may be a drain terminal. Alternatively, the first terminal of the fifth transistor TR5 may be a drain terminal, and the second terminal of the fifth transistor TR5 may be a source terminal.

The fifth transistor TR5 may supply the high power supply voltage ELVDD to the first terminal of the first transistor TR1 during the activation period of the emission control signal EM. On the contrary, the fifth transistor TR5 may block the supply of the high power supply voltage ELVDD during the inactivation period of the emission control signal EM. In this case, the fifth transistor TR5 may operate in a linear area. The fifth transistor TR5 may supply the high power supply voltage ELVDD to the first terminal of the first transistor TR1 during the activation period of the emission control signal EM, so that the first transistor TR1 may generate the driving current ID. In addition, the fifth transistor TR5 may block the supply of the high power supply voltage ELVDD during the inactivation period of the emission control signal EM, so that the data signal DATA supplied to the first terminal of the first transistor TR1 may be supplied to the gate terminal of the first transistor TR1.

The sixth transistor TR6 may include a gate terminal, a first terminal, and a second terminal. The gate terminal may be supplied with the emission control signal EM. The first terminal may be connected to the second terminal of the first transistor TR1. The second terminal may be connected to the first terminal of the organic light emitting diode OLED. In exemplary embodiments, the first terminal may be a source terminal, and the second terminal may be a drain terminal. Alternatively, the first terminal may be a drain terminal, and the second terminal may be a source terminal.

The sixth transistor TR6 may supply the driving current ID generated by the first transistor TR1 to the organic light emitting diode OLED during the activation period of the emission control signal EM. In this case, the sixth transistor TR6 may operate in a linear area. In other words, the sixth transistor TR6 may supply the driving current ID generated by the first transistor TR1 to the organic light emitting diode OLED during the activation period of the emission control signal EM, so that the organic light emitting diode OLED may output light. In addition, the sixth transistor TR6 electrically isolates the first transistor TR1 and the organic light emitting diode OLED from each other during the inactivation period of the emission control signal EM, so that the data signal DATA supplied to the second terminal of the first transistor TR1 (more precisely, the data signal compensated for the threshold voltage) may be supplied to the gate terminal of the first transistor TR1.

The seventh transistor TR7 may include a gate terminal, a first terminal, and a second terminal. The gate terminal may be supplied with the diode initialization signal GB. The first terminal may be supplied with the initialization voltage VINT. The second terminal may be connected to the first terminal of the organic light emitting diode OLED. In exemplary embodiments, the first terminal may be a source terminal, and the second terminal may be a drain terminal. Alternatively, the first terminal may be a drain terminal, and the second terminal may be a source terminal.

The seventh transistor TR7 may supply the initialization voltage VINT to the first terminal of the organic light emitting diode OLED during the activation period of the diode initialization signal GB. In this case, the seventh transistor TR7 may operate in a linear area. In other words, the seventh transistor TR7 may initialize the first terminal of the organic light emitting diode OLED into the initialization voltage VINT during activation period of the diode initialization signal GB.

Alternatively, the data initialization signal GI may be substantially the same as the diode initialization signal GB. An operation of initializing the gate terminal of the first transistor TR1 and an operation of initializing the first terminal of the organic light emitting diode OLED may not affect each other. In other words, the operation of initializing the gate terminal of the first transistor TR1 and the operation of initializing the first terminal of the organic light emitting diode OLED may be independent of each other. Accordingly, the diode initialization signal GB is not separately generated, so that the economic efficiency of the process can be improved.

The storage capacitor CST may include a first terminal and a second terminal. The storage capacitor CST may be connected between the high power voltage ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply voltage ELVDD wiring. The storage capacitor CST may maintain a voltage level of the gate terminal of the first transistor TR1 during the inactivation period of the scan signal GW. The inactivation period of the scan signal GW may include an activation period of the emission control signal EM, and the driving current ID generated by the first transistor TR1 during the activation period of the emission control signal EM may be supplied to the organic light emitting diode OLED. Accordingly, the driving current ID generated by the first transistor TR1 may be supplied to the organic light emitting diode OLED, based on the voltage level maintained by the storage capacitor CST. Alternatively, the sub-pixel circuit SUB-PIXEL CIRCUIT may include first to seventh transistors TR1, TR2, TR3_1, TR3_2, TR4_1, TR4_2, TR5, TR6, TR7 (e.g., seven transistors), at least one storage capacitor CST, and the like.

Figure 6:
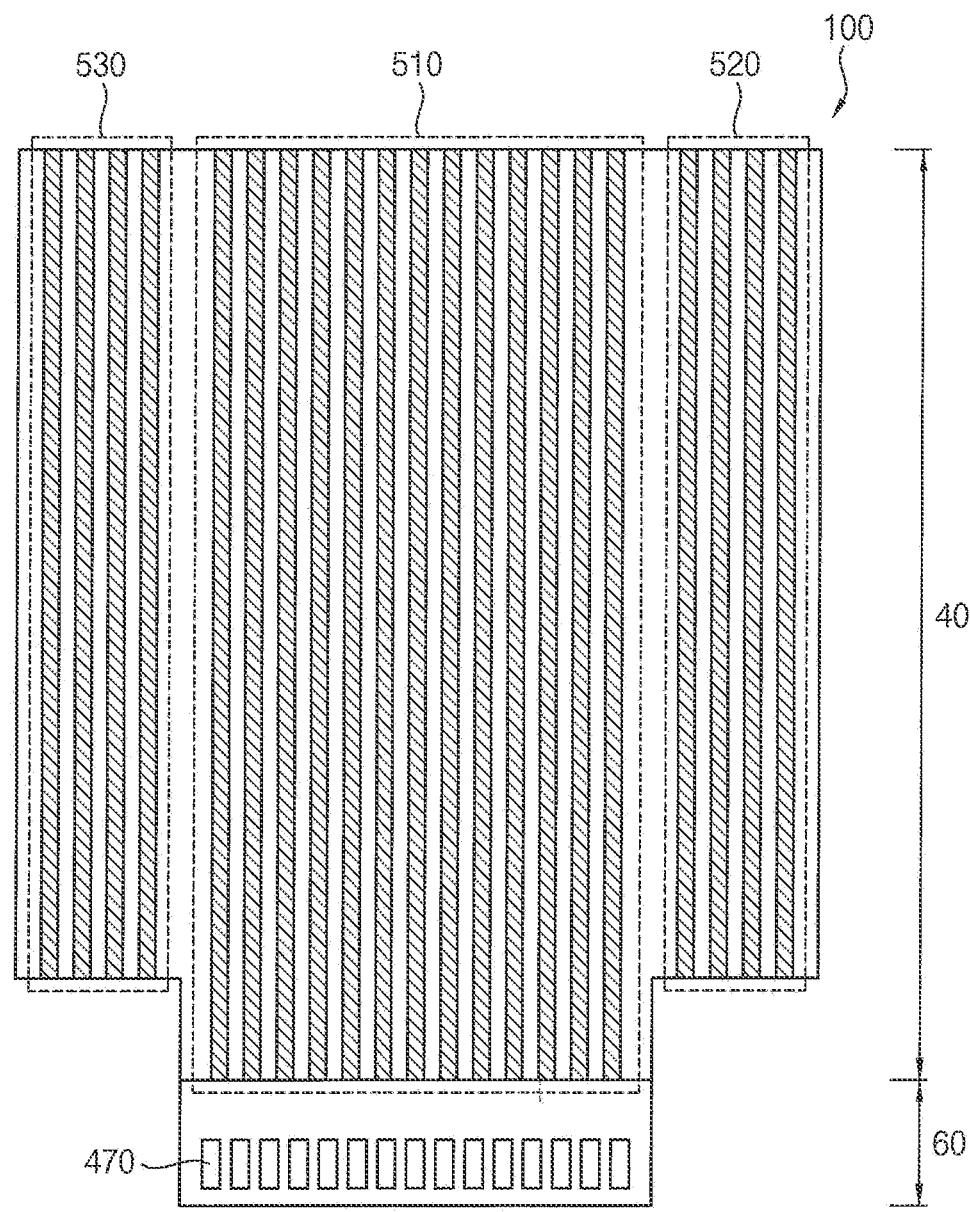
FIG. 6 is a plan view illustrating center signal wirings, right signal wirings, and left signal wirings disposed in the first to third sub-display areas of FIG. 2, respectively.
Figure 7:
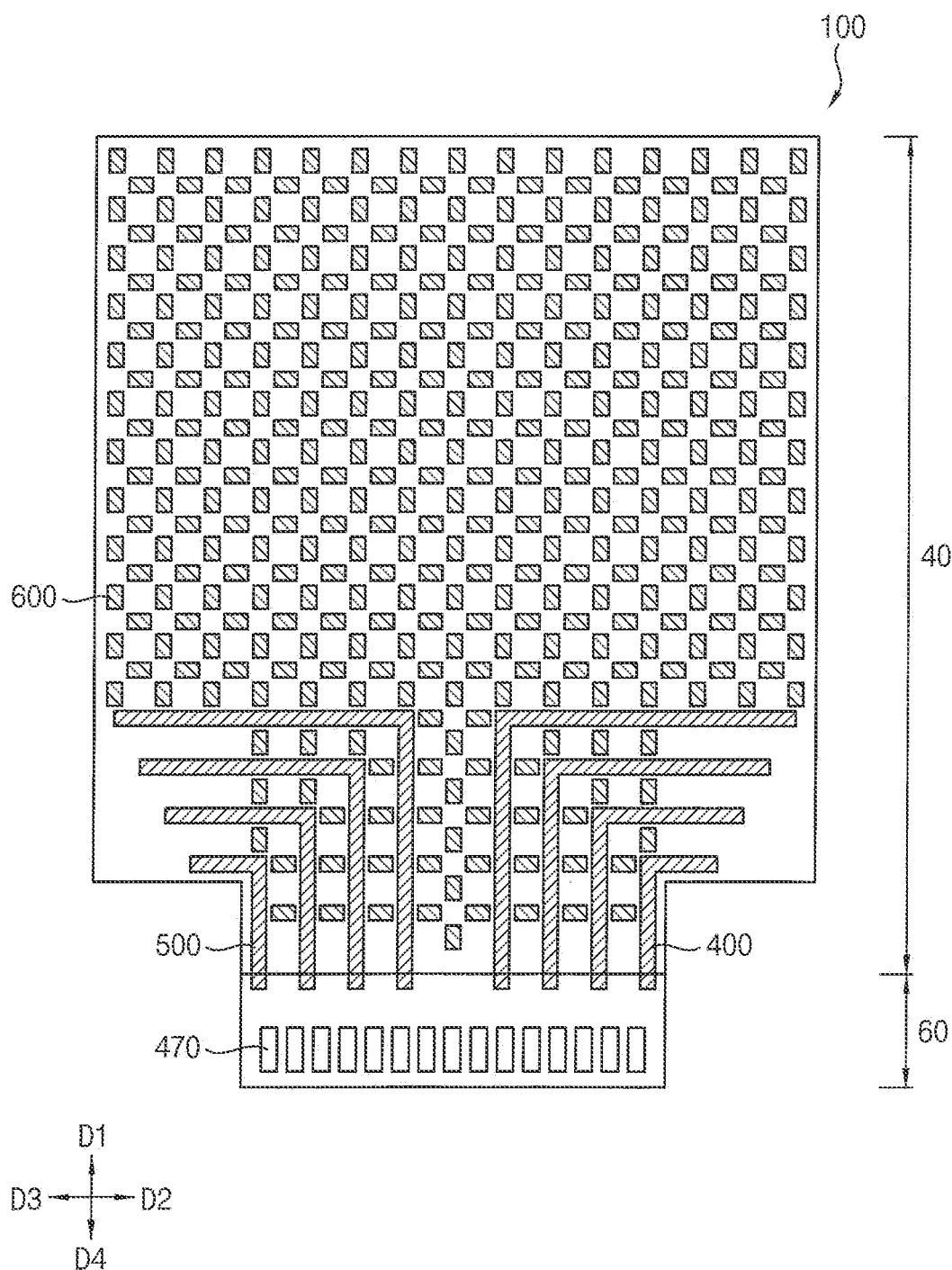
FIG. 7 is a plan view illustrating fan-out wirings and dummy patterns included in the organic light emitting display device of FIG. 1.
Figure 8:
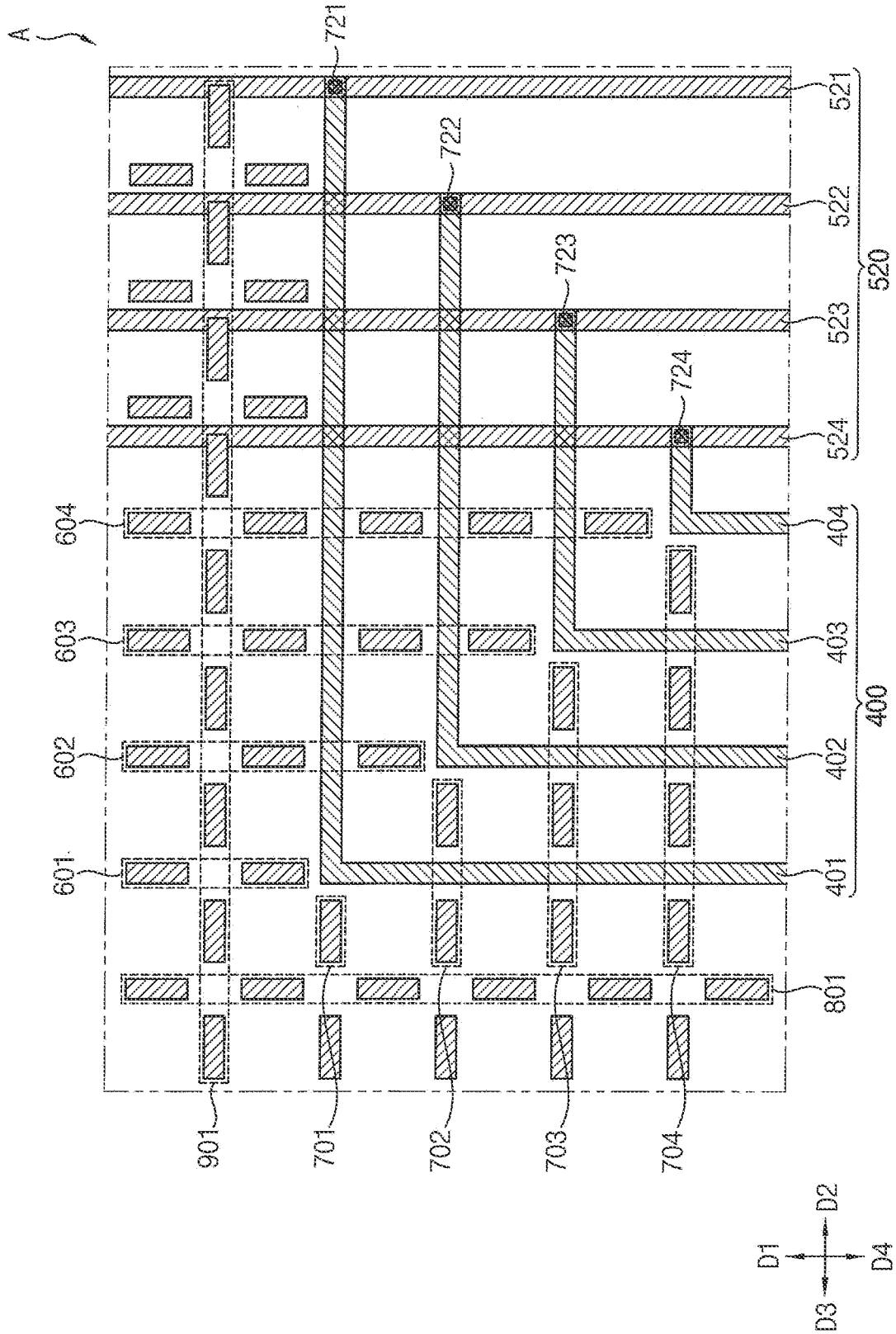
FIG. 8 is an enlarged plan view showing an area "A" of the organic light emitting display device of FIG. 1.
Figure 9:
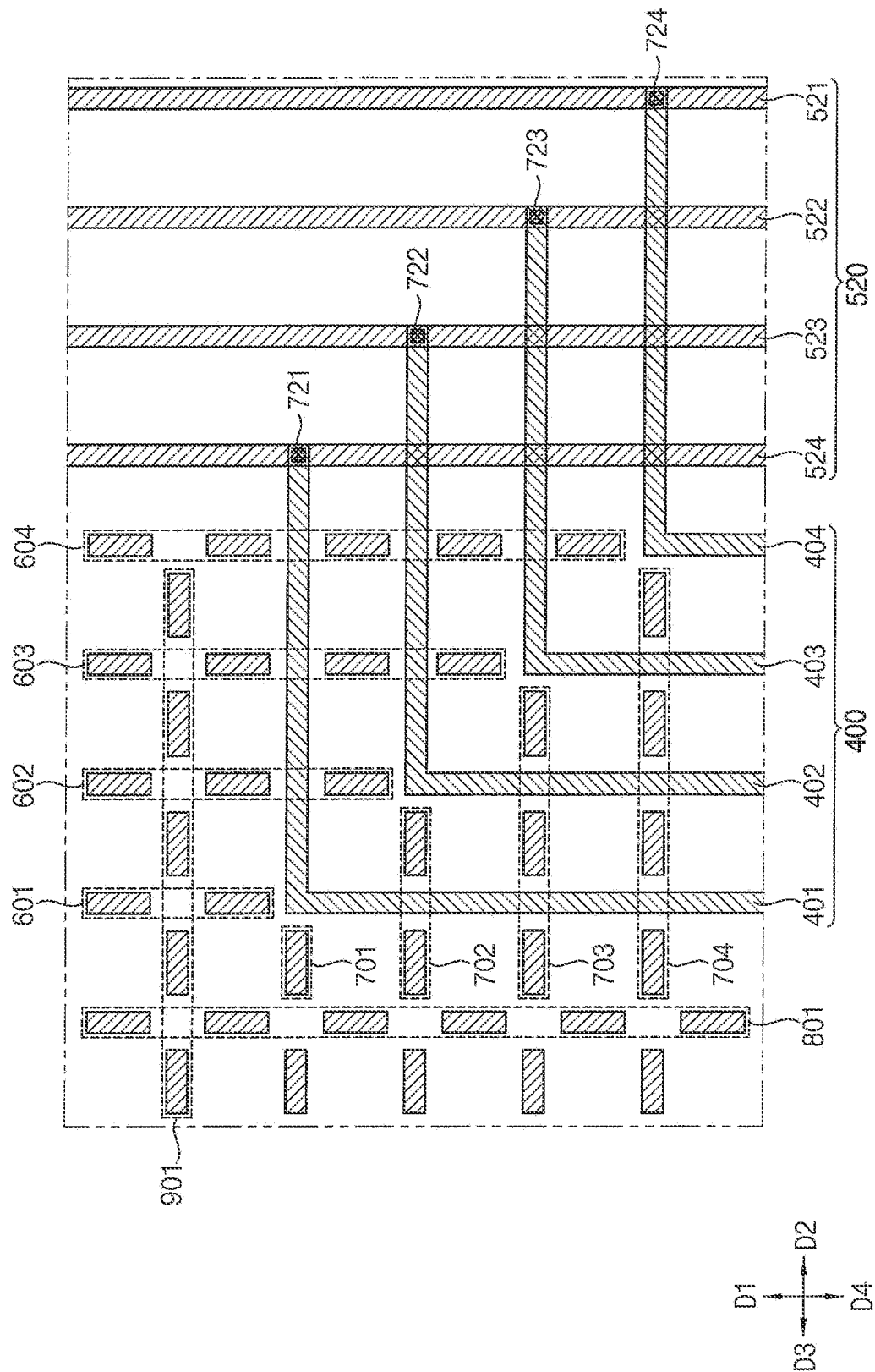
FIG. 9 is a plan view showing an example of the fan-out wirings and the dummy patterns included in the organic light emitting display device according to exemplary embodiments.
Figure 10:
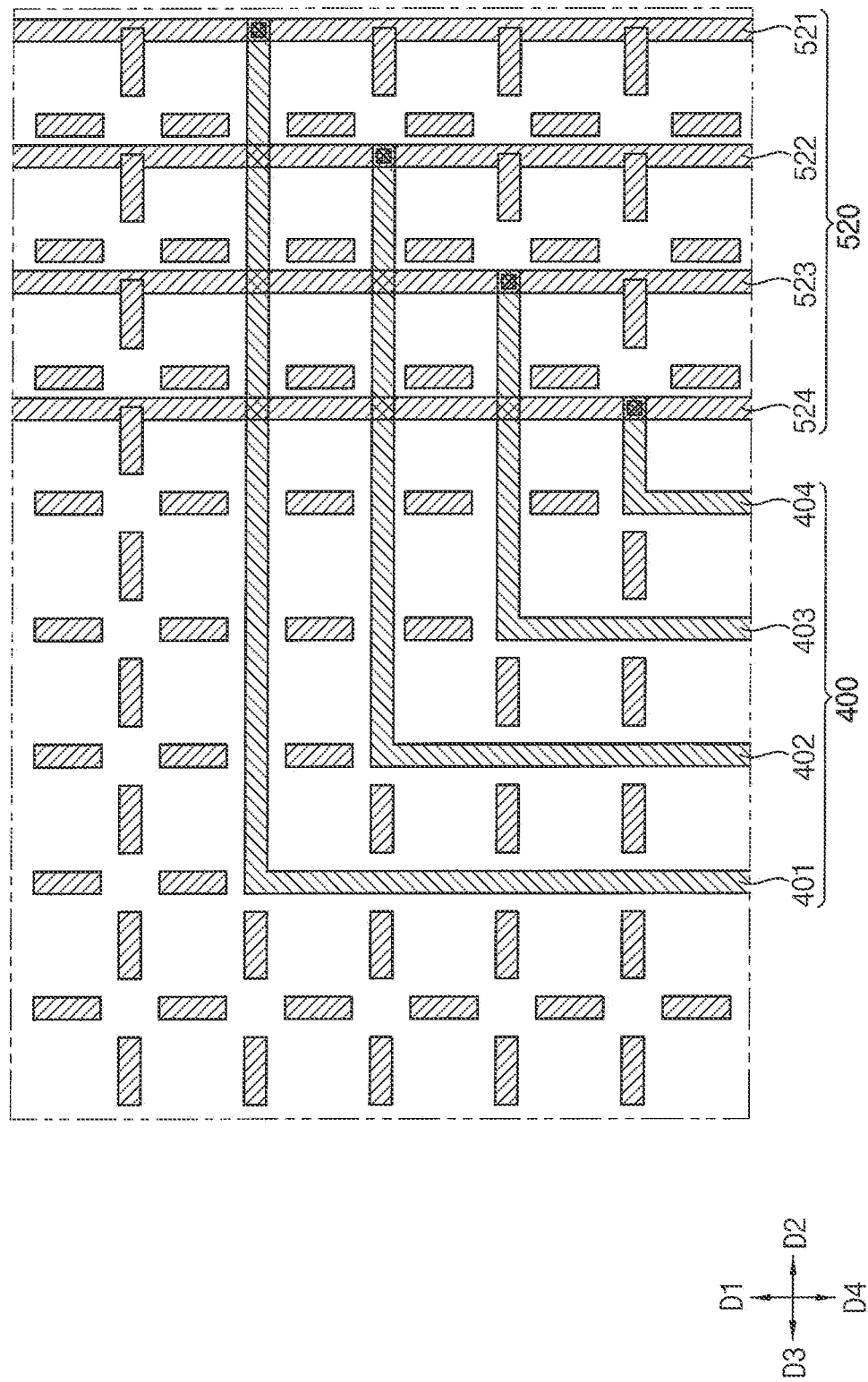
FIG. 10 is a plan view showing another example of the fan-out wirings and the dummy patterns included in the organic light emitting display device according to exemplary embodiments.

FIG. 6 is a plan view illustrating center signal wirings, right signal wirings, and left signal wirings disposed in the first to third sub-display areas of FIG. 2, respectively. FIG. 7 is a plan view illustrating fan-out wirings and dummy patterns included in the organic light emitting display device of FIG. 1. FIG. 8 is an enlarged plan view showing an area "A" of the organic light emitting display device of FIG. 1. FIG. 9 is a plan view showing an example of the fan-out wirings and the dummy patterns included in the organic light emitting display device according to exemplary embodiments. FIG. 10 is a plan view showing another example of the fan-out wirings and the dummy patterns included in the organic light emitting display device according to exemplary embodiments. For example, display area 40 of FIG. 6 shows only the center signal wirings 510, right signal wirings 520, and left signal wirings 530 for convenience of description. FIG. 7 shows only the right fan-out wirings 400, left fan-out wirings 500, and dummy patterns 600 in the display area 40.

Referring to FIGS. 6, 7 and 8, the organic light emitting display device 100 may include a substrate (not shown), center signal wirings 510, right signal wirings 520, left signal wirings 530, right fan-out wirings 400, left fan-out wirings 500, dummy patterns 600, pad electrodes 470, and the like. As the organic light emitting display device 100 includes the display area 40 including the first sub-display area 10, the second sub-display area 20, and the third sub-display area 30, and the pad area 60, the substrate may also be divided into a first sub-display area 10, a second sub-display area 20, a third sub-display area 30, and a pad area 60.

The center signal wirings 510 may be disposed in the first sub-display area 10 on the substrate, the right signal wirings 520 may be disposed in the second sub-display area 20 on the substrate, and the left signal wirings 530 may be disposed in the third sub-display area 30 on the substrate. Alternatively, the center signal wirings 510 may be disposed in a portion of the pad area 60. For example, the center signal wirings 510 may include first to thirteenth center signal wirings.

In exemplary embodiments, the right signal wirings 520 may be disposed only in the second sub-display area 20, and the left signal wirings 530 may be disposed only in the third sub-display area 30. For example, as shown in FIG. 8, the right signal wirings 520 may include first to fourth right signal wirings 521, 522, 523, and 524. In addition, the left signal wirings 530 may also include first to fourth left signal wirings. The fourth right signal wiring 524 and the fourth left signal wiring may be positioned adjacent to (or face) each other, and the first right signal wiring 521 and the first left signal wiring may be disposed at the outermost sides. In other words, the first to fourth right signal wirings 521, 522, 523, and 524 may be arranged according to a reverse sequence in the second direction D2 in the second sub-display area 20, and the first to fourth left signal wirings may be arranged according to a reverse sequence in the third direction D3 in the third sub-display area 30. In other words, the first to fourth right signal wirings 521, 522, 523, and 524 may be symmetrical with the first to fourth left signal wirings.

In exemplary embodiments, each of the center signal wirings 510, the right signal wirings 520, and the left signal wirings 530 may correspond to a data signal wiring (e.g., a data signal DATA wiring of FIG. 5). In other words, the data signal may be applied from the external device 101 to the center signal wirings 510, the right signal wirings 520, and the left signal wirings 530. In addition, the center signal wirings 510 may be electrically connected to the pad electrodes 470 without fan-out wirings, but the right signal wirings 520 and the left signal wirings 530 may be electrically connected to the pad electrodes 470 through the right fan-out wirings 400 and the left fan-out wirings 500, respectively. Further, lengths of the center signal wirings 510 in the first direction D1 may be longer than lengths of the right signal wirings 520 and the left signal wirings 530 in the first direction D1.

The right fan-out wirings 400, the left fan-out wirings 500, and the dummy patterns 600 may be disposed on the center signal wirings 510, the right signal wirings 520, and the left signal wirings 530.

The right fan-out wirings 400 may be disposed in a portion of the pad area 60, in the first sub-display area 10 and in the second sub-display area 20 on the substrate, and each of the right fan-out wirings 400 may include a bent part. For example, each of the right fan-out wirings 400 may include a vertical extension part and a horizontal extension part. The vertical extension part may be disposed in a portion of the pad area 60 and in the first sub-display area 10, and may extend in the first direction D1. In addition, the horizontal extension part may extend in the second direction D2 from a first end of the vertical extension part positioned in the first sub-display area 10. For example, a second end of the vertical extension part may be positioned in the pad area 60, and the first end opposite to the second end of the vertical extension part may be connected to a first end of the horizontal extension part. A second end opposite to the first end of the horizontal extension part may be connected to one of the right signal wirings 520 through a contact hole.

As shown in FIG. 8, the right fan-out wirings 400 may include first to fourth right fan-out wirings 401, 402, 403, and 404. The first right fan-out wiring 401 may be connected to the first right signal wiring 521 through a first contact hole 721, the second right fan-out wiring 402 may be connected to the second right signal wiring 522 through a second contact hole 722, the third right fan-out wiring 403 may be connected to the third right signal wiring 523 through a third contact hole 723, and the fourth right fan-out wiring 404 may be connected to the fourth right signal wiring 524 through a fourth contact hole 724. Sizes of the first to fourth right fan-out wirings 401, 402, 403, and 404 may be sequentially decreased.

In exemplary embodiments, in each of the right fan-out wirings 400, a bent part may be defined by the first end of the vertical extension part and the first end of the horizontal extension part, and the vertical extension part and the horizontal extension part may be integrally formed with each other. Alternatively, the right fan-out wirings 400 may not be disposed in the pad area 60.

The left fan-out wirings 500 may be disposed in a portion of the pad area 60, in the first sub-display area 10 and in the third sub-display area 30 on the substrate, and each of the left fan-out wirings 500 may include a bent part. For example, each of the left fan-out wirings 500 may include a vertical extension part and a horizontal extension part. The vertical extension part may be disposed in a portion of the pad area 60 and in the first sub-display area 10, and may extend in the first direction D1. In addition, the horizontal extension part may extend in the third direction D3 from a first end of the vertical extension part positioned in the first sub-display area 10. For example, a second end of the vertical extension part may be positioned in the pad area 60, and the first end opposite to the second end of the vertical extension part may be connected to a first end of the horizontal extension part. A second end opposite to the first end of the horizontal extension part may be connected to one of the left signal wirings 530 through a contact hole.

For example, the left fan-out wirings 500 may include first to fourth left fan-out wirings. The first left fan-out wiring may be connected to the first left signal wiring through a fifth contact hole, the second left fan-out wiring may be connected to the second left signal wiring through a sixth contact hole, the third left fan-out wiring may be connected to the third left signal wiring through a seventh contact hole, and the fourth left fan-out wiring may be connected to the fourth left signal wiring through an eighth contact hole. Sizes of the first to fourth left fan-out wirings may be sequentially decreased.

In exemplary embodiments, in each of the left fan-out wirings 500, a bent part may be defined by the first end of the vertical extension part and the first end of the horizontal extension part, and the vertical extension part and the horizontal extension part may be integrally formed with each other. In addition, the right fan-out wirings 400 may be symmetrical with the left fan-out wirings 500. Alternatively, the left fan-out wirings 500 may not be disposed in the pad area 60.

The dummy patterns 600 may be spaced apart from the right fan-out wirings 400 and the left fan-out wirings 500 in the first sub-display area 10, the second sub-display area 20, and the third sub-display area 30. The dummy patterns 600 may have a lattice shape. The dummy patterns 600 may include a plurality of vertical dummy patterns, a plurality of horizontal dummy patterns, a plurality of sub-vertical dummy patterns, and a plurality of sub-horizontal dummy patterns.

The vertical dummy patterns of the dummy patterns 600 may be spaced apart from the vertical extension parts of the right fan-out wirings 400 and the left fan-out wirings 500 in the first direction D1, and may be arrayed to be spaced apart from each other in the first direction D1. The horizontal dummy patterns of the dummy patterns 600 may be spaced apart from the horizontal extension parts of the right fan-out wirings 400 in the third direction D3, and may be arrayed to be spaced apart from each other in the third direction D3. In addition, the horizontal dummy patterns of the dummy patterns 600 may be spaced apart from the horizontal extension parts of the left fan-out wirings 500 in the second direction D2, and may be arrayed to be spaced apart from each other in the second direction D2.

For example, as shown in FIG. 8, the vertical dummy patterns may include first to fourth vertical dummy patterns 601, 602, 603, and 604, and the horizontal dummy patterns may include first to fourth horizontal dummy patterns 701, 702, 703, and 704.

The first vertical dummy patterns 601 may be spaced apart from the vertical extension part of the first right fan-out wiring 401 in the first direction D1, and may be arrayed to be spaced apart from each other in the first direction D1 (e.g., a direction substantially the same as the direction in which the vertical extension part extends).

The second vertical dummy patterns 602 may be spaced apart from the vertical extension part of the second right fan-out wiring 402 in the first direction D1, and may be arrayed to be spaced apart from each other in the first direction D1 (e.g., a direction substantially the same as the direction in which the vertical extension part extends). The second vertical dummy patterns 602 may be spaced apart from the horizontal extension part of the first right fan-out wiring 401. In other words, the horizontal extension part of the first right fan-out wiring 401 may be interposed between the second vertical dummy patterns 602.

The third vertical dummy patterns 603 may be spaced apart from the vertical extension part of the third right fan-out wiring 403 in the first direction D1, and may be arrayed to be spaced apart from each other in the first direction D1 (e.g., a direction substantially the same as the direction in which the vertical extension part extends). The third vertical dummy patterns 603 may be spaced apart from the horizontal extension part of the first right fan-out wiring 401 and the horizontal extension part of the second right fan-out wiring 402.

The fourth vertical dummy patterns 604 may be spaced apart from the vertical extension part of the fourth right fan-out wiring 404 in the first direction D1, and may be arrayed to be spaced apart from each other in the first direction D1 (e.g., a direction substantially the same as the direction in which the vertical extension part extends). The fourth vertical dummy patterns 604 may be spaced apart from the horizontal extension part of the first right fan-out wiring 401, the horizontal extension part of the second right fan-out wiring 402, and the horizontal extension part of the third right fan-out wiring 403.

First horizontal dummy patterns 701 may be spaced apart from the horizontal extension part of the first right fan-out wiring 401 in the third direction D3, and may be arrayed to be spaced apart from each other in the third direction D3. One first horizontal dummy pattern is shown in FIG. 9, however, at least two first horizontal dummy patterns may be disposed between the sub-vertical dummy patterns 801 and the first right fan-out wiring 401.

The second horizontal dummy patterns 702 may be spaced apart from the horizontal extension part of the second right fan-out wiring 402 in the third direction D3, and may be arrayed to be spaced apart from each other in the third direction D3. The second horizontal dummy patterns 702 may be spaced apart from the vertical extension part of the first right fan-out wiring 401. In other words, the vertical extension part of the first right fan-out wiring 401 may be interposed between the second horizontal dummy patterns 702.

The third horizontal dummy patterns 703 may be spaced apart from the horizontal extension part of the third right fan-out wiring 403 in the third direction D3, and may be arrayed to be spaced apart from each other in the third direction D3. The third horizontal dummy patterns 703 may be spaced apart from the vertical extension part of the second right fan-out wiring 402 and the vertical extension part of the first right fan-out wiring 401. In other words, the vertical extension part of the second right fan-out wiring 402 and the vertical extension part of the first right fan-out wiring 401 may be interposed between the third horizontal dummy patterns 703.

The fourth horizontal dummy patterns 704 may be spaced apart from the horizontal extension part of the fourth right fan-out wiring 404 in the third direction D3, and may be arrayed to be spaced apart from each other in the third direction D3. The fourth horizontal dummy patterns 704 may be spaced apart from the vertical extension part of the third right fan-out wiring 403, the vertical extension part of the second right fan-out wiring 402, and the vertical extension part of the first right fan-out wiring 401. In other words, the vertical extension part of the third right fan-out wiring 403, the vertical extension part of the second right fan-out wiring 402, and the vertical extension part of the first right fan-out wiring 401 may be interposed between the fourth horizontal dummy patterns 704.

In addition, the vertical dummy patterns may further include fifth to eighth vertical dummy patterns, and the horizontal dummy patterns may further include fifth to eighth horizontal dummy patterns.

The fifth vertical dummy patterns may be spaced apart from the vertical extension part of the first left fan-out wiring in the first direction D1, and may be arrayed to be spaced apart from each other in the first direction D1.

The sixth vertical dummy patterns may be spaced apart from the vertical extension part of the second left fan-out wiring in the first direction D1, and may be arrayed to be spaced apart from each other in the first direction D1. The sixth vertical dummy patterns may be spaced apart from the horizontal extension part of the first left fan-out wiring. In other words, the horizontal extension part of the first left fan-out wiring may be interposed between the sixth vertical dummy patterns.

The seventh vertical dummy patterns may be spaced apart from the vertical extension part of the third left fan-out wiring in the first direction D1, and may be arrayed to be spaced apart from each other in the first direction D1. The seventh vertical dummy patterns may be spaced apart from the horizontal extension part of the first left fan-out wiring and the horizontal extension part of the second left fan-out wiring. In other words, the horizontal extension part of the first left fan-out wiring and the horizontal extension part of the second left fan-out wiring may be interposed between the seventh vertical dummy patterns.

The eighth vertical dummy patterns may be spaced apart from the vertical extension part of the fourth left fan-out wiring in the first direction D1, and may be arrayed to be spaced apart from each other in the first direction D1. The eighth vertical dummy patterns may be spaced apart from the horizontal extension part of the first left fan-out wiring, the horizontal extension part of the second left fan-out wiring, and the horizontal extension part of the third left fan-out wiring. In other words, the horizontal extension part of the first left fan-out wiring, the horizontal extension part of the second left fan-out wiring, and the horizontal extension part of the third left fan-out wiring may be interposed between the eighth vertical dummy patterns.

The fifth horizontal dummy patterns may be spaced apart from the horizontal extension part of the first left fan-out wiring in the third direction D3, and may be arrayed to be spaced apart from each other in the third direction D3. One fifth horizontal dummy pattern is shown in FIG. 7, however, at least two fifth horizontal dummy patterns may be disposed between the sub-vertical dummy patterns 801 and the first left fan-out wiring.

The sixth horizontal dummy patterns may be spaced apart from the horizontal extension part of the second left fan-out wiring in the third direction D3, and may be arrayed to be spaced apart from each other in the third direction D3. The sixth horizontal dummy patterns may be spaced apart from the vertical extension part of the first left fan-out wiring. In other words, the vertical extension part of the first left fan-out wiring may be interposed between the sixth horizontal dummy patterns.

The seventh horizontal dummy patterns may be spaced apart from the horizontal extension part of the third left fan-out wiring in the third direction D3, and may be arrayed to be spaced apart from each other in the third direction D3. The seventh horizontal dummy patterns may be spaced apart from the vertical extension part of the second left fan-out wiring and the vertical extension part of the first left fan-out wiring. In other words, the vertical extension part of the second left fan-out wiring and the vertical extension part of the first left fan-out wiring may be interposed between the seventh horizontal dummy patterns.

The eighth horizontal dummy patterns may be spaced apart from the horizontal extension part of the fourth left fan-out wiring in the third direction D3, and may be arrayed to be spaced apart from each other in the third direction D3. The eighth horizontal dummy patterns may be spaced apart from the vertical extension part of the third left fan-out wiring, the vertical extension part of the second left fan-out wiring, and the vertical extension part of the first left fan-out wiring. In other words, the vertical extension part of the third left fan-out wiring, the vertical extension part of the second left fan-out wiring, and the vertical extension part of the first left fan-out wiring may be interposed between the eighth horizontal dummy patterns.

The sub-horizontal dummy patterns of the dummy patterns 600 may be spaced apart from the horizontal extension parts of the right fan-out wirings 400 and the left fan-out wirings 500 in the first direction D1, and may be arrayed to be spaced apart from each other in the third direction D3. The sub-horizontal dummy patterns arrayed to be spaced apart from each other in the third direction D3 may be repeatedly spaced apart from each other in the first direction D1.

For example, as shown in FIG. 8, sub-horizontal dummy patterns 901 may be spaced apart from the horizontal extension part of the first right fan-out wiring 401 in the first direction D1, and may be arrayed to be spaced apart from each other in the third direction D3. The sub-horizontal dummy patterns 901 arrayed to be spaced apart from each other in the third direction D3 may be repeatedly spaced apart from each other in the first direction D1.

The sub-vertical dummy patterns may be disposed between the right fan-out wirings 400 and the left fan-out wirings 500. In other words, the sub-vertical dummy patterns may be spaced apart from the right fan-out wirings 400 in the third direction D3 or spaced apart from the left fan-out wirings 500 in the second direction D2.

For example, as shown in FIG. 8, sub-vertical dummy patterns 801 may be disposed between the right fan-out wirings 400 and the left fan-out wirings 500, and may be arrayed to be spaced apart from each other in the first direction D1. The dummy patterns 600 disposed on a left side of the sub-vertical dummy patterns 801 about the sub-vertical dummy patterns 801 may be symmetrical to the dummy patterns 600 disposed on a right side of the sub-vertical dummy patterns 801. In addition, the right fan-out wirings 400 and the left fan-out wirings 500 may be symmetrical to each other about the sub-vertical dummy patterns 801.

Further, the dummy patterns 600 may further include sub-vertical dummy patterns between the first right signal wiring 521 and the second right signal wiring 522, between the second right signal wiring 522 and the third right signal wiring 523, and between the third right signal wiring 523 and the fourth right signal wiring 524. Further, the dummy patterns 600 may further include sub-vertical dummy patterns between the first left signal wiring and the second left signal wiring, between the second left signal wiring and the third left signal wiring, and between the third left signal wiring and the fourth left signal wiring.

In other exemplary embodiments, as shown in FIG. 9, the first right fan-out wiring 401 may be connected to the fourth right signal wiring 524 through the first contact hole 721, the second right fan-out wiring 402 may be connected to the third right signal wiring 523 through the second contact hole 722, the third right fan-out wiring 403 may be connected to the second right signal wiring 522 through the third contact hole 723, and the fourth right fan-out wiring 404 may be connected to the first right signal wiring 521 through the fourth contact hole 724, in which the dummy patterns 600 may not disposed between the first right signal wiring 521 and the second right signal wiring 522, between the second right signal wiring 522 and the third right signal wiring 523, and between the third right signal wiring 523 and the fourth right signal wiring 524. In this case, the sizes of the first to fourth right fan-out wirings 401, 402, 403, and 404 may be the same as each other.

In other exemplary embodiments, as shown in FIG. 10, the sub-vertical dummy patterns and the sub-horizontal dummy patterns may be further disposed between the fourth right signal wiring 524 and the third right signal wiring 523, between the third right signal wiring 523 and the second right signal wiring 522, and between the second right signal wiring 522 and the first right signal wiring 521.

As described above, the dummy patterns 600 includes a plurality of vertical dummy patterns, a plurality of horizontal dummy patterns, a plurality of sub-vertical dummy patterns, and a plurality of sub-horizontal dummy patterns, so that the dummy patterns 600 may have a lattice shape in the display area 40.

For example, the conventional organic light emitting display device may include the right fan-out wirings and the left fan-out wirings to provide data signals to the right signal wirings and the left signal wirings. When the conventional organic light emitting display device includes the right fan-out wirings and the left fan-out wirings, a pattern and/or a spot may be visually recognized at a portion (such as the bent part) in which the right fan-out wirings and the left fan-out wirings are positioned in the display area of the conventional organic light emitting display device. In other words, the visibility of the conventional organic light emitting display device may be decreased.

The organic light emitting display device 100 according to the exemplary embodiments of the present invention includes the dummy patterns 600, so that the dummy patterns 600 may implement a lattice pattern shape over the whole of the display area 40, together with the right fan-out wirings 400 and the left fan-out wirings 500. In this case, the pattern and/or the spot may not be visually recognized on the organic light emitting display device 100. Accordingly, the visibility of the organic light emitting display device 100 may be relatively improved.

Although, in exemplary embodiments, it has been described that the center signal wirings 510 include 13 wirings, and each of the right signal wirings 520, the left signal wirings 530, the right fan-out wirings 400, and the left fan-out wirings 500 includes four wirings, the configuration of the present invention is not limited thereto.

For example, the right fan-out wirings 400 may include first to $M^{th}$ right fan-out wirings (where M is an integer of 1 or more), and the first to $M^{th}$ right fan-out wirings may be sequentially arranged while being spaced apart from each other. Total lengths of the first to $M^{th}$ right fan-out wirings may be sequentially decreased. A $K^{th}$ right fan-out wiring (where K is an integer between 1 and M) among the first to $M^{th}$ right fan-out wirings may include a vertical extension part disposed in the pad area 60 and the first sub-display area 10, and extending in the first direction D1, and a horizontal extension part extending in the second direction D2 from a first end of the vertical extension part positioned in the first sub-display area 10.

The second end of the vertical extension part of the $K^{th}$ right fan-out wiring may be positioned in the pad area 60, and the first end opposite to the second end of the vertical extension part of the $K^{th}$ right fan-out wiring may be connected to the first end of the horizontal extension part.

The right signal wirings 520 may include first to $N^{th}$ right signal wirings (where N is an integer of 1 or more), and the first to $N^{th}$ right signal wirings may be arranged according to a reverse sequence and spaced apart from each other. The $M^{th}$ right fan-out wiring and the $N^{th}$ right signal wiring may be disposed adjacent to a boundary between the first sub-display area 10 and the second sub-display area 20.

The horizontal extension part of the Kth right fan-out wiring among the first to $M^{th}$ right fan-out wirings may be connected to an $L^{th}$ right signal wiring (where L is an integer between 1 and N) among the first to $N^{th}$ right signal wirings through a contact hole, wherein K and L may be the same integer.

The bent part may be defined by the first end of the vertical extension part and the first end of the horizontal extension part of the $K^{th}$ right fan-out wiring, and the vertical extension part and the horizontal extension part of the $K^{th}$ right fan-out wiring may be integrally formed with each other.

The dummy patterns 600 may include first to $P^{th}$ (where P is an integer of 1 or more) dummy patterns. The $J^{th}$ dummy pattern (where J is an integer between 1 and N) among the first to $P^{th}$ dummy patterns may be spaced apart from the vertical extension part of the $K^{th}$ right fan-out wiring in the first direction D1, and may include a plurality of vertical dummy patterns arrayed to be spaced apart from each other in the first direction D1, and a plurality of horizontal dummy patterns spaced apart from the horizontal extension part of the $K^{th}$ right fan-out wiring in the third direction D3 and arrayed to be spaced apart from each other in the third direction D3.

The $J^{th}$ dummy pattern may further include a plurality of sub-vertical dummy patterns spaced apart from the vertical extension part of the $K^{th}$ right fan-out wiring in the third direction D3, and arrayed to be spaced apart from each other in the first direction D1, and a plurality of sub-horizontal dummy patterns spaced apart from the horizontal extension part of the $K^{th}$ right fan-out wiring in the first direction D1 and arrayed to be spaced apart from each other in the third direction D3.

Further, in exemplary embodiments, although the dummy patterns 600 has been described as being spaced apart from each other, the configuration of the present invention is not limited thereto. For example, in other exemplary embodiments, at least two dummy patterns 600 positioned adjacent to each other among the dummy patterns 600 may be integrally formed with each other.

Figure 11:
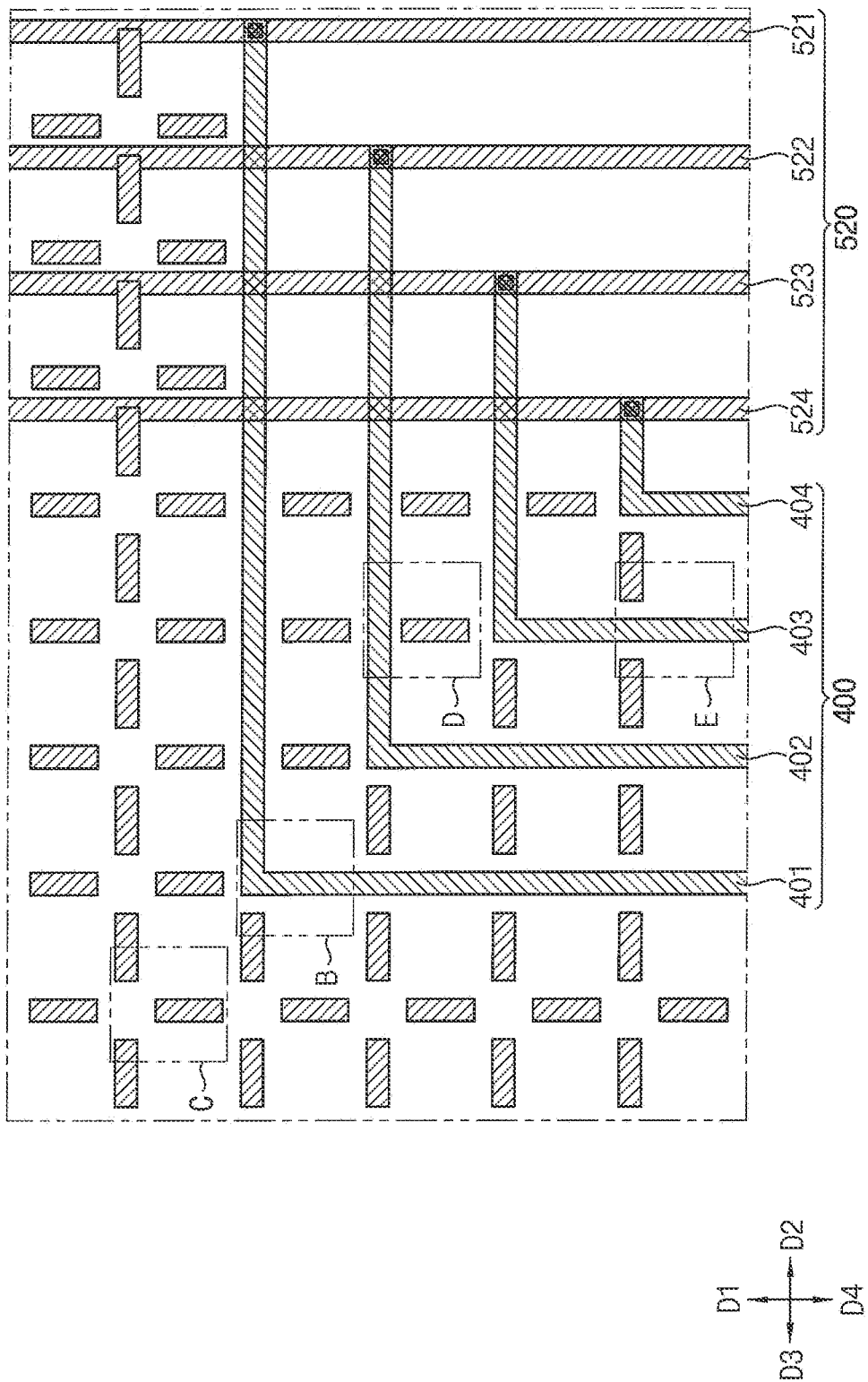
FIG. 11 is a plan view illustrating the fan-out wirings and the dummy patterns of FIG. 8.
Figure 12:
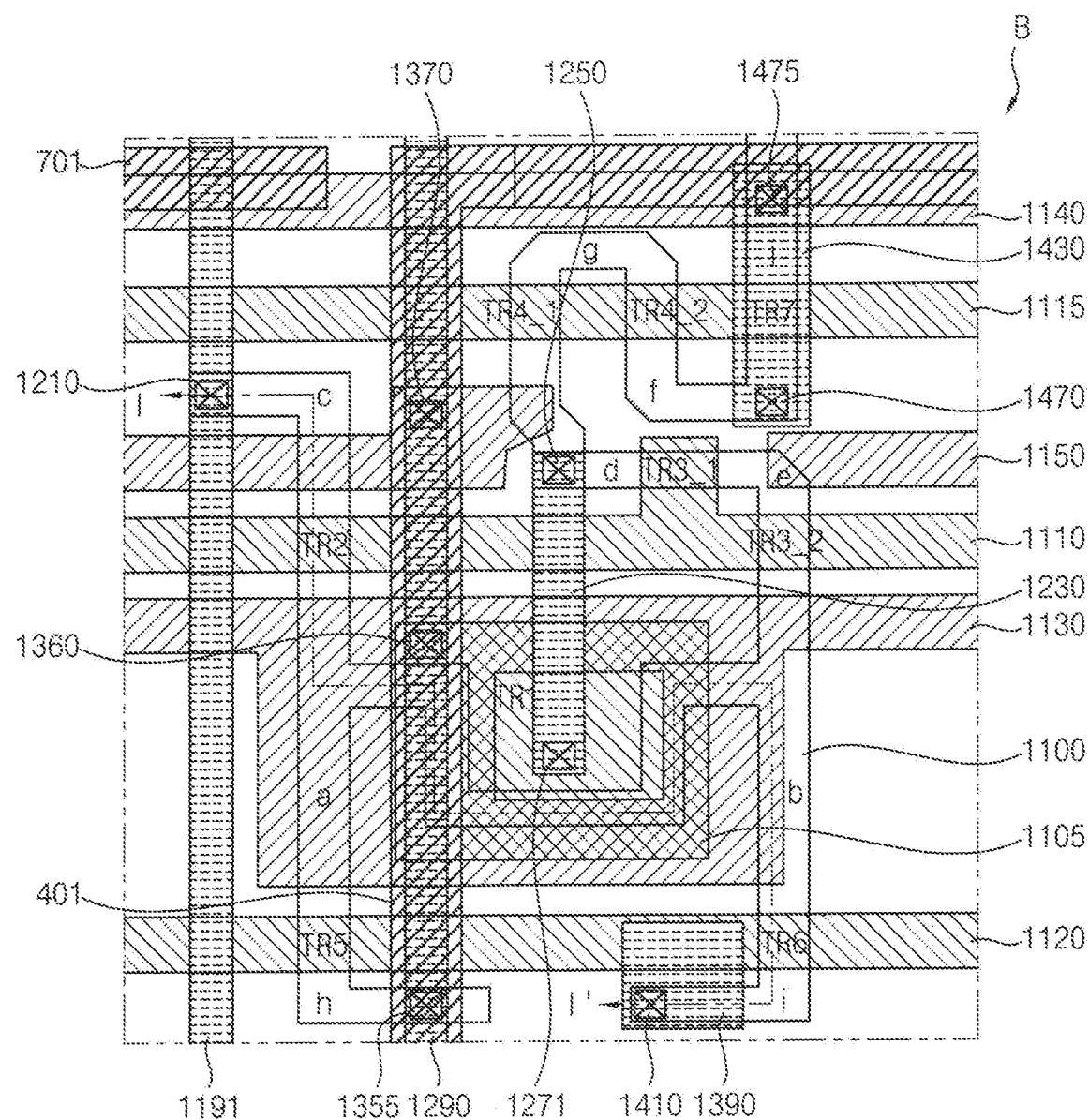
FIG. 12 is a layout diagram illustrating an area "B" of the organic light emitting display device of FIG. 11.
Figure 12:
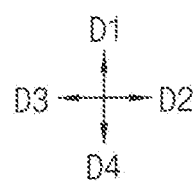
Figure 13:
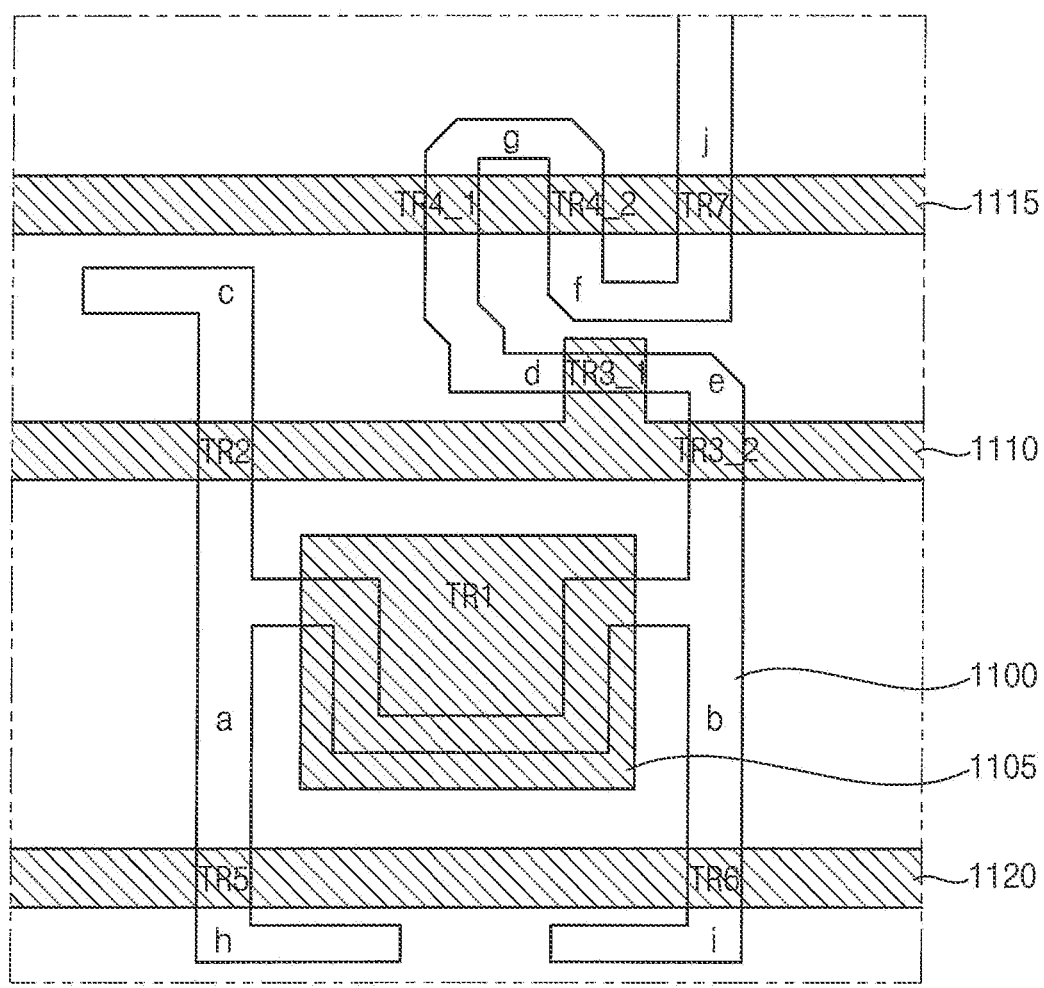
FIGS. 13 to 15 are layout diagrams illustrating an area "B" of FIG. 12.
Figure 13:
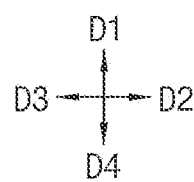
Figure 14:
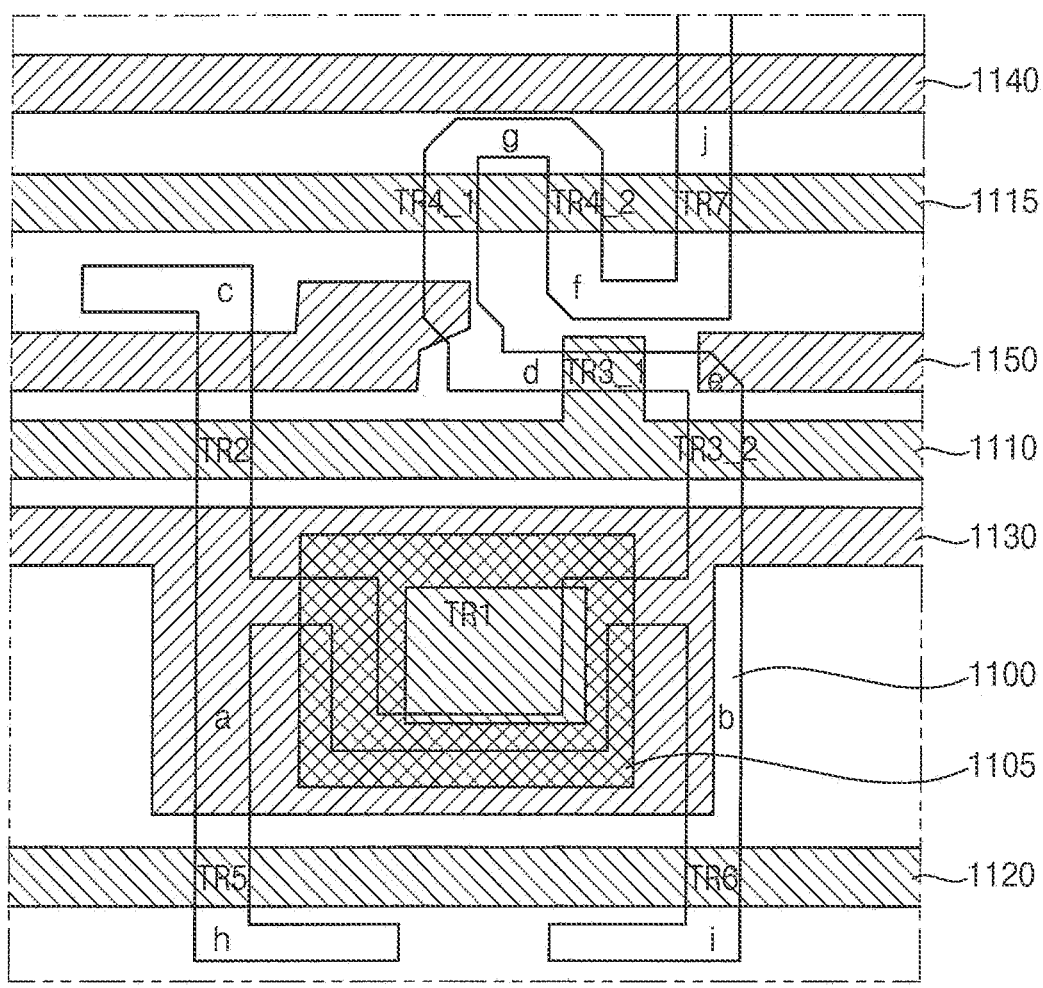
Figure 14:
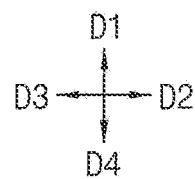
Figure 15:
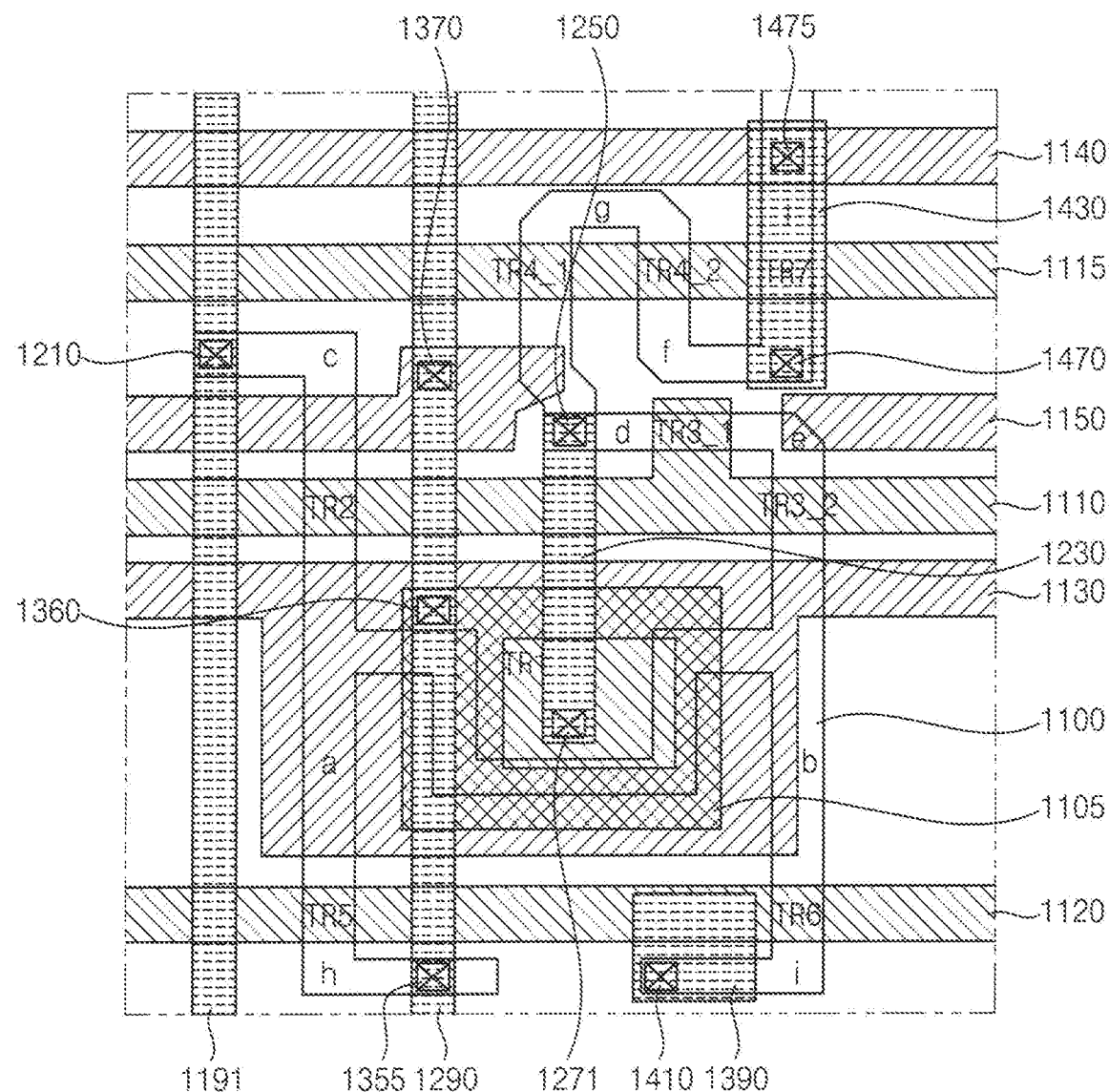
Figure 15:
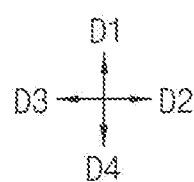
Figure 16:
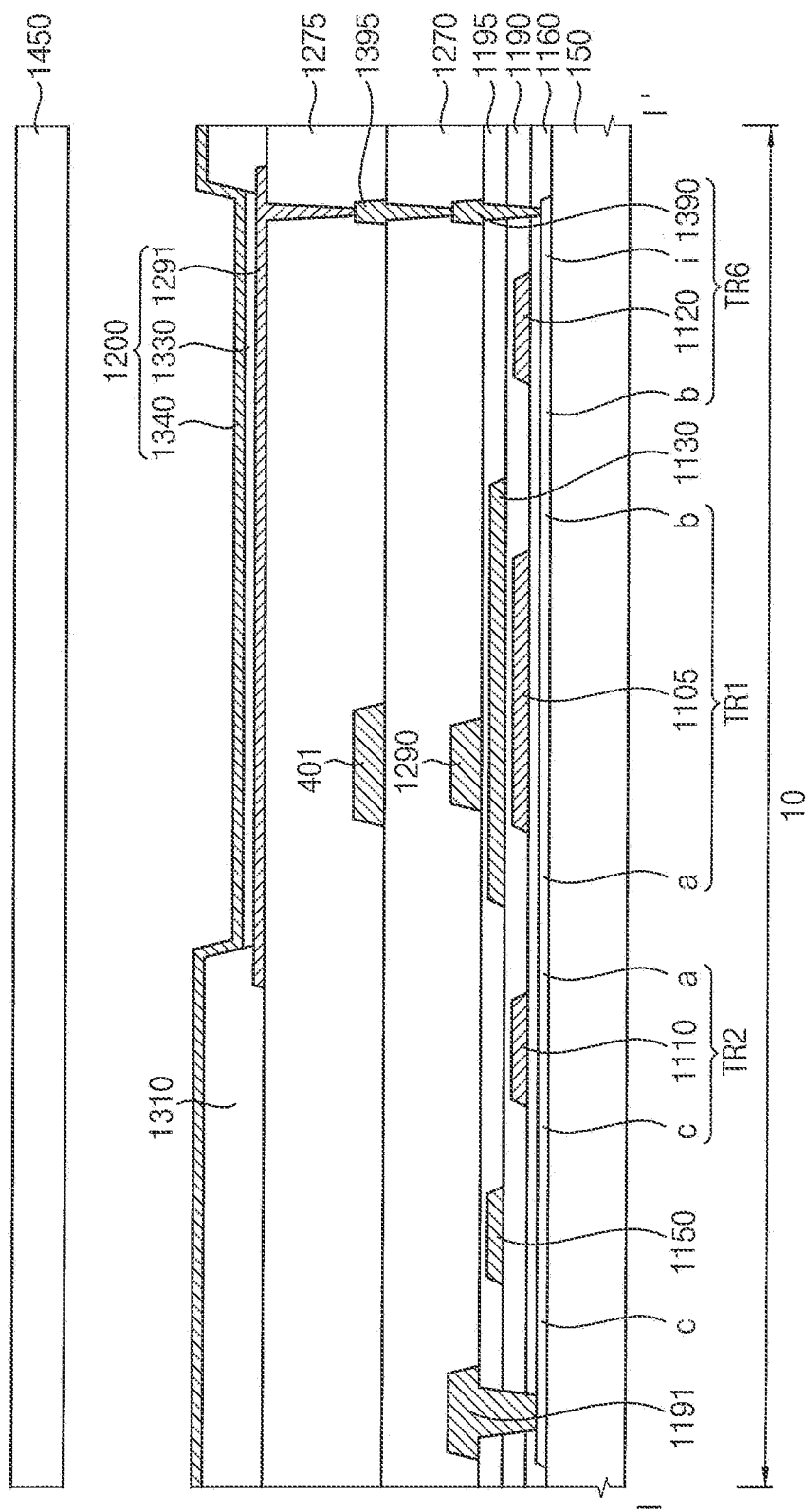
FIG. 16 is a sectional view taken along a line I-I' of the organic light emitting display device of FIG. 12.

FIG. 11 is a plan view illustrating the fan-out wirings and the dummy patterns of FIG. 8. FIG. 12 is a layout diagram illustrating an area "B" of the organic light emitting display device of FIG. 11. FIGS. 13 to 15 are layout diagrams illustrating an area "B" of FIG. 12. FIG. 16 is a sectional view taken along a line I-I' of the organic light emitting display device of FIG. 12. For convenience of description, FIGS. 13 to 15 and 16 will be described prior to FIG. 12. For example, the area "B" may correspond to one sub-pixel circuit area 50 of the sub-pixel circuit areas 50 of FIG. 1.

Referring to FIGS. 13 and 16, the organic light emitting display device 100 may include a substrate 150, an active pattern 1100, a gate insulating layer 1160, a first gate electrode 1105, a first gate wiring 1110, a second gate wiring 1115, a third gate wiring 1120, and the like.

The substrate 150 may include a transparent or opaque material. For example, the substrate 150 may include a quartz substrate, a synthetic quartz substrate, a calcium fluoride substrate, a fluorine-doped (F-doped) quartz substrate, a soda-lime glass substrate, a non-alkali glass substrate, and the like. The substrate 150 may have a sub-pixel circuit area 50. Alternatively, the substrate 150 may be formed of a transparent resin substrate having flexibility. An example of the transparent resin substrate that can be used for the substrate 150 may include a polyimide substrate. In this case, the polyimide substrate may be composed of a first polyimide layer, a barrier film layer, a second polyimide layer, and the like. For example, the polyimide substrate may be configured such that the first polyimide layer, the barrier film layer, and the second polyimide layer are laminated on a hard glass substrate. After the insulating layer (such as the buffer layer) is disposed on the second polyimide layer of the polyimide substrate, a sub-pixel circuit and an organic light emitting diode (e.g., an upper structure) may be disposed on the insulating layer. After the upper structure is provided, the hard glass substrate may be removed. In other words, since the polyimide substrate is thin and flexible, it may be difficult to directly provide the upper structure on the polyimide substrate. Considering the above difficulty, the polyimide substrate may be used as the substrate 150 by using the hard glass substrate to form the upper structure and then removing the glass substrate.

A buffer layer (not shown) may be disposed on the substrate 150. The buffer layer may be disposed over the whole of the substrate 150. The buffer layer may prevent metal atoms or impurities from diffusing to the transistors and the organic light emitting diode (e.g., a sub-pixel structure 1200), and may adjust the rate of heat transfer during a crystallization process for forming the active pattern 1100 so as to obtain a substantially uniform active pattern 1100. In addition, when a surface of the substrate 150 is not uniform, the buffer layer may serve to improve the flatness of the surface of the substrate 150. Depending on the type of substrate 150, at least two buffer layers may be provided on the substrate 150 or the buffer layer may not be disposed. For example, the buffer layer may include an organic material or an inorganic material.

The active pattern 1100 may be disposed on the substrate 150. The active pattern 1100 may include an oxide semiconductor, an inorganic semiconductor (such as amorphous silicon and poly silicon), an organic semiconductor, or the like.

The active pattern 1100 may include first to tenth areas (a, b, c, d, e, f, g, h, i, j; for example, the area in which the first gate electrode 1105, the first gate wiring 1110, the second gate wiring 1115 and the third gate wiring 1120 do not overlap the active pattern 1100). In the step of forming a contact hole described below, the first to tenth areas a, b, c, d, e, f, g, h, i, and j may be doped with ions, and may have a relatively high electrical conductivity. Boron (B) ions or phosphorus (P) ions may be used as the ions. The first to tenth areas a, b, c, d, e, f, g, h, i, and j serve to display areas for constituting the source electrode or drain electrode of the first to seventh transistors TR1, TR2, TR3_1, TR3_2, TR4_1, TR4_2, TR5, TR6, and TR7, and may not have a boundary clearly distinguished between areas, and may be electrically connected to each other. In exemplary embodiments, the first transistor TR1 may correspond to a driving transistor, and the second to seventh transistors TR2, TR3_1, TR3_2, TR4_1, TR4_2, TR5, TR6, and TR7 may correspond to switching transistors.

The gate insulating layer 1160 may be disposed on the active pattern 1100. The gate insulating layer 1160 may cover the active pattern 1100 on the substrate 150, and may be disposed over the whole of the substrate 150. For example, the gate insulating layer 1160 may sufficiently cover the active pattern 1100 on the substrate 150, and may have a substantially flat top surface without generating a step around the active pattern 1100. Alternatively, the gate insulating layer 1160 may cover the active pattern 1100 on the substrate 150, and be disposed to have a uniform thickness along a profile of the active pattern 1100. The gate insulating layer 1160 may include a silicon compounds, metal oxides, and the like. For example, the gate insulating layer 1160 may include silicon oxide (SiOx), silicon nitride (SiNx), silicon oxynitride (SiOxNy), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like.

The first gate electrode 1105, the first gate wiring 1110, the second gate wiring 1115, and the third gate wiring 1120 may be disposed on the gate insulating layer 1160. In other words, the first gate electrode 1105, the first gate wiring 1110, the second gate wiring 1115, and the third gate wiring 1120 may be disposed on the same layer. Each of the first gate electrode 1105, the first gate wiring 1110, the second gate wiring 1115, and the third gate wiring 1120 may include a metal, an alloy, a metal nitride, a conductive metal oxide, a transparent conductive material, and the like. For example, each of the first gate electrode 1105, the first gate wiring 1110, the second gate wiring 1115, and the third gate wiring 1120 may include gold (Au), silver (Ag), aluminum (Al), platinum (Pt), nickel (Ni), titanium (Ti), tungsten (W), palladium (Pd), magnesium (Mg), calcium (Ca), lithium (Li), chromium (Cr), tantalum (Ta), molybdenum (Mo), scandium (Sc), neodymium (Nd), iridium (Ir), an alloy containing aluminum, aluminum nitride (AlNx), an alloy containing silver, tungsten nitride (WNx), an alloy containing copper, an alloy containing molybdenum, titanium nitride (TiNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. These may be used individually or in combination. The first gate electrode 1105, the first gate wiring 1110, the second gate wiring 1115, and the third gate wiring 1120 may be simultaneously formed using the same material. Alternatively, each of the first gate electrode 1105, the first gate wiring 1110, the second gate wiring 1115, and the third gate wiring 1120 may be configured as a multi-layer structure including a plurality of layers.

The first gate electrode 1105 may constitute the first transistor TR1 together with a first area a and a second area b. In exemplary embodiments, the first area a may be a source area, and the second area b may be a drain area. Alternatively, the first area a may be a drain area, and the second area b may be a source area. The first area a and the second area b may be doped with ions. On the contrary, the area positioned under the first gate electrode 1105 in the active pattern 1100 may not be doped with ions. For example, the first area a and the second area b may be operated as conductors. Accordingly, the first transistor TR1 may generate the driving current ID of FIG. 5 supplied to the sub-pixel structure 1200 (e.g., corresponding to the organic light emitting diode OLED of FIG. 5), and the sub-pixel structure 1200 may output light based on the driving current ID.

The first gate wiring 1110 may include a gate extension part extending on the active pattern 1100 and the gate insulating layer 1160 in the second direction D2, and a gate protrusion part protruding from the gate extension part in the first direction D1. The gate protrusion part may constitute the third transistor TR3_1 together with the fourth area d and the fifth area e. For example, the gate protrusion part may function as a gate electrode of the third transistor TR3_1. A first portion of the gate extension part may constitute the third transistor TR3_2 together with the second area b and the fifth area e, and a second portion of the gate extension part may constitute the second transistor TR2 together with the first area a and the third area c. The third transistor TR3_1 and the third transistor TR3_2 may be connected in series and may be operated as a dual gate transistor. For example, when the dual gate transistor is turned off, a leakage current may be reduced. Accordingly, the third transistor TR3_1 and the third transistor TR3_2 may be electrically connected to each other through the fifth area e. In addition, the first transistor TR1, the second transistor TR2, and the fifth transistor TR5 may be electrically connected to each other through the first area a, and the first transistor TR1, the third transistor TR3_2, and the sixth transistor TR6 may be electrically connected to each other through the second area b.

The first area a, the second area b, the third area c, the fourth area d, and the fifth area e may be doped with ions. On the contrary, areas positioned under the first gate wiring 1110 in the active pattern 1100 may not be doped with ions. Accordingly, the first area a, the second area b, the third area c, the fourth area d, and the fifth area e may be operated as conductors, and areas positioned under the first gate wiring 1110 in the active pattern 1100 may be operated as a channel of the second transistor TR2 and channels of the third transistors TR3_1 and TR3_2, respectively. In exemplary embodiments, the first gate wiring 1110 may be supplied with the scan signal GW of FIG. 5.

In exemplary embodiments, each of the third area c of the second transistor TR2, the fourth area d of the third transistor TR3_1, and the fifth area e of the third transistor TR32 may be a source area, and each of the first area a of the second transistor TR2, the fifth area e of the third transistor TR3_1, and the second area b of the third transistor TR3_2 may be a drain area. Alternatively, each of the third area c of the second transistor TR2, the fourth area d of the third transistor TR3_1, and the fifth area e of the third transistor TR3_2 may be a drain area, and each of the first area a of the second transistor TR2, the fifth area e of the third transistor TR3_1, and the second area b of the third transistor TR3_2 may be a source area.

The second gate wiring 1115 may extend in the second direction D2 on the active pattern 1100 and the gate insulating layer 1160. The second gate wiring 1115 may constitute the seventh transistor TR7 together with the sixth area f and the tenth area j, may constitute the fourth transistor TR4_2 together with the sixth area f and the seventh area g, and may constitute the fourth transistor TR4_1 together with the seventh area g and the fourth area d. The fourth transistor TR4_1 and the fourth transistor TR4_2 may be connected in series and may be operated as a dual gate transistor. For example, when the dual gate transistor is turned off, a leakage current may be reduced. Accordingly, the fourth transistor TR4_1 and the fourth transistor TR4_2 may be electrically connected to each other through the seventh area g. In addition, the seventh transistor TR7 and the fourth transistor TR4_2 may be electrically connected to each other through the sixth area f, and the tenth area j may be electrically connected to the ninth area i of the active pattern 1100 disposed in the sub-pixel circuit area 50 adjacent in the first direction D1.

The fourth area d, the sixth area f, the seventh area g, and the tenth area j may be doped with ions. On the contrary, areas positioned under the second gate wiring 1115 in the active pattern 1100 may not be doped with ions. Accordingly, the fourth area d, the sixth area f, the seventh area g, and the tenth area j may be operated as conductors, and areas positioned under the second gate wiring 1115 in the active pattern 1100 may be operated as a channel of the fourth transistor TR4_1, a channel of the fourth transistor TR4_2, and a channel of the seventh transistor TR7, respectively. In exemplary embodiments, the second gate wiring 1115 may be supplied with the data initialization signal GI of FIG. 5, and the sixth area f may be supplied with the initialization voltage VINT of FIG. 5.

In exemplary embodiments, each of the tenth area j of the seventh transistor TR7, the sixth area f of the fourth transistor TR4_2, and the seventh area g of the fourth transistor TR4_1 may be a source area, and each of the sixth area f of the seventh transistor TR7, the seventh area g of the fourth transistor TR4_2, and the fourth area d of the fourth transistor TR4_1 may be a drain area. Alternatively, each of the tenth area j of the seventh transistor TR7, the sixth area f of the fourth transistor TR4_2, and the seventh area g of the fourth transistor TR4_1 may be a drain area, and each of the sixth area f of the seventh transistor TR7, the seventh area g of the fourth transistor TR4_2, and the fourth area d of the fourth transistor TR4_1 may be a source area.

The third gate wiring 1120 may constitute the fifth transistor TR5 together with the first area a and the eighth area h, and may constitute the sixth transistor TR6 together with the second area b and the ninth area i. The first area a, the second area b, the eighth area h, and the ninth area i may be doped with ions. On the contrary, areas positioned under the third gate wiring 1120 in the active pattern 1100 may not be doped with ions. Accordingly, the first area a, the second area b, the eighth area h, and the ninth area i may be operated as conductors, and areas positioned under the third gate wiring 1120 in the active pattern 1100 may be operated as a channel of the fifth transistor TR5, a channel of the sixth transistor TR6, respectively. In exemplary embodiments, the third gate wiring 1120 may be supplied with the emission control signal EM of FIG. 5.

In exemplary embodiments, each of the eighth area h of the fifth transistor TR5 and the ninth area i of the sixth transistor TR6 may be a source area, and each of the first area a of the fifth transistor TR5 and the second area b of the sixth transistor TR6 may be a drain area. Alternatively, each of the eighth area h of the fifth transistor TR5 and the ninth area i of the sixth transistor TR6 may be a drain area, and each of the first area a of the fifth transistor TR5 and the second area b of the sixth transistor TR6 may be a source area.

Referring to FIGS. 14 and 16, the organic light emitting display device 100 may further include a first interlayer insulating layer 1190, a second gate electrode 1130, a conductive pattern 1150, and an initialization voltage wiring 1140.

The first interlayer insulating layer 1190 may be disposed on the first gate electrode 1105, the first gate wiring 1110, the second gate wiring 1115, and the third gate wiring 1120. The first interlayer insulating layer 1190 may cover the first gate electrode 1105, the first gate wiring 1110, the second gate wiring 1115, and the third gate wiring 1120 on the gate insulating layer 1160, and may be disposed over the whole of the gate insulating layer 1160. For example, the first interlayer insulating layer 1190 may sufficiently cover the first gate electrode 1105, the first gate wiring 1110, the second gate wiring 1115, and the third gate wiring 1120 on the gate insulating layer 1160, and may have a substantially flat top surface without generating a step around the first gate electrode 1105, the first gate wiring 1110, the second gate wiring 1115, and the third gate wiring 1120. Alternatively, the first interlayer insulating layer 1190 may cover the first gate electrode 1105, the first gate wiring 1110, the second gate wiring 1115, and the third gate wiring 1120 on the gate insulating layer 1160, and may be disposed to have a uniform thickness along profiles of the first gate electrode 1105, the first gate wiring 1110, the second gate wiring 1115, and the third gate wiring 1120. The first interlayer insulating layer 1190 may include a silicon compounds, metal oxides, and the like.

The second gate electrode 1130, the conductive pattern 1150, and the initialization voltage wiring 1140 may be disposed on the first interlayer insulating layer 1190. In other words, the second gate electrode 1130, the conductive pattern 1150, and the initialization voltage wiring 1140 may be disposed on the same layer. Each of the second gate electrode 1130, the conductive pattern 1150, and the initialization voltage wiring 1140 may include a metal, an alloy, a metal nitride, a conductive metal oxide, a transparent conductive material, and the like. These may be used individually or in combination. The second gate electrode 1130, the conductive pattern 1150, and the initialization voltage wiring 1140 may be simultaneously formed using the same material. Alternatively, each of the second gate electrode 1130, the conductive pattern 1150, and the initialization voltage wiring 1140 may be configured as a multi-layer structure including a plurality of layers.

The second gate electrode 1130 may extend in the second direction D2 on the first interlayer insulating layer 1190. The second gate electrode 1130 may overlap the first gate electrode 1105. Accordingly, the second gate electrode 1130 may constitute the storage capacitor CST of FIG. 5 together with the first gate electrode 1105. The second gate electrode 1130 may be supplied with the high power voltage ELVDD of FIG. 5. In addition, the second gate electrode 1130 may have an opening that exposes a portion of the first gate electrode 1105. The first gate electrode 1105 may be supplied with the initialization voltage VINT of FIG. 5 through a first connection pattern 1230 described later via the opening.

The initialization voltage wiring 1140 may extend in the second direction D2 on the first interlayer insulating layer 1190. The initialization voltage wiring 1140 may overlap the tenth area j, and may provide the initialization voltage VINT to the sixth area f through a second connection pattern 1430 described below.

The conductive pattern 1150 may be disposed to overlap at least portions of the fourth area d and the third area c. For example, the conductive pattern 1150 may overlap the fourth area d of the sub-pixel circuit area 50 and the third area c of the sub-pixel circuit area 50 positioned adjacent in the second direction D2. In other words, when viewed from the top view of the organic light emitting display device 100, the conductive pattern 1150 may be interposed between the first gate wiring 1110 and the second gate wiring 1115 and extend in the second direction D2, and the conductive pattern 1150 may not overlap the first gate wiring 1110 and the second gate wiring 1115. Accordingly, the conductive pattern 1150 may constitute parasitic capacitors together with at least a portion of the fourth area d and at least a portion of the third area c. In addition, the conductive pattern 1150 may be disposed to overlap at least a portion of the fifth area e. In other words, the conductive pattern 1150 may be disposed to overlap at least portions of the third area c, the fourth area d, and the fifth area e. The conductive pattern 1150 may be supplied with the high power voltage ELVDD of FIG. 5 through the high power voltage wiring 1290 described later.

Referring to FIGS. 15 and 16, the organic light emitting display device 100 may further include a second interlayer insulating layer 1195, a high power voltage wiring 1290, a data wiring 1191, a first connection pattern 1230, a second connection pattern 1430 and a third connection pattern 1390, a first planarization layer 1270, and the like.

The second interlayer insulating layer 1195 may be disposed on the second gate electrode 1130, the conductive pattern 1150, and the initialization voltage wiring 1140. The second interlayer insulating layer 1195 may cover the second gate electrode 1130, the conductive pattern 1150, and the initialization voltage wiring 1140 on the first interlayer insulating layer 1190, and may be disposed over the whole of the first interlayer insulating layer 1190. For example, the second interlayer insulating layer 1195 may sufficiently cover the second gate electrode 1130, the conductive pattern 1150, and the initialization voltage wiring 1140 on the first interlayer insulating layer 1190, and may have a substantially flat top surface without generating a step around the second gate electrode 1130, the conductive pattern 1150, and the initialization voltage wiring 1140. Alternatively, the second interlayer insulating layer 1195 may cover the second gate electrode 1130, the conductive pattern 1150, and the initialization voltage wiring 1140 on the first interlayer insulating layer 1190, and may be disposed to have a uniform thickness along profiles of the second gate electrode 1130 and the initialization voltage wiring 1140. The second interlayer insulating layer 1195 may include a silicon compounds, metal oxides, and the like.

The high power voltage wiring 1290, the data wiring 1191, the first connection pattern 1230, the second connection pattern 1430, and the third connection pattern 1390 may be disposed on the second interlayer insulating layer 1195. In other words, the high power voltage wiring 1290, the data wiring 1191, the first connection pattern 1230, the second connection pattern 1430, and the third connection pattern 1390 may be disposed on the same layer. Each of the high power voltage wiring 1290, the data wiring 1191, the first connection pattern 1230, the second connection pattern 1430, and the third connection pattern 1390 may include a metal, an alloy, a metal nitride, a conductive metal oxide, a transparent conductive material, and the like. These may be used individually or in combination. The high power voltage wiring 1290, the data wiring 1191, the first connection pattern 1230, the second connection pattern 1430, and the third connection pattern 1390 may be simultaneously formed using the same material. Alternatively, each of the high power voltage wiring 1290, the data wiring 1191, the first connection pattern 1230, the second connection pattern 1430, and the third connection pattern 1390 may be configured as a multi-layer structure including a plurality of layers.

The data wiring 1191 may extend in the first direction D1 on the second interlayer insulating layer 1195, and may be connected to the third area c of the active pattern 1100 through a contact hole 1210. The data wiring 1191 may be supplied with the data signal DATA of FIG. 5. Accordingly, the data wiring 1191 may supply the data signal DATA to the third area c of the active pattern 1100 through the contact hole 1210. The voltage level of the data signal DATA may be changed to represent a gray scale.

The high power voltage wiring 1290 may extend in the first direction D1 on the second interlayer insulating layer 1195 while being spaced apart from the data wiring 1191, may be connected to the eighth area h of the active pattern 1100 through a contact hole 1355, and may be connected to the second gate electrode 1130 through a contact hole 1360. The high power voltage wiring 1290 may be supplied with the high power voltage ELVDD of FIG. 5. Accordingly, the high power voltage wiring 1290 may supply the high power voltage ELVDD to the eighth area h of the active pattern 1100 through the contact hole 1355 and the second gate electrode 1130 through the contact hole 1360.

The first connection pattern 1230 may extend in the first direction D1 on the second interlayer insulating layer 1195, and may overlap a portion of the fourth area d of the active pattern 1100 and a portion of the first gate electrode 1105 exposed through the opening of the second gate electrode. The first connection pattern 1230 may be connected to the fourth area d of the active pattern 1100 through a contact hole 1250, and may be connected to the first gate electrode 1105 through a contact hole 1271. The fourth area d of the active pattern 1100 may be supplied with the initialization voltage VINT, and the initialization voltage VINT may be applied to the first gate electrode 1105 through the first connection pattern 1230.

The second connection pattern 1430 may be disposed to overlap a portion of the initialization voltage wiring 1140 and a portion of the sixth area f of the active pattern 1100 on the second interlayer insulating layer 1195. The second connection pattern 1430 may be connected to the initialization voltage wiring 1140 through a contact hole 1475, and may be connected to the sixth area f of the active pattern 1100 through a contact hole 1470. The initialization voltage VINT may be supplied to the sixth area f of the active pattern 1100 through the second connection pattern 1430.

The third connection pattern 1390 may be disposed to overlap the ninth area i of the active pattern 1100 on the second interlayer insulating layer 1195. The third connection pattern 1390 may be connected to the ninth area i of the active pattern 1100 through a contact hole 1410, may be electrically connected to a lower electrode 1291, and may supply the driving current to the lower electrode 1291.

The first planarization layer 1270 may be disposed on the second interlayer insulating layer 1195, the high power voltage wiring 1290, the data wiring 1191, the first connection pattern 1230, the second connection pattern 1430, and the third connection pattern 1390. The first planarization layer 1270 may have a contact hole that exposes a portion of the third connection pattern 1390 connected to the sixth transistor TR6. The first planarization layer 1270 may be disposed to have a relatively thick thickness to sufficiently cover the high power voltage wiring 1290, the data wiring 1191, the first connection pattern 1230, the second connection pattern 1430, and the third connection pattern 1390 on the second interlayer insulating layer 1195. In this case, the first planarization layer 1270 may have a substantially flat top surface, and a planarization process may be added to the first planarization layer 1270 to implement the above flat top surface of the first planarization layer 1270. The first planarization layer 1270 may include an organic material or an inorganic material. In exemplary embodiments, the first planarization layer 1270 may include an organic material. For example, the first planarization layer 1270 may include photoresist, polyacryl-based resin, polyimide-based resin, polyamide-based resin, siloxane-based resin, acryl-based resin, epoxy-based resin, and the like.

Referring to FIGS. 12 and 16, the organic light emitting display device 100 may further include a first right fan-out wiring 401, a connection electrode 1395, a first horizontal dummy patterns 701, a second planarization layer 1275, a pixel defining layer 1310, a sub-pixel structure 1200, an encapsulation substrate 1450, and the like. The sub-pixel structure 1200 may further include a lower electrode 1291, a light emitting layer 1330, and an upper electrode 1340.

The first right fan-out wiring 401, the connection electrode 1395, and the first horizontal dummy patterns 701 may be disposed on the first planarization layer 1270. In other words, the first right fan-out wiring 401, the connection electrode 1395, and the first horizontal dummy patterns 701 may be disposed on the same layer. Each of the first right fan-out wiring 401, the connection electrode 1395, and the first horizontal dummy patterns 701 may include a metal, an alloy, a metal nitride, a conductive metal oxide, a transparent conductive material, and the like. These may be used individually or in combination. The first right fan-out wiring 401, the connection electrode 1395, and the first horizontal dummy patterns 701 may be simultaneously formed using the same material. Alternatively, each of the first right fan-out wiring 401, the connection electrode 1395, and the first horizontal dummy patterns 701 may be configured as a multi-layer structure including a plurality of layers.

When viewed from the top view of the organic light emitting display device 100, the first right fan-out wiring 401 may include a vertical extension part extending in the first direction D1 and a horizontal extension part extending in the second direction D2 on the first planarization layer 1270. In exemplary embodiments, the high power voltage wiring 1290 may be positioned under the vertical extension part, and a portion of the first right fan-out wiring 401 (e.g., the vertical extension part) may overlap the high power voltage wiring 1290. The first right fan-out wiring 401 may be supplied with the data signal DATA of FIG. 5, and may transmit the data signal DATA to the fourth right signal wiring 524.

When viewed from the top view of the organic light emitting display device 100, the first horizontal dummy patterns 701 may be spaced apart from the horizontal extension part of the first right fan-out wiring 401 in the third direction D3 on the first planarization layer 1270 so as to be disposed substantially parallel to the horizontal extension part. The first horizontal dummy patterns 701 may be spaced apart from each other and arranged in the third direction D3. In other exemplary embodiments, at least two adjacent first horizontal dummy patterns among the first horizontal dummy patterns 701 may be integrally formed with each other.

The connection electrode 1395 may be disposed on a portion of the first planarization layer 1270 below which the third connection pattern 1390 is positioned. The connection electrode 1395 may be connected to the third connection pattern 1390 through a contact hole formed by removing a portion of the first planarization layer 1270, and may electrically connect the lower electrode 1291 and the third connection pattern 1390.

The second planarization layer 1275 may be disposed on the first right fan-out wiring 401, the connection electrode 1395, and the first horizontal dummy patterns 701. The second planarization layer 1275 may have a contact hole that exposes a portion of the connection electrode 1395. The second planarization layer 1275 may be disposed to have a relatively thick thickness to sufficiently cover the first right fan-out wiring 401, the connection electrode 1395, and the first horizontal dummy patterns 701 on the first planarization layer 1270. In this case, the second planarization layer 1275 may have a substantially flat top surface, and a planarization process may be added to the second planarization layer 1275 to implement the above flat top surface of the second planarization layer 1275. The second planarization layer 1275 may include an organic material or an inorganic material. In exemplary embodiments, the second planarization layer 1275 may include an organic material.

The lower electrode 1291 may be disposed on the second planarization layer 1275. The lower electrode 1291 may come into direct contact with the connection electrode 1395 through the contact hole of the second planarization layer 1275, and may be electrically connected to the sixth transistor TR6 through the connection electrode 1395. Accordingly, the lower electrode 1291 may be supplied with the driving current ID of FIG. 5 through the connection electrode 1395. In exemplary embodiments, the lower electrode 1291 may be an anode electrode. Alternatively, the lower electrode 1291 may be a cathode electrode. The lower electrode 1291 may include a metal, an alloy, a metal nitride, a conductive metal oxide, a transparent conductive material, and the like. These may be used individually or in combination. The lower electrode 1291 may have a multi-layer structure including a plurality of layers.

The pixel defining layer 1310 may be disposed on a portion of the lower electrode 1291 and on the second planarization layer 1275. The pixel defining layer 1310 may cover both sides of the lower electrode 1291, and may have an opening that exposes a portion of an upper surface of the lower electrode 1291. The pixel defining layer 1310 may be formed of an organic material or an inorganic material. In exemplary embodiments, the pixel defining layer 1310 may include an organic material.

The light emitting layer 1330 may be disposed on the lower electrode 1291 exposed by the pixel defining layer 1310. The light emitting layer 1330 may be formed using at least one of light emitting materials capable of emitting color lights (such as red light, green light, and blue light) that are different according to sub-pixels. In contrast, the light emitting layer 1330 may be formed by laminating a plurality of light emitting materials capable of generating different color light such as red light, green light and blue light, such that white light may be emitted as a whole. In this case, a color filter may be disposed on the light emitting layer 1330 (e.g., disposed to overlap the light emitting layer 1330 on an upper surface of an encapsulation substrate 1450). The color filter may include at least one of a red color filter, a green color filter, and a blue color filter. Alternatively, the color filter also may include a yellow color filter, a cyan color filter, and a magenta color filter. The color filter may include photosensitive resin, color photoresist, and the like.

The upper electrode 1340 may be disposed on the pixel defining layer 1310 and a light emitting layer 1330. The upper electrode 1340 may be disposed over the whole of the substrate 1450 while covering the pixel defining layer 1310 and the light emitting layer 1330. In exemplary embodiments, the upper electrode 1340 may be a cathode electrode, and may be supplied with the low power supply voltage ELVSS of FIG. 5. Alternatively, the upper electrode 1340 may be an anode electrode. The upper electrode 1340 may include a metal, an alloy, a metal nitride, a conductive metal oxide, a transparent conductive material, and the like. These may be used individually or in combination. Alternatively, the upper electrode 1340 may be configured as a multi-layer structure including a plurality of layers. Accordingly, the sub-pixel structure 1200 including the lower electrode 1291, the light emitting layer 1330, and the upper electrode 1340 may be provided.

The encapsulation substrate 1450 may be disposed on the upper electrode 1340. The encapsulation substrate 1450 may include substantially the same material as the substrate 150.

For example, the encapsulation substrate 1450 may include a quartz substrate, a synthetic quartz substrate, a quartz substrate doped with calcium fluoride or fluorine, a soda-lime glass substrate, a non-alkali glass substrate, and the like. In other exemplary embodiments, the encapsulation substrate 1450 may be formed of a transparent inorganic material or a flexible plastic. For example, the encapsulation substrate 1450 may include a transparent resin substrate having flexibility. In this case, at least one inorganic layer and at least one organic layer may be alternately laminated in order to improve the flexibility of the organic light emitting display device 100. The laminated structure may include a first inorganic layer, an organic layer, and a second inorganic layer. For example, a first inorganic layer having flexibility may be disposed along a profile of the upper electrode 1340, an organic layer having flexibility may be disposed on the first inorganic layer, and a second inorganic layer having flexibility may be disposed on the organic layer. In other words, the laminated structure may correspond to a thin film encapsulation structure coming into direct contact with the upper electrode 1340.

Figure 17:
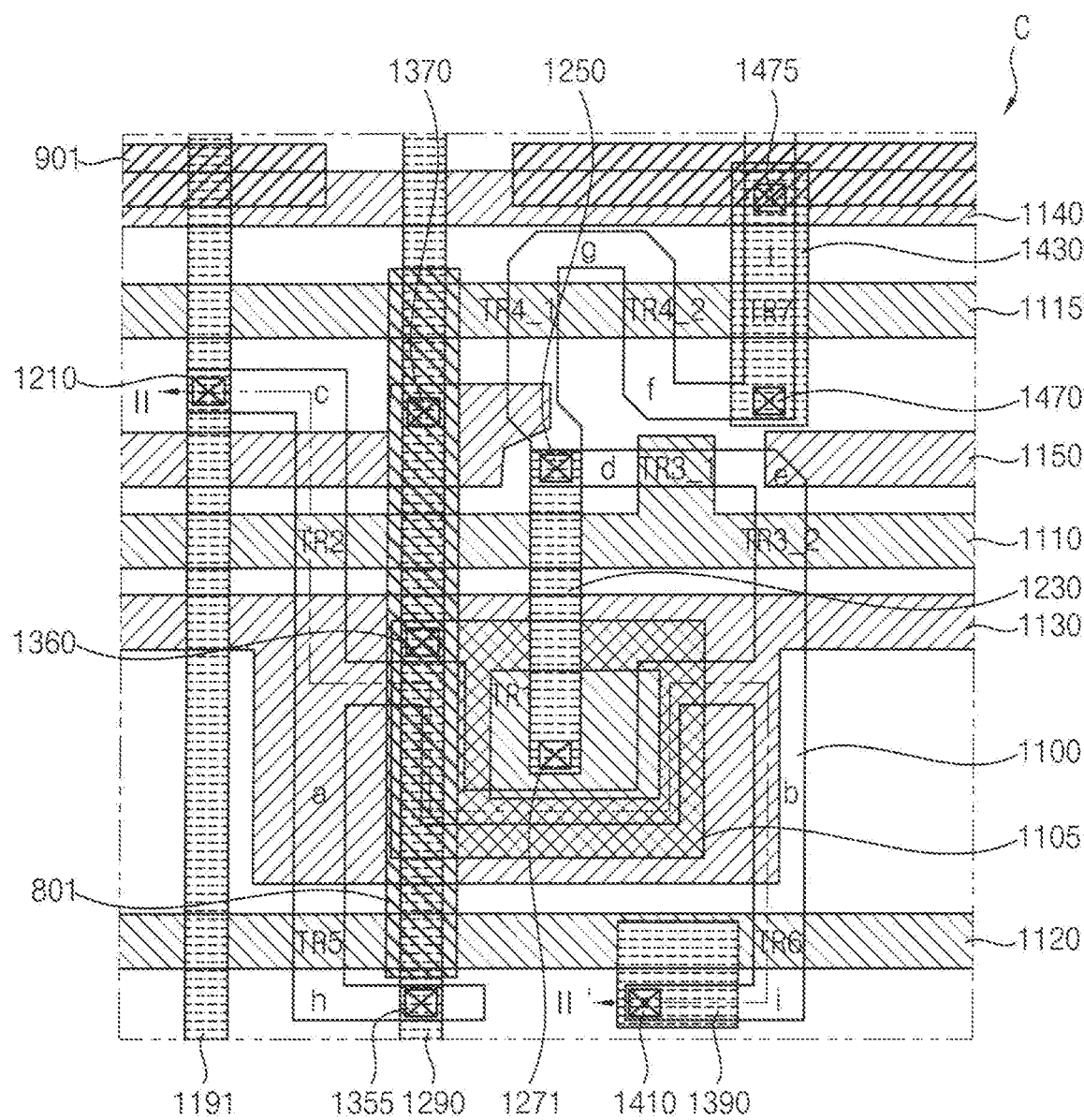
FIG. 17 is an enlarged layout diagram illustrating an area "C" of the organic light emitting display device of FIG. 11.
Figure 17:
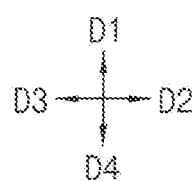
Figure 18:
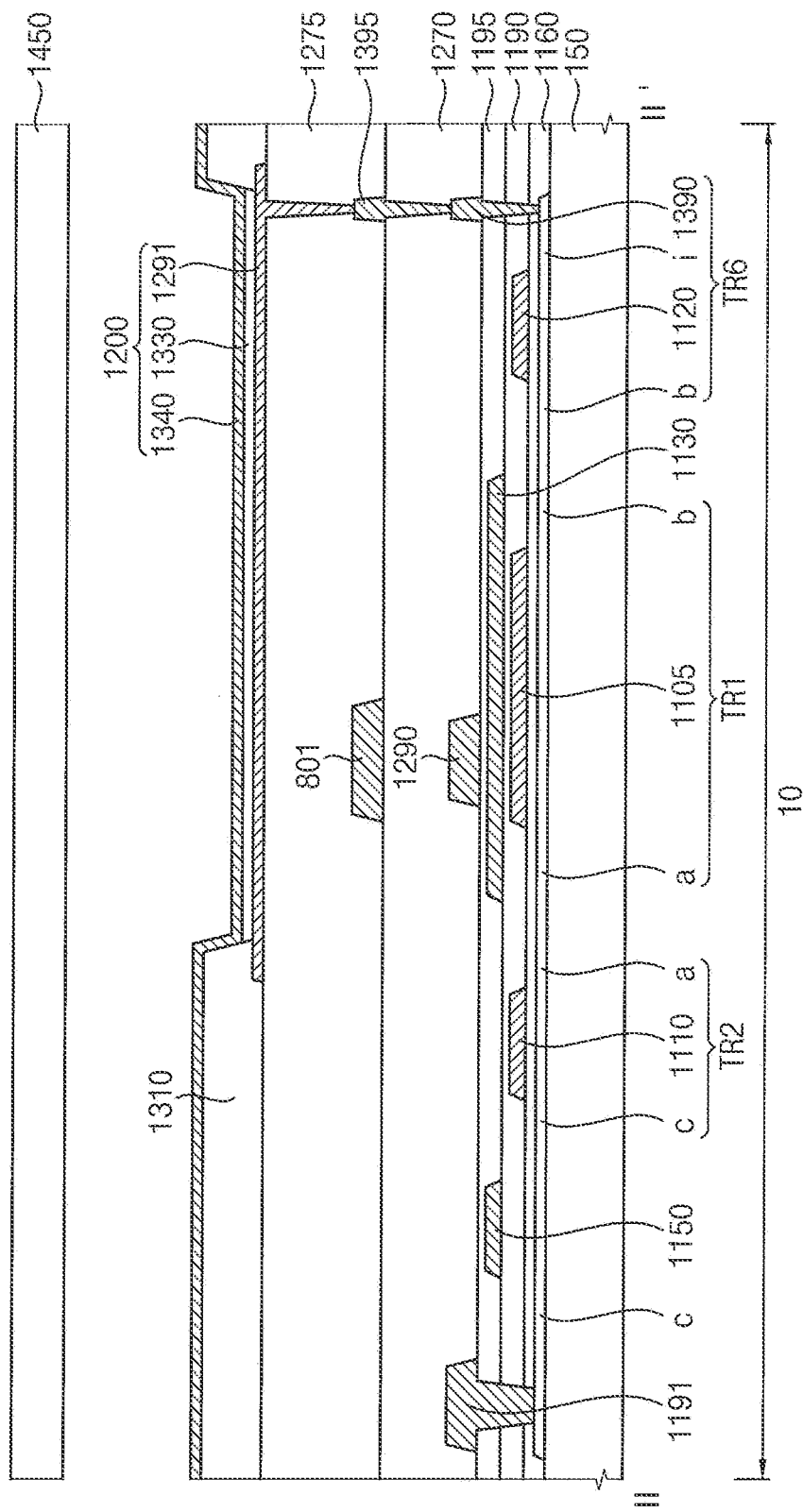
FIG. 18 is a cross-sectional view taken along a line II-II' of the organic light emitting display device of FIG. 17.

FIG. 17 is an enlarged layout diagram illustrating an area "C" of the organic light emitting display device of FIG. 11. FIG. 18 is a cross-sectional view taken along a line II-II' of the organic light emitting display device of FIG. 17.

Referring to FIGS. 11, 17 and 18, the organic light emitting display device 100 may further include sub-vertical dummy patterns 801 and sub-horizontal dummy patterns 901.

The sub-vertical dummy patterns 801 and the sub-horizontal dummy patterns 901 may be disposed on the first planarization layer 1270. In other words, the sub-vertical dummy patterns 801 and the sub-horizontal dummy patterns 901 may be disposed on the same layer. Each of the sub-vertical dummy patterns 801 and the sub-horizontal dummy patterns 901 may include a metal, an alloy, a metal nitride, a conductive metal oxide, a transparent conductive material, and the like. These may be used individually or in combination. The sub-vertical dummy patterns 801 and the sub-horizontal dummy patterns 901 may be simultaneously formed using the same material. Alternatively, each of the sub-vertical dummy patterns 801 and the sub-horizontal dummy patterns 901 may be configured as a multi-layer structure including a plurality of layers.

When viewed from the top view of the organic light emitting display device 100, the sub-vertical dummy patterns 801 may be spaced apart from the vertical extension part of the first right fan-out wiring 401 in the third direction D3 on the first planarization layer 1270 so as to be disposed substantially parallel to the vertical extension part. The sub-vertical dummy patterns 801 may be spaced apart from each other and arranged in the first direction D1. In exemplary embodiments, the high power voltage wiring 1290 may be positioned under the sub-vertical dummy patterns 801, and the sub-vertical dummy patterns 801 may overlap the high power voltage wiring 1290. Alternatively, the sub-vertical dummy patterns 801 may be electrically connected to the high power voltage wiring 1290 (or the initialization voltage wiring 1140) through a contact hole. In this case, the high power voltage ELVDD of FIG. 5 may be applied to the sub-vertical dummy patterns 801. In other exemplary embodiments, at least two adjacent sub-vertical dummy patterns among the sub-vertical dummy patterns 801 may be integrally formed with each other.

When viewed from the top view of the organic light emitting display device 100, the sub-horizontal dummy patterns 901 may be spaced apart from the horizontal extension part of the first right fan-out wiring 401 in the first direction D1 on the first planarization layer 1270 so as to be disposed substantially parallel to the horizontal extension part. The sub-horizontal dummy patterns 901 may be spaced apart from each other and arranged in the first direction D1. In other exemplary embodiments, at least two adjacent sub-horizontal dummy patterns among the sub-horizontal dummy patterns 901 may be integrally formed with each other.

Figure 19:
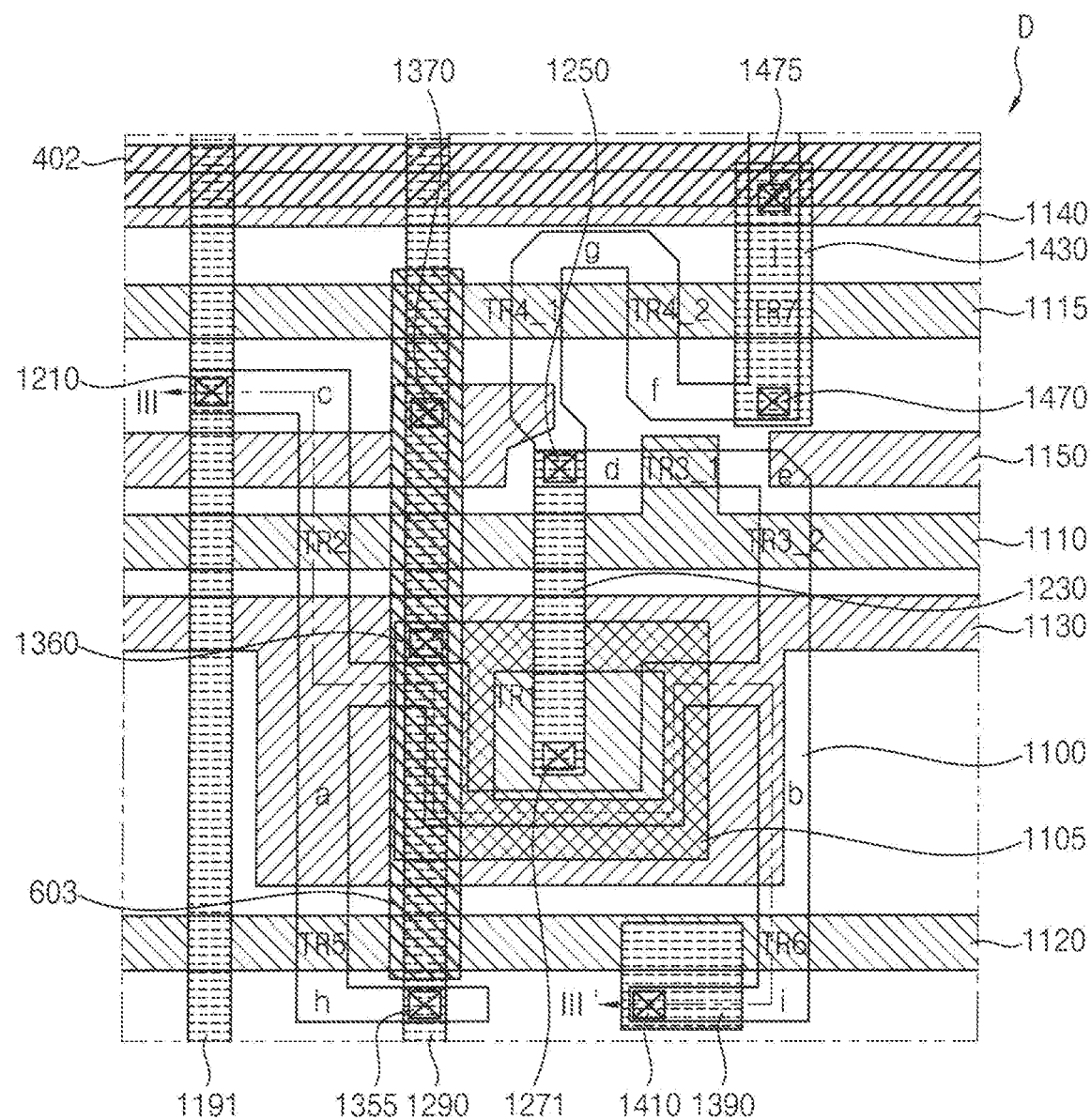
FIG. 19 is an enlarged layout diagram illustrating an area "D" of the organic light emitting display device of FIG. 11.
Figure 19:
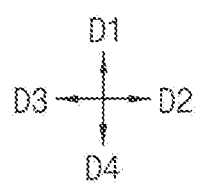
Figure 20:
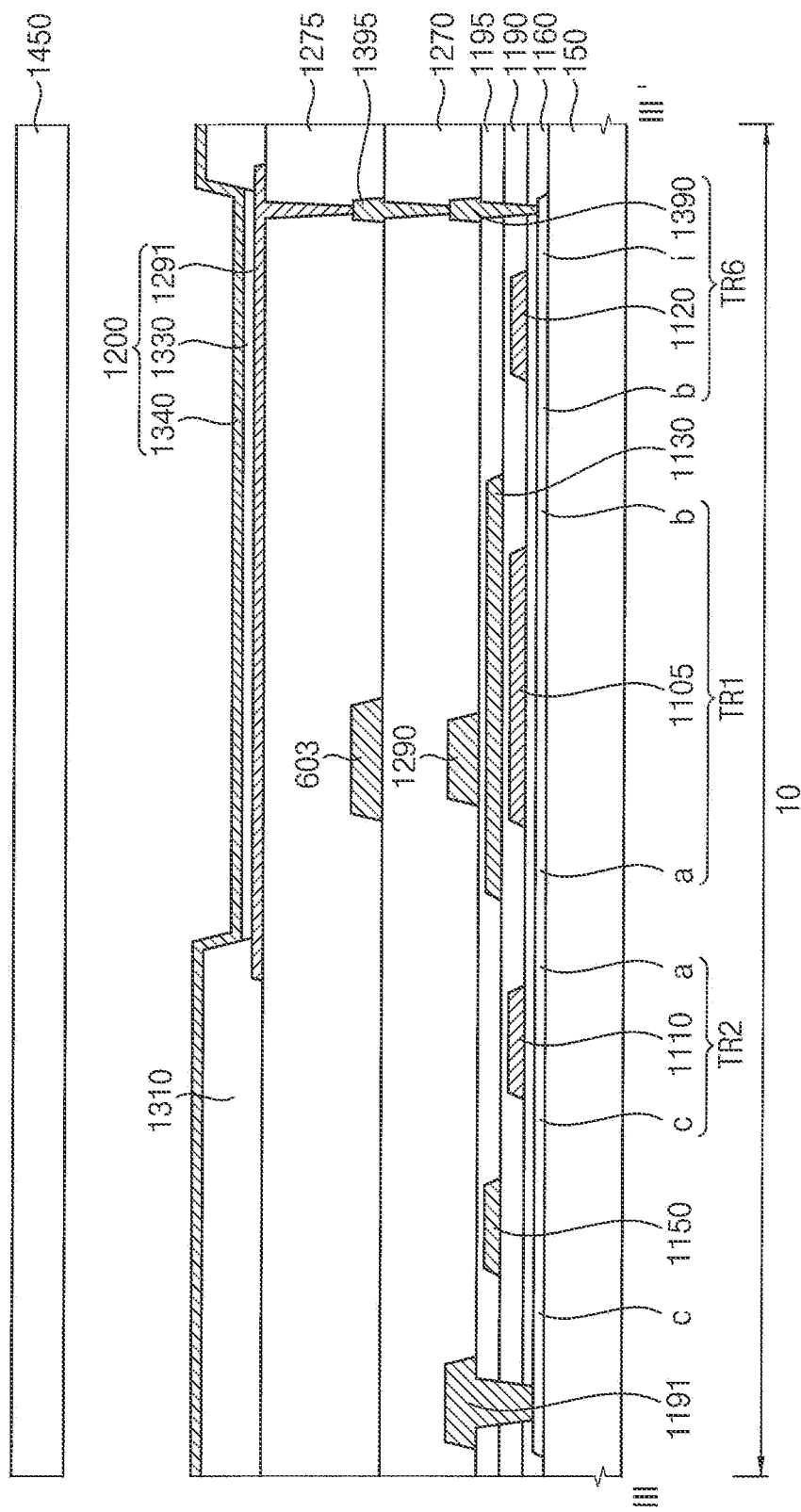
FIG. 20 is a cross-sectional view taken along a line III-III' of the organic light emitting display device of FIG. 19.

FIG. 19 is an enlarged layout diagram illustrating an area "D" of the organic light emitting display device of FIG. 11. FIG. 20 is a cross-sectional view taken along a line III-III' of the organic light emitting display device of FIG. 19.

Referring to FIGS. 11, 19 and 20, the organic light emitting display device 100 may further include the second right fan-out wiring 402 and the third vertical dummy patterns 603.

The second right fan-out wiring 402 and the third vertical dummy patterns 603 may be disposed on the first planarization layer 1270. In other words, the second right fan-out wiring 402 and the third vertical dummy patterns 603 may be disposed on the same layer. Each of the second right fan-out wiring 402 and the third vertical dummy patterns 603 may include a metal, an alloy, a metal nitride, a conductive metal oxide, a transparent conductive material, and the like. These may be used individually or in combination. The second right fan-out wiring 402 and the third vertical dummy patterns 603 may be simultaneously formed using the same material. Alternatively, each of the second right fan-out wiring 402 and the third vertical dummy patterns 603 may be configured as a multi-layer structure including a plurality of layers.

When viewed from the top view of the organic light emitting display device 100, the second right fan-out wiring 402 may include a vertical extension part extending in the first direction D1 and a horizontal extension part extending in the second direction D2 on the first planarization layer 1270. The second right fan-out wiring 402 may be supplied with the data signal DATA of FIG. 5, and may transmit the data signal DATA to the second right signal wiring 522.

When viewed from the top view of the organic light emitting display device 100, the third vertical dummy patterns 603 may be spaced apart from the vertical extension part of the third right fan-out wiring 403 in the first direction D1 on the first planarization layer 1270 so as to be disposed substantially the same as the direction in which the vertical extension part extends. The third vertical dummy patterns 603 may be spaced apart from each other and arranged in the first direction D1. In exemplary embodiments, the horizontal extension part of the second right fan-out wiring 402 and the horizontal extension part of the first right fan-out wiring 401 may be interposed between the third vertical dummy patterns 603. In addition, the high power voltage wiring 1290 may be positioned under the third vertical dummy patterns 603, and a portion of the first right fan-out wiring 401 (e.g., the vertical extension part) may overlap the high power voltage wiring 1290. Alternatively, the third vertical dummy patterns 603 may be electrically connected to the high power voltage wiring 1290 (or the initialization voltage wiring 1140) through a contact hole. In this case, the high power voltage ELVDD of FIG. 5 may be applied to the third vertical dummy patterns 603. In other exemplary embodiments, at least two adjacent third vertical dummy patterns among the third vertical dummy patterns 603 may be integrally formed with each other. Even when the third vertical dummy patterns are integrally formed with each other, the third vertical dummy patterns do not come into direct contact with the right fan-out wirings 400.

Figure 21:
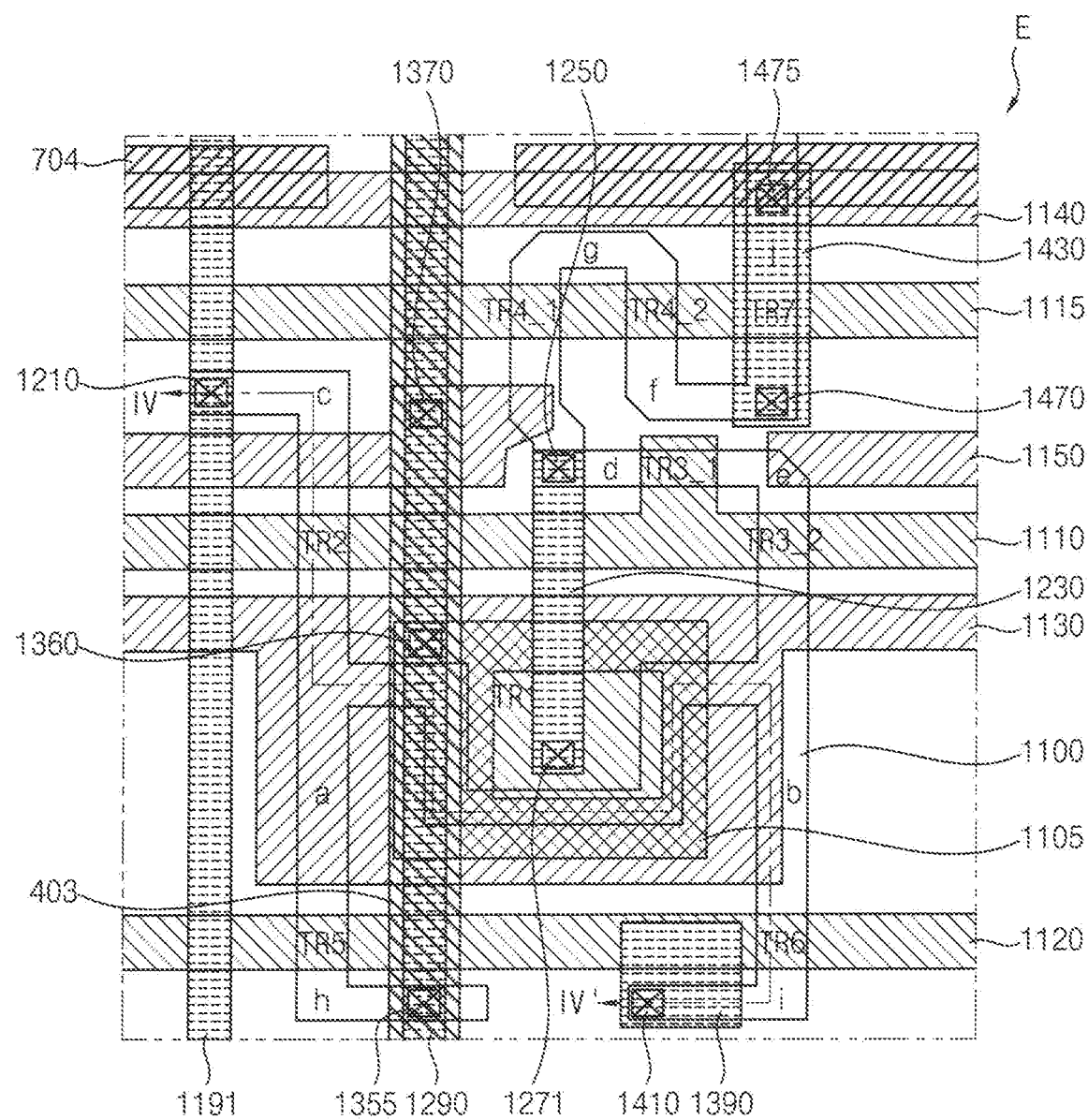
FIG. 21 is an enlarged layout diagram illustrating an area "E" of the organic light emitting display device of FIG. 11.
Figure 22:
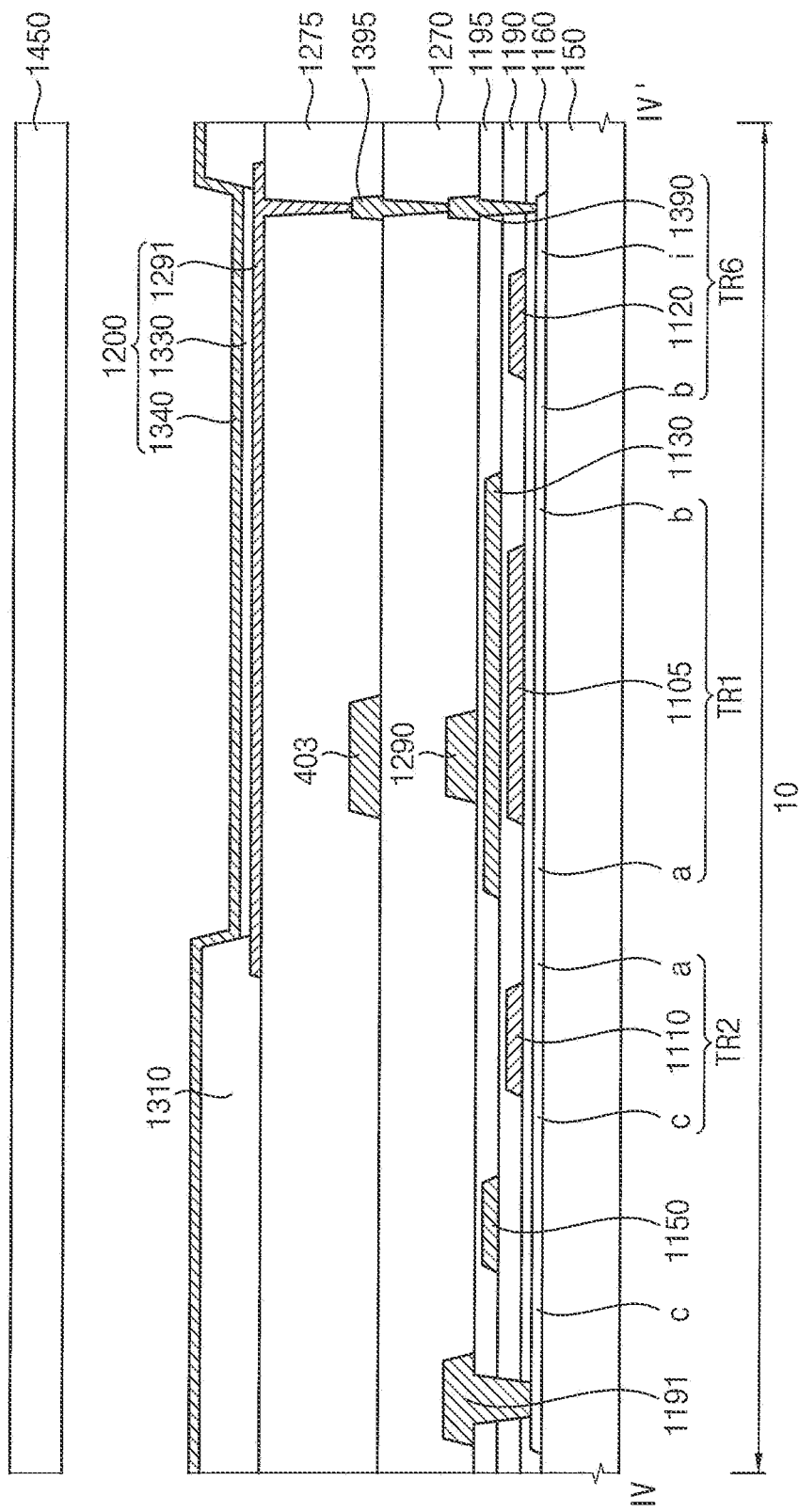
FIG. 22 is a cross-sectional view taken along a line IV-IV of the organic light emitting display device of FIG. 21.

FIG. 21 is an enlarged layout diagram illustrating an area "E" of the organic light emitting display device of FIG. 11. FIG. 22 is a cross-sectional view taken along a line IV-IV' of the organic light emitting display device of FIG. 21.

Referring to FIGS. 11, 21 and 22, the organic light emitting display device 100 may further include the third right fan-out wiring 403 and the fourth horizontal dummy patterns 704.

The third right fan-out wiring 403 and the fourth horizontal dummy patterns 704 may be disposed on the first planarization layer 1270. In other words, the third right fan-out wiring 403 and the fourth horizontal dummy patterns 704 may be disposed on the same layer. Each of the third right fan-out wiring 403 and the fourth horizontal dummy patterns 704 may include a metal, an alloy, a metal nitride, a conductive metal oxide, a transparent conductive material, and the like. These may be used individually or in combination. The third right fan-out wiring 403 and the fourth horizontal dummy patterns 704 may be simultaneously formed using the same material. Alternatively, each of the third right fan-out wiring 403 and the fourth horizontal dummy patterns 704 may be configured as a multi-layer structure including a plurality of layers.

When viewed from the top view of the organic light emitting display device 100, the third right fan-out wiring 403 may include a vertical extension part extending in the first direction D1 and a horizontal extension part extending in the second direction D2 on the first planarization layer 1270. In exemplary embodiments, the high power voltage wiring 1290 may be positioned under the vertical extension part, and a portion of the third right fan-out wiring 403 (e.g., the vertical extension part) may overlap the high power voltage wiring 1290. The third right fan-out wiring 403 may be supplied with the data signal DATA of FIG. 5, and may transmit the data signal DATA to the third right signal wiring 522.

When viewed from the top view of the organic light emitting display device 100, the fourth horizontal dummy patterns 704 may be spaced apart from the horizontal extension part of the fourth right fan-out wiring 404 in the third direction D3 on the first planarization layer 1270 so as to be disposed substantially the same as the direction in which the horizontal extension part extends. The fourth horizontal dummy patterns 704 may be spaced apart from each other and arranged in the third direction D3.

In exemplary embodiments, the vertical extension part of the first right fan-out wiring 401, the vertical extension part of the second right fan-out wiring 402, and the vertical extension part of the third right fan-out wiring 403 may be interposed between the fourth horizontal dummy patterns 704. In other exemplary embodiments, at least two adjacent fourth horizontal dummy patterns among the fourth horizontal dummy patterns 704 may be integrally formed with each other. Even when the fourth horizontal dummy patterns are integrally formed with each other, the fourth horizontal dummy patterns do not come into direct contact with the right fan-out wirings 400.

Accordingly, at least one of the vertical dummy pattern, the horizontal dummy pattern, the sub-vertical dummy pattern, and the sub-horizontal dummy pattern may be disposed in each of the sub-pixel circuit areas 50. In addition, the dummy patterns 600 may have a lattice shape in the display area 40 by the vertical dummy pattern, the horizontal dummy pattern, the sub-vertical dummy pattern, and the sub-horizontal dummy pattern in each of the sub-pixel circuit areas 50.

The organic light emitting display device 100 according to exemplary embodiments of the present invention includes the dummy patterns 600, so that the dummy patterns 600 may have a lattice pattern shape in the display area 40 together with the right fan-out wirings 400 and the left fan-out wirings 500. Accordingly, a pattern and/or a spot, which is caused by the bent parts of the right fan-out wirings 400 and the left fan-out wirings 500, may not be visually recognized in the organic light emitting display device 100. In addition, when the dummy patterns 600 are electrically connected to the high power voltage wiring 1290 through the contact hole, a wiring resistance of the high power voltage wiring 1290 may be lowered. Further, a constant voltage is applied to the dummy patterns 600, so that wirings having a varying voltage levels may be shielded.

Figure 23:
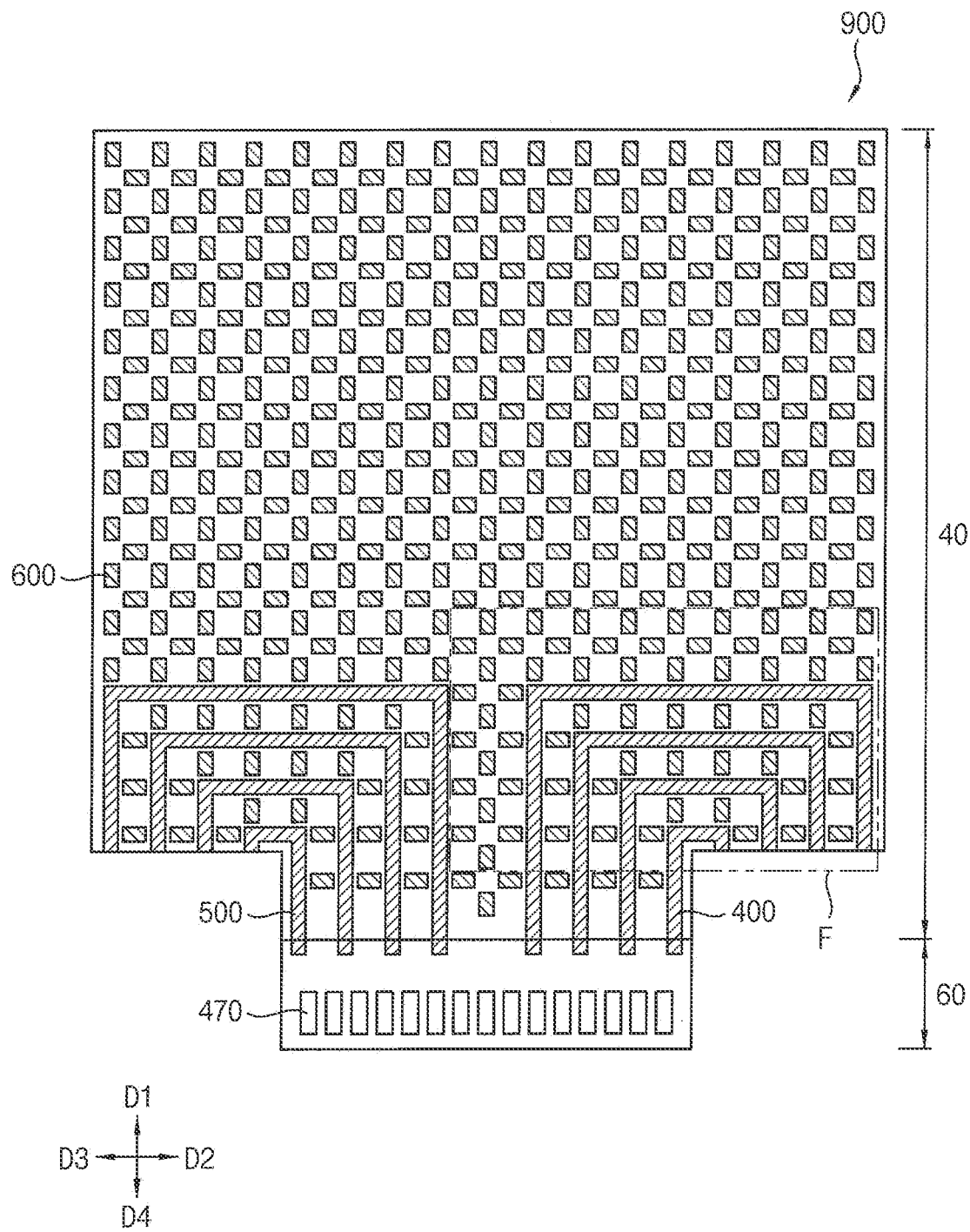
FIG. 23 is a plan view showing the organic light emitting display device according to exemplary embodiments of the present invention.

FIG. 23 is a plan view showing the organic light emitting display device according to exemplary embodiments of the present invention. FIG. 24 is an enlarged plan view illustrating an area "F" of the organic light emitting display device of FIG. 23. The organic light emitting display device 900 illustrated in FIGS. 23 and 24 may have a configuration substantially the same as or similar to the organic light emitting display device 100 described with reference to FIGS. 1 to 22, except for shapes of the right and left fan-out wirings 400 and 500. In FIGS. 23 and 24, duplicate descriptions for components substantially the same as or similar to the components described with reference to FIGS. 1 to 22 will be omitted. For example, for convenience of description, only the right fan-out wirings 400, the left fan-out wirings 500, and the dummy patterns 600 are shown in the display area 40 of FIG. 23, and only the right fan-out wirings 400 and the dummy patterns 600 are shown in the display area 40 of FIG. 24.

Referring to FIGS. 6, 23 and 24, the right fan-out wirings 400, the left fan-out wirings 500, and the dummy patterns 600 may be disposed on the center signal wirings 510, the right signal wirings 520, and the left signal wirings 530.

The right fan-out wirings 400 may be disposed in a portion of the pad area 60, in the first sub-display area 10 and in the second sub-display area 20 on the substrate, and each of the right fan-out wirings 400 may include bent parts. For example, each of the right fan-out wirings 400 may include a vertical extension part, a horizontal extension part, and a sub-vertical extension part. The vertical extension part may be disposed in a portion of the pad area 60 and in the first sub-display area 10, and may extend in the first direction D1. In addition, the horizontal extension part may extend in the second direction D2 from a first end of the vertical extension part positioned in the first sub-display area 10. For example, a second end of the vertical extension part may be positioned in the pad area 60, and the first end opposite to the second end of the vertical extension part may be connected to a first end of the horizontal extension part. A second end opposite to the first end of the horizontal extension part may be connected to the sub-vertical extension part. The sub-vertical extension part may extend in the fourth direction D4 from the second end of the horizontal extension part positioned in the second sub-display area 20. For example, a first end of the sub-vertical extension part may be connected to the second end of the horizontal extension part, and a second end opposite to the first end of the sub-vertical extension part may be connected to one of the right signal wirings 520 through a contact hole.

In exemplary embodiments, the vertical extension part may be substantially parallel to the sub-vertical extension part, and a length of the vertical extension part in the first direction D1 may be longer than a length of the sub-vertical extension part in the first direction D1. In addition, the contact holes of the right fan-out wirings 400 may be positioned at the lower end of the second sub-display area 20 (e.g., a portion adjacent to the pad area 60 in the second sub-display area 20), and the contact holes of the left fan-out wirings 500 may be positioned at the lower end of the third sub-display area 30. The organic light emitting display device 900 may further include a black matrix that covers the contact holes disposed at a lower end of each of the second sub-display area 20 and the third sub-display area 30. In this case, the contact holes may not be visually recognized by a user of the organic light emitting display device 900.

As shown in FIG. 24, the right fan-out wirings 400 may include first to fourth right fan-out wirings 401, 402, 403, and 404. The first right fan-out wiring 401 may be connected to the first right signal wiring 521 through a first contact hole 721, the second right fan-out wiring 402 may be connected to the second right signal wiring 522 through a second contact hole 722, the third right fan-out wiring 403 may be connected to the third right signal wiring 523 through a third contact hole 723, and the fourth right fan-out wiring 404 may be connected to the fourth right signal wiring 524 through a fourth contact hole 724. Sizes of the first to fourth right fan-out wirings 401, 402, 403, and 404 may be sequentially decreased.

In exemplary embodiments, in each of the right fan-out wirings 400, the bent parts may be defined by the first end of the vertical extension part and the first end of the horizontal extension part, and the second end of the horizontal extension part and the first end of the sub-vertical extension part, and the vertical extension part, the horizontal extension part, and the sub-vertical extension part may be integrally formed with each other. Alternatively, the right fan-out wirings 400 may not be disposed in the pad area 60.

The left fan-out wirings 500 may be disposed in a portion of the pad area 60, in the first sub-display area 10 and in the third sub-display area 30 on the substrate, and each of the left fan-out wirings 500 may include bent parts. For example, each of the left fan-out wirings 500 may include a vertical extension part, a horizontal extension part, and a sub-vertical extension part. The vertical extension part may be disposed in a portion of the pad area 60 and in the first sub-display area 10, and may extend in the first direction D1. In addition, the horizontal extension part may extend in the third direction D3 from a first end of the vertical extension part positioned in the first sub-display area 10. For example, a second end of the vertical extension part may be positioned in the pad area 60, and the first end opposite to the second end of the vertical extension part may be connected to a first end of the horizontal extension part. A second end opposite to the first end of the horizontal extension part may be connected to the sub-vertical extension part. The sub-vertical extension part may extend in the fourth direction D4 from the second end of the horizontal extension part positioned in the third sub-display area 30. For example, a first end of the sub-vertical extension part may be connected to the second end of the horizontal extension part, and a second end opposite to the first end of the sub-vertical extension part may be connected to one of the left signal wirings 520 through a contact hole.

For example, the left fan-out wirings 500 may include first to fourth left fan-out wirings. The first left fan-out wiring may be connected to the first left signal wiring through a fifth contact hole, the second left fan-out wiring may be connected to the second left signal wiring through a sixth contact hole, the third left fan-out wiring may be connected to the third left signal wiring through a seventh contact hole, and the fourth left fan-out wiring may be connected to the fourth left signal wiring through an eighth contact hole. Sizes of the first to fourth left fan-out wirings may be sequentially decreased.

In exemplary embodiments, in each of the left fan-out wirings 500, the bent parts may be defined by the first end of the vertical extension part and the first end of the horizontal extension part, and the second end of the horizontal extension part and the first end of the sub-vertical extension part, and the vertical extension part, the horizontal extension part, and the sub-vertical extension part may be integrally formed with each other. In addition, the right fan-out wirings 400 may be symmetrical with the left fan-out wirings 500. Alternatively, the left fan-out wirings 500 may not be disposed in the pad area 60.

The dummy patterns 600 may be spaced apart from the right fan-out wirings 400 and the left fan-out wirings 500 in the first sub-display area 10, the second sub-display area 20, and the third sub-display area 30. The dummy patterns 600 may have a lattice shape. The dummy patterns 600 may include a plurality of vertical dummy patterns, a plurality of horizontal dummy patterns, a plurality of sub-vertical dummy patterns, and a plurality of sub-horizontal dummy patterns.

The vertical dummy patterns of the dummy patterns 600 may be spaced apart from the vertical extension parts of the right fan-out wirings 400 and the left fan-out wirings 500 in the first direction D1, and may be arrayed to be spaced apart from each other in the first direction D1. The horizontal dummy patterns of the dummy patterns 600 may be spaced apart from the horizontal extension parts of the right fan-out wirings 400 in the third direction D3 and the second direction D2, and may be arrayed to be spaced apart from each other in the third direction D3 and the second direction D2. In addition, the horizontal dummy patterns of the dummy patterns 600 may be spaced apart from the horizontal extension parts of the left fan-out wirings 500 in the second direction D2 and the third direction D3, and may be arrayed to be spaced apart from each other in the second direction D2 and the third direction D3.

For example, as shown in FIG. 24, the vertical dummy patterns may include first to eighth vertical dummy patterns 601, 602, 603, 604, 605, 606, 607, and 608, and the horizontal dummy patterns may include first to fourth horizontal dummy patterns 701, 702, 703, and 704.

The first vertical dummy patterns 601 may be spaced apart from the vertical extension part of the first right fan-out wiring 401 in the first direction D1, and may be arrayed to be spaced apart from each other in the first direction D1 (e.g., a direction substantially the same as the direction in which the vertical extension part extends).

The eighth vertical dummy patterns 608 may be spaced apart from the sub-vertical extension part of the first right fan-out wiring 401 in the first direction D1, and may be arrayed to be spaced apart from each other in the first direction D1 (e.g., a direction substantially the same as the direction in which the sub-vertical extension part extends).

The second vertical dummy patterns 602 may be spaced apart from the vertical extension part of the second right fan-out wiring 402 in the first direction D1, and may be arrayed to be spaced apart from each other in the first direction D1 (e.g., a direction substantially the same as the direction in which the vertical extension part extends). The second vertical dummy patterns 602 may be spaced apart from the horizontal extension part of the first right fan-out wiring 401. In other words, the horizontal extension part of the first right fan-out wiring 401 may be interposed between the second vertical dummy patterns 602.

The seventh vertical dummy patterns 607 may be spaced apart from the sub-vertical extension part of the second right fan-out wiring 402 in the first direction D1, and may be arrayed to be spaced apart from each other in the first direction D1 (e.g., a direction substantially the same as the direction in which the sub-vertical extension part extends). The seventh vertical dummy patterns 607 may be spaced apart from the horizontal extension part of the first right fan-out wiring 401. In other words, the horizontal extension part of the first right fan-out wiring 401 may be interposed between the seventh vertical dummy patterns 607.

The third vertical dummy patterns 603 may be spaced apart from the vertical extension part of the third right fan-out wiring 403 in the first direction D1, and may be arrayed to be spaced apart from each other in the first direction D1 (e.g., a direction substantially the same as the direction in which the vertical extension part extends). The third vertical dummy patterns 603 may be spaced apart from the horizontal extension part of the first right fan-out wiring 401 and the horizontal extension part of the second right fan-out wiring 402. In other words, the horizontal extension part of the first right fan-out wiring 401 and the horizontal extension part of the second right fan-out wiring 402 may be interposed between the third vertical dummy patterns 603.

The sixth vertical dummy patterns 606 may be spaced apart from the sub-vertical extension part of the third right fan-out wiring 403 in the first direction D1, and may be arrayed to be spaced apart from each other in the first direction D1 (e.g., a direction substantially the same as the direction in which the sub-vertical extension part extends). The sixth vertical dummy patterns 606 may be spaced apart from the horizontal extension part of the first right fan-out wiring 401 and the horizontal extension part of the second right fan-out wiring 402. In other words, the horizontal extension part of the first right fan-out wiring 401 and the horizontal extension part of the second right fan-out wiring 402 may be interposed between the sixth vertical dummy patterns 606.

The fourth vertical dummy patterns 604 may be spaced apart from the vertical extension part of the fourth right fan-out wiring 404 in the first direction D1, and may be arrayed to be spaced apart from each other in the first direction D1 (e.g., a direction substantially the same as the direction in which the vertical extension part extends). The fourth vertical dummy patterns 604 may be spaced apart from the horizontal extension part of the first right fan-out wiring 401, the horizontal extension part of the second right fan-out wiring 402, and the horizontal extension part of the third right fan-out wiring 403. In other words, the horizontal extension part of the first right fan-out wiring 401, the horizontal extension part of the second right fan-out wiring 402, and the horizontal extension part of the third right fan-out wiring 403 may be interposed between the fourth vertical dummy patterns 604.

The fifth vertical dummy patterns 605 may be spaced apart from the sub-vertical extension part of the fourth right fan-out wiring 404 in the first direction D1, and may be arrayed to be spaced apart from each other in the first direction D1 (e.g., a direction substantially the same as the direction in which the vertical extension part extends). The fifth sub-vertical dummy patterns 605 may be spaced apart from the horizontal extension part of the first right fan-out wiring 401, the horizontal extension part of the second right fan-out wiring 402, and the horizontal extension part of the third right fan-out wiring 403. In other words, the horizontal extension part of the first right fan-out wiring 401, the horizontal extension part of the second right fan-out wiring 402, and the horizontal extension part of the third right fan-out wiring 403 may be interposed between the fifth vertical dummy patterns 605.

First horizontal dummy patterns 701 may be spaced apart from the horizontal extension part of the first right fan-out wiring 401 in the third direction D3, and may be arrayed to be spaced apart from each other in the third direction D3. Alternatively, the first horizontal dummy patterns 701 may further include horizontal dummy patterns spaced apart from the horizontal extension part of the first right fan-out wiring 401 in the second direction D2, and arrayed to be spaced apart from each other in the second direction D2. One horizontal dummy pattern is shown in FIG. 24, however, at least two first horizontal dummy patterns may be disposed between the sub-vertical dummy patterns 801 and the first right fan-out wiring 401.

The second horizontal dummy patterns 702 may be spaced apart from the horizontal extension part of the second right fan-out wiring 402 in the third direction D3 and the second direction D2, and may be arrayed to be spaced apart from each other in the third direction D3 and the second direction D2. The second horizontal dummy patterns 702 may be spaced apart from the vertical extension part and the sub-vertical extension part of the first right fan-out wiring 401. In other words, the vertical extension part and the sub-vertical extension part of the first right fan-out wiring 401 may be interposed between the second horizontal dummy patterns 702.

The third horizontal dummy patterns 703 may be spaced apart from the horizontal extension part of the third right fan-out wiring 403 in the third direction D3 and the second direction D2, and may be arrayed to be spaced apart from each other in the third direction D3 and the second direction D2. The third horizontal dummy patterns 703 may be spaced apart from the vertical extension part and the sub-vertical extension part of the second right fan-out wiring 402, and the vertical extension part and the sub-vertical extension part of the first right fan-out wiring 401. In other words, the vertical extension part and the sub-vertical extension part of the second right fan-out wiring 402, and the vertical extension part and the sub-vertical extension part of the first right fan-out wiring 401 may be interposed between the third horizontal dummy patterns 703.

The fourth horizontal dummy patterns 704 may be spaced apart from the horizontal extension part of the fourth right fan-out wiring 404 in the third direction D3 and the second direction D2, and may be arrayed to be spaced apart from each other in the third direction D3 and the second direction D2. The fourth horizontal dummy patterns 704 may be spaced apart from the vertical extension part and the sub-vertical extension part of the third right fan-out wiring 403, the vertical extension part and the sub-vertical extension part of the second right fan-out wiring 402, and the vertical extension part and the sub-vertical extension part of the first right fan-out wiring 401. In other words, the vertical extension part and the sub-vertical extension part of the third right fan-out wiring 403, the vertical extension part and the sub-vertical extension part of the second right fan-out wiring 402, and the vertical extension part and the sub-vertical extension part of the first right fan-out wiring 401 may be interposed between the fourth horizontal dummy patterns 704.

In addition, the vertical dummy patterns may further include ninth to sixteenth vertical dummy patterns, and the horizontal dummy patterns may further include fifth to eighth horizontal dummy patterns.

The ninth vertical dummy patterns may be spaced apart from the vertical extension part of the first left fan-out wiring in the first direction D1, and may be arrayed to be spaced apart from each other in the first direction D1 (e.g., a direction substantially the same as the direction in which the vertical extension part extends).

The sixteenth vertical dummy patterns may be spaced apart from a sub-vertical extension part of the first left fan-out wiring in the first direction D1, and may be arrayed to be spaced apart from each other in the first direction D1 (e.g., a direction substantially the same as the direction in which the sub-vertical extension part extends).

The tenth vertical dummy patterns may be spaced apart from a vertical extension part of the second left fan-out wiring in the first direction D1, and may be arrayed to be spaced apart from each other in the first direction D1 (e.g., a direction substantially the same as the direction in which the vertical extension part extends). The tenth vertical dummy patterns may be spaced apart from a horizontal extension part of the first left fan-out wiring. In other words, the horizontal extension part of the first left fan-out wiring may be interposed between the tenth vertical dummy patterns.

The fifteenth vertical dummy patterns may be spaced apart from a sub-vertical extension part of the second left fan-out wiring in the first direction D1, and may be arrayed to be spaced apart from each other in the first direction D1 (e.g., a direction substantially the same as the direction in which the sub-vertical extension part extends). The fifteenth vertical dummy patterns may be spaced apart from the horizontal extension part of the first left fan-out wiring. In other words, the horizontal extension part of the first left fan-out wiring may be interposed between the fifteenth vertical dummy patterns.

The eleventh vertical dummy patterns may be spaced apart from the vertical extension part of the third left fan-out wiring in the first direction D1, and may be arrayed to be spaced apart from each other in the first direction D1 (e.g., a direction substantially the same as the direction in which the vertical extension part extends). The eleventh vertical dummy patterns may be spaced apart from the horizontal extension part of the first left fan-out wiring and the horizontal extension part of the second left fan-out wiring. In other words, the horizontal extension part of the first left fan-out wiring and the horizontal extension part of the second left fan-out wiring may be interposed between the eleventh vertical dummy patterns.

The fourteenth vertical dummy patterns may be spaced apart from a sub-vertical extension part of the third left fan-out wiring in the first direction D1, and may be arrayed to be spaced apart from each other in the first direction D1 (e.g., a direction substantially the same as the direction in which the sub-vertical extension part extends). The fourteenth vertical dummy patterns may be spaced apart from the horizontal extension part of the first left fan-out wiring and the horizontal extension part of the second left fan-out wiring. In other words, the horizontal extension part of the first left fan-out wiring and the horizontal extension part of the second left fan-out wiring may be interposed between the fourteenth vertical dummy patterns.

The twelfth vertical dummy patterns may be spaced apart from a vertical extension part of the fourth left fan-out wiring in the first direction D1, and may be arrayed to be spaced apart from each other in the first direction D1 (e.g., a direction substantially the same as the direction in which the vertical extension part extends). The twelfth vertical dummy patterns may be spaced apart from the horizontal extension part of the first left fan-out wiring, the horizontal extension part of the second left fan-out wiring, and the horizontal extension part of the third left fan-out wiring. In other words, the horizontal extension part of the first left fan-out wiring, the horizontal extension part of the second left fan-out wiring, and the horizontal extension part of the third left fan-out wiring may be interposed between the twelfth vertical dummy patterns.

The thirteenth vertical dummy patterns may be spaced apart from a sub-vertical extension part of the fourth left fan-out wiring in the first direction D1, and may be arrayed to be spaced apart from each other in the first direction D1 (e.g., a direction substantially the same as the direction in which the sub-vertical extension part extends). The thirteenth vertical dummy patterns may be spaced apart from the horizontal extension part of the first left fan-out wiring, the horizontal extension part of the second left fan-out wiring, and the horizontal extension part of the third left fan-out wiring. In other words, the horizontal extension part of the first left fan-out wiring, the horizontal extension part of the second left fan-out wiring, and the horizontal extension part of the third left fan-out wiring may be interposed between the thirteenth vertical dummy patterns.

The fifth horizontal dummy patterns may be spaced apart from the horizontal extension part of the first left fan-out wiring in the third direction D3, and may be arrayed to be spaced apart from each other in the third direction D3. Alternatively, the fifth horizontal dummy patterns may further include horizontal dummy patterns spaced apart from the horizontal extension part of the first left fan-out wiring in the second direction D2, and arrayed to be spaced apart from each other in the second direction D2. One fifth horizontal dummy pattern is shown in FIG. 23, however, at least two fifth horizontal dummy patterns may be disposed between the sub-vertical dummy patterns 801 and the first left fan-out wiring.

The sixth horizontal dummy patterns may be spaced apart from the horizontal extension part of the second left fan-out wiring in the second direction D2 and the third direction D3, and may be arrayed to be spaced apart from each other in the second direction D2 and the third direction D3. The sixth horizontal dummy patterns may be spaced apart from the vertical extension part and the sub-vertical extension part of the first left fan-out wiring. In other words, the vertical extension part and the sub-vertical extension part of the first left fan-out wiring may be interposed between the sixth horizontal dummy patterns.

The seventh horizontal dummy patterns may be spaced apart from the horizontal extension part of the third left fan-out wiring in the second direction D2 and the third direction D3, and may be arrayed to be spaced apart from each other in the second direction D2 and the third direction D3. The seventh horizontal dummy patterns may be spaced apart from the vertical extension part and the sub-vertical extension part of the second left fan-out wiring, and the vertical extension part and the sub-vertical extension part of the first left fan-out wiring. In other words, the vertical extension part and the sub-vertical extension part of the second left fan-out wiring, and the vertical extension part and the sub-vertical extension part of the first left fan-out wiring may be interposed between the seventh horizontal dummy patterns.

The eighth horizontal dummy patterns may be spaced apart from the horizontal extension part of the fourth left fan-out wiring in the second direction D2 and the third direction D3, and may be arrayed to be spaced apart from each other in the second direction D2 and the third direction D3. The eighth horizontal dummy patterns may be spaced apart from the vertical extension part and the sub-vertical extension part of the third left fan-out wiring, the vertical extension part and the sub-vertical extension part of the second left fan-out wiring, and the vertical extension part and the sub-vertical extension part of the first left fan-out wiring. In other words, the vertical extension part and the sub-vertical extension part of the third left fan-out wiring, the vertical extension part and the sub-vertical extension part of the second left fan-out wiring, and the vertical extension part and the sub-vertical extension part of the first left fan-out wiring may be interposed between the eighth horizontal dummy patterns.

The sub-horizontal dummy patterns of the dummy patterns 600 may be spaced apart from the horizontal extension parts of the right fan-out wirings 400 and the left fan-out wirings 500 in the first direction D1, and may be arrayed to be spaced apart from each other in the third direction D3. The sub-horizontal dummy patterns 901 arrayed to be spaced apart from each other in the third direction D3 may be repeatedly spaced apart from each other in the first direction D1.

For example, as shown in FIG. 24, sub-horizontal dummy patterns 901 may be spaced apart from the horizontal extension part of the first right fan-out wiring 401 in the first direction D1, and may be arrayed to be spaced apart from each other in the third direction D3. The sub-horizontal dummy patterns arrayed to be spaced apart from each other in the third direction D3 may be repeatedly spaced apart from each other in the first direction D1.

The sub-vertical dummy patterns may be disposed between the right fan-out wirings 400 and the left fan-out wirings 500. In other words, the sub-vertical dummy patterns may be spaced apart from the right fan-out wirings 400 in the third direction D3 or spaced apart from the left fan-out wirings 500 in the second direction D2.

For example, as shown in FIG. 24, sub-vertical dummy patterns 801 may be disposed between the right fan-out wirings 400 and the left fan-out wirings 500, and may be arrayed to be spaced apart from each other in the first direction D1. The dummy patterns 600 disposed on a left side of the sub-vertical dummy patterns 801 about the sub-vertical dummy patterns 801 may be symmetrical to the dummy patterns 600 disposed on a right side of the sub-vertical dummy patterns 801. In addition, the right fan-out wirings 400 and the left fan-out wirings 500 may be symmetrical to each other about the sub-vertical dummy patterns 801.

As described above, the dummy patterns 600 includes the vertical dummy patterns, the horizontal dummy patterns, the sub-vertical dummy patterns, and the sub-horizontal dummy patterns, so that the dummy patterns 600 may have a lattice shape in the display area 40.

In exemplary embodiments, although it has been described that the center signal wirings 510 include 13 wirings, and each of the right signal wirings 520, the left signal wirings 530, the right fan-out wirings 400, and the left fan-out wirings 500 includes four wirings, the configuration of the present invention is not limited thereto.

For example, the right fan-out wirings 400 may include first to $M^{th}$ right fan-out wirings (where M is an integer of 1 or more), and the first to $M^{th}$ right fan-out wirings may be sequentially arranged while being spaced apart from each other. Total lengths of the first to $M^{th}$ right fan-out wirings may be sequentially decreased. A $K^{th}$ right fan-out wiring (where K is an integer between 1 and M) among the first to $M^{th}$ right fan-out wirings may include a vertical extension part disposed in the pad area 60 and the first sub-display area 10 and extending in the first direction D1, a horizontal extension part extending in the second direction D2 from a first end of the vertical extension part positioned in the first sub-display area 10, and a sub-vertical extension part that extends in the fourth direction D4 opposite to the first direction D1 from the second end of the horizontal extension part.

The second end of the vertical extension part of the $K^{th}$ right fan-out wiring may be positioned in the pad area 60, and the first end opposite to the second end of the vertical extension part of the $K^{th}$ right fan-out wiring may be connected to the first end of the horizontal extension part. In addition, the first end of the horizontal extension part may be connected to the first end of the vertical extension part, and a second end opposite to the first end of the horizontal extension part may be connected to the first end of the sub-vertical extension part.

The right signal wirings 520 may include first to $N^{th}$ right signal wirings (where N is an integer of 1 or more), and the first to $N^{th}$ right signal wirings may be arranged according to a reverse sequence and spaced apart from each other. The $M^{th}$ right fan-out wiring and the $N^{th}$ right signal wiring may be disposed adjacent to a boundary between the first sub-display area 10 and the second sub-display area 20.

The sub-vertical extension part of a $K^{th}$ right fan-out wiring among the first to $M^{th}$ right fan-out wirings may be connected to an $L^{th}$ right signal wiring (where L is an integer between 1 and N) among the first to $N^{th}$ right signal wirings through a contact hole, wherein K and L may be the same integer, and the contact hole may be formed at the second end opposite to the first end of the sub-vertical extension part. In other words, the contact hole may be positioned at the lower end of the second sub-display area 20.

The bent parts may be defined by the first end of the vertical extension part and the first end of the horizontal extension part of the $K^{th}$ right fan-out wiring, and the second end of the horizontal extension part and the first end of the sub-vertical extension part, and the vertical extension part, the horizontal extension part, and the sub-vertical extension part of the $K^{th}$ right fan-out wiring may be integrally formed with each other.

The vertical extension part of the $K^{th}$ right fan-out wiring may be parallel to the sub-vertical extension part of the $K^{th}$ right fan-out wiring, and a length of the vertical extension part in the first direction D1 may be longer than a length of the sub-vertical extension part in the first direction D1.

An empty space may be formed inside the vertical extension part, the horizontal extension part, and the sub-vertical extension part of the Kth right fan-out wiring, the empty space may have a shape recessed in the first direction D1, and a $(K+1)^{th}$ right fan-out wiring among the first to $M^{th}$ right fan-out wirings may be disposed in the empty space.

The dummy patterns 600 may include first to $p^{th}$ dummy patterns (where P is an integer of 1 or more). The $J^{th}$ dummy pattern (where J is an integer between 1 and N) among the first to $P^{th}$ dummy patterns may include a plurality of vertical dummy patterns spaced apart from the vertical extension part of the $K^{th}$ right fan-out wiring in the first direction D1 and arrayed to be spaced apart from each other in the first direction D1, and a plurality of horizontal dummy patterns spaced apart from the horizontal extension part of the $K^{th}$ right fan-out wiring in the third direction D3 and arrayed to be spaced apart from each other in the third direction D3.

The J$^{th}$ dummy pattern may further include a plurality of sub-vertical dummy patterns spaced apart from the vertical extension part of the K$^{th}$ right fan-out wiring in the third direction D3 and arrayed to be spaced apart from each other in the first direction D1, and a plurality of sub-horizontal dummy patterns spaced apart from the horizontal extension part of the K$^{th}$ right fan-out wiring in the first direction D1 and arrayed to be spaced apart from each other in the third direction D3.

In addition, in exemplary embodiments, although the dummy patterns 600 has been described as being spaced apart from each other, the configuration of the present invention is not limited thereto. For example, in other exemplary embodiments, at least two dummy patterns 600 positioned adjacent to each other among the dummy patterns 600 may be integrally formed with each other.

The display area 40 may include a plurality of sub-pixel circuit areas 50, and at least one of the vertical dummy pattern, the horizontal dummy pattern, the sub-vertical dummy pattern, and the sub-horizontal dummy pattern may be disposed in each of the sub-pixel circuit areas 50.

The dummy patterns 600 may have a lattice shape in the display area 40 by the vertical dummy pattern, the horizontal dummy pattern, the sub-vertical dummy pattern, and the sub-horizontal dummy pattern in each of the sub-pixel circuit areas 50.

The organic light emitting display device 900 according to exemplary embodiments of the present invention includes dummy patterns 600, so that the dummy patterns 600 may implement a lattice pattern shape over the whole of the display area 40, together with the right fan-out wirings 400 and the left fan-out wirings 500. In this case, the pattern and/or the spot may not be visually recognized on the organic light emitting display device 100. Accordingly, the visibility of the organic light emitting display device 100 may be relatively improved. In addition, the contact holes of the right fan-out wirings 400 are positioned at the lower end of the second sub-display area 20, and the contact holes of the left fan-out wirings 500 are position at the lower end of the third sub-display area 30, so that the visibility of the organic light emitting display device 900 may be relatively increased.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

ABILITY OF INDUSTRIAL UTILITY

The present invention may be applied to various electronic devices including an organic light emitting display device. For example, the present invention may be applied to vehicle-display device, a ship-display device, an aircraft-display device, portable communication devices, display devices for display or for information transfer, a medical-display device, etc.

THE DESCRIPTION OF THE REFERENCE NUMERALS

10: first sub-display area
20: second sub-display area
30: third sub-display area
40: display area
60: pad area
100, 900: organic light emitting display device
101: external device
150: substrate
400: right fan-out wirings
401, 402, 403, 404: first to fourth right fan-out wirings
470: pad electrodes
500: left fan-out wirings
510: center signal wirings
520: right signal wirings
530: left signal wirings
600: dummy patterns
601, 602, 603, 604: first to fourth vertical dummy patterns
701, 702, 703, 704: first to fourth horizontal dummy patterns
801: sub-vertical dummy patterns
901: sub-horizontal dummy patterns
1100: active pattern
1105: first gate electrode
1110: first gate wiring
1115: second gate wiring
1120: third gate wiring
1130: second gate electrode
1140: initialization voltage wiring
1150: conductive pattern
1160: gate insulating layer
1190: first interlayer insulating layer
1191: data wiring
1195: second interlayer insulating layer
1200: sub-pixel structure
1230: first connection pattern
1270: first planarization layer
1275: second planarization layer
1290: high power voltage wiring
1291: lower electrode
1310: pixel defining layer
1330: light emitting layer
1340: upper electrode
1390: third connection pattern
1395: connection electrode
1430: second connection pattern
1475: contact hole

The invention claimed is:

1. An organic light emitting display device comprising:
a substrate comprising:
  a display area having a first sub-display area and a second sub-display area at a first side part of the first sub-display area; and
  a pad area at a second side part different from the first side part of the first sub-display area;
a plurality of right signal wirings in the second sub-display area on the substrate;
a plurality of right fan-out wirings in the pad area, the first sub-display area, and the second sub-display area on the plurality of right signal wirings, the plurality of right fan-out wirings each including a bent part;

a plurality of dummy patterns in the first and second sub-display areas on the plurality of right signal wirings, the plurality of dummy patterns being spaced apart from the plurality of right fan-out wirings, the plurality of dummy patterns having a lattice shape;

a plurality of sub-pixel structures on the plurality of dummy patterns, wherein the plurality of dummy patterns include a plurality of vertical dummy patterns aligned along a vertical line and a plurality of horizontal dummy patterns aligned along a horizontal line being spaced apart from the plurality of vertical dummy patterns in a plan view, and wherein the display area includes a plurality of sub-pixel circuit areas, at least one of the vertical dummy patterns and the horizontal dummy patterns is disposed in each of the plurality of sub-pixel circuit areas, and the vertical dummy patterns and the horizontal dummy patterns disposed in each of the plurality of sub-pixel circuit areas do not overlap in a plan view.

2. The organic light emitting display device of claim 1, wherein each of the plurality of right fan-out wirings includes:

a vertical extension part in the pad area and the first sub-display area and extending in a first direction; and a horizontal extension part extending in a second direction orthogonal to the first direction from a first end of the vertical extension part in the first sub-display area.

3. The organic light emitting display device of claim 2, wherein a second end of the vertical extension part is in the pad area, and the first end opposite to the second end of the vertical extension part is connected to a first end of the horizontal extension part.

4. The organic light emitting display device of claim 3, wherein a second end opposite to the first end of the horizontal extension part is connected to one of the plurality of right signal wirings through a contact hole.

5. The organic light emitting display device of claim 4, wherein the bent part is defined by the first end of the vertical extension part and the first end of the horizontal extension part.

6. The organic light emitting display device of claim 2, wherein the vertical extension part and the horizontal extension part are integrally formed with each other.

7. The organic light emitting display device of claim 2, wherein each of the plurality of right fan-out wirings further includes a sub-vertical extension part that extends in a fourth direction opposite to the first direction from a second end of the horizontal extension part.

8. The organic light emitting display device of claim 7, wherein a first end of the horizontal extension part is connected to the first end of the vertical extension part, and the second end opposite to the first end of the horizontal extension part is connected to a first end of the sub-vertical extension part.

9. The organic light emitting display device of claim 8, wherein a second end opposite to the first end of the sub-vertical extension part is connected to one of the plurality of right signal wirings through a contact hole.

10. The organic light emitting display device of claim 9, wherein the bent part is defined by i) the first end of the vertical extension part and the first end of the horizontal extension part and ii) the second end of the horizontal extension part and the first end of the sub-vertical extension part.

11. The organic light emitting display device of claim 7, wherein the vertical extension part, the horizontal extension part, and the sub-vertical extension part are integrally formed with each other.

12. The organic light emitting display device of claim 7, wherein the vertical extension part is parallel to the sub-vertical extension part, and a length of the vertical extension part in the first direction is longer than a length of the sub-vertical extension part in the first direction.

13. The organic light emitting display device of claim 7, wherein the plurality of dummy patterns include:

a plurality of vertical dummy patterns spaced apart from the vertical extension part in the first direction, the plurality of vertical dummy patterns being spaced apart from each other in the first direction; and a plurality of horizontal dummy patterns spaced apart from the horizontal extension part in a third direction opposite to the second direction, the plurality of horizontal dummy patterns being spaced apart from each other in the third direction.

14. The organic light emitting display device of claim 13, wherein the plurality of dummy patterns further include:

a plurality of sub-vertical dummy patterns spaced apart from the vertical extension part in the third direction, the plurality of sub-vertical dummy patterns being spaced apart from each other in the first direction; and a plurality of sub-horizontal dummy patterns spaced apart from the horizontal extension part in the first direction, the plurality of sub-horizontal dummy patterns being spaced apart from each other in the third direction.

15. The organic light emitting display device of claim 14, wherein the display area includes the plurality of sub-pixel circuit areas, and at least one of a vertical dummy pattern from among the vertical dummy patterns, a horizontal dummy pattern from among the horizontal dummy patterns, a sub-vertical dummy pattern from among the sub-vertical dummy patterns, or a sub-horizontal dummy pattern from among the sub-vertical dummy patterns is in each of the plurality of sub-pixel circuit areas.

16. The organic light emitting display device of claim 15, wherein the plurality of dummy patterns have a lattice shape in the display area by the vertical dummy pattern, the horizontal dummy pattern, the sub-vertical dummy pattern, and the sub-horizontal dummy pattern in each of the plurality of sub-pixel circuit areas.

17. The organic light emitting display device of claim 1, further comprising:

a plurality of power voltage wirings in the display area on the substrate, wherein at least some of the plurality of dummy patterns are electrically connected to at least some of the power voltage wirings.

18. The organic light emitting display device of claim 1, wherein the plurality of right fan-out wirings include first to $M^{th}$ right fan-out wirings (where M is an integer of 1 or more), in which the first to $M^{th}$ right fan-out wirings are sequentially arranged while being spaced apart from each other.

19. The organic light emitting display device of claim 18, wherein lengths of the first to $M^{th}$ right fan-out wirings are gradually decreased.

20. The organic light emitting display device of claim 18, wherein a $K^{th}$ right fan-out wiring (where K is an integer between 1 and M) among the first to $M^{th}$ right fan-out wirings includes:

a vertical extension part in the pad area and the first sub-display area and extending in a first direction; and a horizontal extension part extending in a second direction orthogonal to the first direction from a first end of the vertical extension part in the first sub-display area.

21. The organic light emitting display device of claim 20, wherein a second end of the vertical extension part of the $K^{th}$ right fan-out wiring is in the pad area, and the first end opposite to the second end of the vertical extension part of the $K^{th}$ right fan-out wiring is connected to the first end of the horizontal extension part.

22. The organic light emitting display device of claim 21, wherein the plurality of right signal wirings include first to $N^{th}$ right signal wirings (where N is an integer of 1 or more), in which the first to $N^{th}$ right signal wirings are arranged in a reverse sequence and spaced apart from each other.

23. The organic light emitting display device of claim 22, wherein the $M^{th}$ right fan-out wiring and the $N^{th}$ right signal wiring are adjacent to a boundary between the first sub-display area and the second sub-display area.

24. The organic light emitting display device of claim 22, wherein the horizontal extension part of the $K^{th}$ right fan-out wiring among the first to $M^{th}$ right fan-out wirings is connected to an $L^{th}$ right signal wiring (where L is an integer between 1 and N) among the first to $N^{th}$ right signal wirings through a contact hole.

25. The organic light emitting display device of claim 24, wherein the bent part is defined by the first end of the vertical extension part of the $K^{th}$ right fan-out wiring and the first end of the horizontal extension part of the $K^{th}$ right fan-out wiring.

26. The organic light emitting display device of claim 20, wherein the vertical and horizontal extension parts of the $K^{th}$ right fan-out wiring are integrally formed.

27. The organic light emitting display device of claim 26, wherein the $K^{th}$ right fan-out wiring further includes:
a sub-vertical extension part that extends in a fourth direction opposite to the first direction from a second end of the horizontal extension part.

28. The organic light emitting display device of claim 27, wherein a first end of the horizontal extension part is connected to the vertical extension part, and the second end opposite to the first end of the horizontal extension part is connected to a first end of the sub-vertical extension part.

29. The organic light emitting display device of claim 28, wherein the plurality of right signal wirings include first to $N^{th}$ right signal wirings (where N is an integer of 1 or more), in which the first to $N^{th}$ right signal wirings are arranged in a reverse sequence and spaced apart from each other.

30. The organic light emitting display device of claim 29, wherein the sub-vertical extension part of the $K^{th}$ right fan-out wiring among the first to $M^{th}$ right fan-out wirings is connected to an $L^{th}$ right signal wiring among the first to $N^{th}$ right signal wirings (where L is an integer between 1 and N) through contact holes.

31. The organic light emitting display device of claim 30, wherein the bent part is defined by i) a first end of the vertical extension part of the $K^{th}$ right fan-out wiring and a first end of the horizontal extension part of the $K^{th}$ right fan-out wiring and ii) a second end of the horizontal extension part of the $K^{th}$ right fan-out wiring and a first end of the sub-vertical extension part of the $K^{th}$ right fan-out wiring.

32. The organic light emitting display device of claim 27, wherein the vertical extension part of the $K^{th}$ right fan-out wiring, the horizontal extension part of the $K^{th}$ right fan-out wiring, and the sub-vertical extension part of the $K^{th}$ right fan-out wiring are integrally formed.

33. The organic light emitting display device of claim 27, wherein the vertical extension part of the $K^{th}$ right fan-out wiring is parallel to the sub-vertical extension part of the $K^{th}$ right fan-out wiring, and a length of the vertical extension part in the first direction is longer than a length of the sub-vertical extension part in the first direction.

34. The organic light emitting display device of claim 27, wherein an empty space is formed inside the vertical extension part of the $K^{th}$ right fan-out wiring, the horizontal extension part of the $K^{th}$ right fan-out wiring, and the sub-vertical extension part of the $K^{th}$ right fan-out wiring, and the empty space has a shape recessed in the first direction, and
wherein a $(K+1)^{th}$ right fan-out wiring among the first to $M^{th}$ right fan-out wirings is disposed in the empty space.

35. The organic light emitting display device of claim 27, wherein the plurality of dummy patterns include
first to $P^{th}$ dummy patterns (where P is an integer of 1 or more), in which
a $J^{th}$ dummy pattern (where J is an integer between 1 and N) among the first to $P^{th}$ dummy patterns includes:
a plurality of vertical dummy patterns spaced apart from the vertical extension part of the $K^{th}$ right fan-out wiring in the first direction and arranged to be spaced apart from each other in the first direction, and
a plurality of horizontal dummy patterns spaced apart from the horizontal extension part of the $K^{th}$ right fan-out wiring in a third direction opposite to the second direction and arranged to be spaced apart from each other in the third direction.

36. The organic light emitting display device of claim 35, wherein the $J^{th}$ dummy pattern further includes:
a plurality of sub-vertical dummy patterns spaced apart from the vertical extension part of the $K^{th}$ right fan-out wiring in the third direction and arranged to be spaced apart from each other in the first direction; and
a plurality of sub-horizontal dummy patterns spaced apart from the horizontal extension part of the $K^{th}$ right fan-out wiring in the first direction and arranged to be spaced apart from each other in the third direction.

37. The organic light emitting display device of claim 36, wherein the display area includes the plurality of sub-pixel circuit areas, in which at least one of a vertical dummy pattern from among the vertical dummy patterns a horizontal dummy pattern from among the horizontal dummy patterns, a sub-vertical dummy pattern from among the sub-vertical dummy patterns, or a sub-horizontal dummy pattern from among the sub-horizontal dummy patterns is in each of the plurality of sub-pixel circuit areas.

38. The organic light emitting display device of claim 37, wherein the plurality of dummy patterns have a lattice shape in the display area by the vertical dummy pattern, the horizontal dummy pattern, the sub-vertical dummy pattern, and the sub-horizontal dummy pattern in each of the sub-pixel circuit areas.

39. The organic light emitting display device of claim 1, wherein the substrate further includes a third sub-display area at a third side part directed to face the first side part of the first sub-display area, the pad area and the first sub-display area are arranged in a first direction, and the third sub-display area, the first sub-display area, and the second sub-display area are arranged in a second direction orthogonal to the first direction.

40. The organic light emitting display device of claim 39, wherein a width of the display area in the second direction is greater than a width of the pad area in the second direction.

41. The organic light emitting display device of claim 40, further comprising:

a plurality of pad electrodes arranged in the second direction in the pad area.

42. The organic light emitting display device of claim 39, further comprising:

a plurality of left signal wirings in the third sub-display area on the substrate; and a plurality of left fan-out wirings in the pad area, the first sub-display area, and the third sub-display area on the plurality of left signal wirings, the plurality of left fan-out wirings each including a bent part.

43. The organic light emitting display device of claim 42, wherein the plurality of dummy patterns are in the third sub-display area on the left signal wirings, and spaced apart from the plurality of left fan-out wirings, and wherein the plurality of dummy patterns have a lattice shape.

44. The organic light emitting display device of claim 42, wherein the plurality of left fan-out wirings and the plurality of right fan-out wirings are symmetrical to each other.

45. The organic light emitting display device of claim 42, wherein the left signal wirings are only in the third sub-display area, and a data signal is applied through the plurality of left fan-out wirings.

46. The organic light emitting display device of claim 1, wherein the plurality of right signal wirings are only in the second sub-display area, and a data signal is applied through the plurality of right fan-out wirings.

47. The organic light emitting display device of claim 1, wherein each of the sub-pixel structures includes:

a lower electrode on the plurality of dummy patterns;

a light emitting layer on the lower electrode; and an upper electrode on the light emitting layer.

48. The organic light emitting display device of claim 1, further comprising:

a plurality of center signal wirings disposed in the first sub-display area on the substrate.

49. The organic light emitting display device of claim 48, wherein a length of each of plurality of the center signal wirings in a first direction is longer than a length of each of plurality of the right signal wirings in the first direction.

50. The organic light emitting display device of claim 48, wherein the plurality of center signal wirings are only in the first sub-display area, and a data signal is applied through the plurality of center signal wirings.

\* \* \* \* \*